United States Patent
Mitsui et al.

(10) Patent No.: US 8,841,651 B2
(45) Date of Patent: Sep. 23, 2014

(54) PHOTOELECTRIC CONVERSION ELEMENT AND IMAGING DEVICE

(75) Inventors: Tetsuro Mitsui, Kanagawa (JP);
Kimiatsu Nomura, Kanagawa (JP);
Kazumi Nii, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 1163 days.

(21) Appl. No.: 12/237,865

(22) Filed: Sep. 25, 2008

(65) Prior Publication Data

US 2009/0085029 A1  Apr. 2, 2009

(30) Foreign Application Priority Data

Sep. 28, 2007 (JP) ................... 2007-256731

(51) Int. Cl.
*H01L 29/08* (2006.01)
*H01L 51/42* (2006.01)
*H01L 51/00* (2006.01)

(52) U.S. Cl.
CPC ........... *H01L 51/0051* (2013.01); *H01L 51/424* (2013.01); *H01L 51/001* (2013.01); *H01L 51/0059* (2013.01); *H01L 51/0081* (2013.01)
USPC .............................................. 257/40; 438/99

(58) Field of Classification Search
USPC .............................................. 257/40; 438/99
See application file for complete search history.

(56) References Cited

U.S. PATENT DOCUMENTS 4,430,666 A    2/1984 Nakatsui et al.
5,929,845 A *  7/1999 Wei et al. ..................... 345/156
(Continued)

FOREIGN PATENT DOCUMENTS

JP    57141974 A    9/1982
JP    2002229144 A   8/2002
(Continued)

OTHER PUBLICATIONS

Office Action dated Jan. 8, 2013 issued by the Japanese Patent Office in counterpart Japanese Application No. 2007-256731.
(Continued)

*Primary Examiner* — Mark Tornow
(74) *Attorney, Agent, or Firm* — Sughrue Mion, PLLC

(57) ABSTRACT

A photoelectric conversion element is provided and includes: a conductive thin layer; an organic photoelectric conversion layer including a compound represented by formula (I); and a transparent conductive thin layer, in this order:

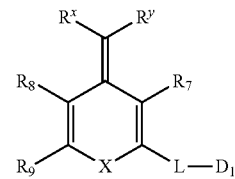

Formula (I)

In the formula (I), X represents O, S or N—$R_{10}$; $R^x$ and $R^y$ each independently represents a hydrogen atom or a substituent, at least one of $R^x$ and $R^y$ is an electron-withdrawing group, and $R^x$ and $R^y$ may be connected to each other to form a ring, provided that $R^x$ and $R^y$ do not represent a cyano group at the same time; $R_7$ to $R_{10}$ each independently represents a hydrogen atom or a substituent, and $R_8$ and $R_9$ may be connected to each other to form a ring; L represents a linking group comprising a conjugated bond; and $D_1$ represents a group of atoms.

18 Claims, 14 Drawing Sheets

(56) References Cited

U.S. PATENT DOCUMENTS

| | | | |
|---|---|---|---|
| 5,965,875 A | 10/1999 | Merrill | |
| 2004/0072017 A1* | 4/2004 | Nii et al. | 428/690 |
| 2006/0198010 A1 | 9/2006 | Shinohara et al. | |

FOREIGN PATENT DOCUMENTS

| | | |
|---|---|---|
| JP | 2003-332551 A | 11/2003 |
| JP | 200532475 A | 2/2005 |
| JP | 2005101354 A | 4/2005 |
| JP | 2006243352 A | 9/2006 |
| JP | 2006310097 A | 11/2006 |
| WO | 02079343 A1 | 10/2002 |

OTHER PUBLICATIONS

Communication from the Japanese Patent Office dated Aug. 20, 2013, in a counterpart Japanese application No. 2007-256731.

* cited by examiner

FIG. 1
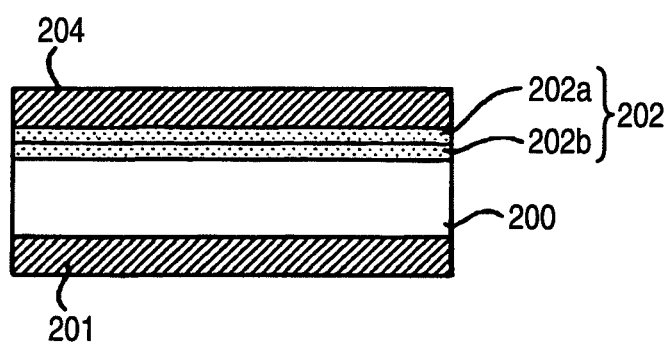
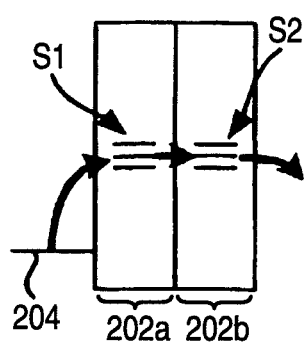
FIG. 2 (a)
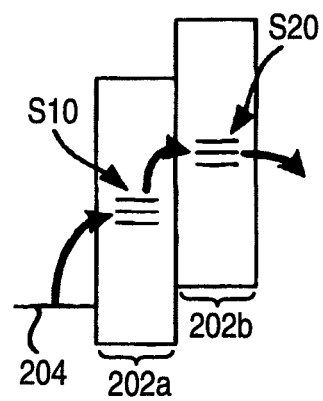
FIG. 2 (b)

PHOTOELECTRIC CONVERSION ELEMENT AND IMAGING DEVICE

This application is based on and claims priority under 35 U.S.C. §119 from Japanese Patent Application No. 2007-256731 filed Sep. 28, 2007, the entire disclosure of which is herein incorporated by reference.

BACKGROUND OF THE INVENTION

1. Field of the Invention

The present invention relates to a solid-state imaging device in which an organic photoelectric conversion portion is formed on a charge accumulation/transfer/read-out substrate, and provides a solid-state imaging device showing high S/N and a high response speed by specifying a structure of the material.

2. Description of Related Art

Visible light sensors are generally devices prepared by forming a photoelectric conversion site through formation of PN junction within a semiconductor such as Si and, as a solid-state imaging device, a plane type light-receiving device is being widely used in which photoelectric conversion sites are two-dimensionally arranged within a semiconductor, and signals each corresponding to a signal charge having been generated in each pixel by photoelectric conversion are transferred and read out by means of CCD or CMOS. As a technique for realizing a color solid-state imaging device, a structure in which color filters each transmitting only light of a particular wavelength are arranged for color separation on the light incident side of the plane type light-receiving device is general. In particular, as a system at present widely used in, for example digital cameras, a single plate sensor is well known in which color filters each capable of transmitting blue light, green light, or red light are regularly arranged on the two-dimensionally arranged individual pixels.

However, in this system, each of the color filters transmits only light of a particular wavelength, and light not transmitting through the color filter is not utilized, and thus light-utilizing efficiency is bad. Also, with the recent increase in number of pixels, the size of pixel becomes smaller, which leads to reduction in area of the photo diode portion, reduction in aperture ratio, and reduction in light-collecting efficiency.

In order to address the above, it can be considered to stack in the vertical direction photoelectric conversion portions capable of detecting different light wavelengths. As such system with limiting the light to visible light, there have been disclosed, for example, a sensor in which a stacked structure is constituted in the vertical direction utilizing dependency of absorption coefficient of Si upon wavelength to thereby separate colors based on the difference in depth in U.S. Pat. No. 5,965,875, and a sensor of a stacked structure using an organic photoelectric conversion layer in JP-A-2003-332551. However, the absorption ranges utilizing the difference in the depth direction of Si overlap with each other, which leads to insufficient color-separating properties, and thus color separation is poor. Also, as other technique for solving the above, there is known a structure in which a photoelectric conversion layer of amorphous silicon or an organic photoelectric conversion layer is formed on a substrate for reading out signals to thereby increase the aperture ratio.

There have so far been known several examples with respect to photoelectric conversion elements, imaging devices, and photo sensors using an organic photoelectric conversion layer. With them, a high photoelectric conversion efficiency and a low dark current are particularly required and, as techniques for the improvement, introduction of pn junction and introduction of bulk-heterostructure have been disclosed for attaining high photoelectric conversion efficiency, and introduction of a blocking layer has been disclosed for attaining low dark current.

It is true that these structurally improving techniques are effective, but characteristic properties of a material to be used also largely contribute to improvement of element performance. The characteristic properties are one of main factors influencing photoelectric conversion efficiency (exciton dissociation efficiency, charge-transfer properties) and dark current (amount of carrier in the dark) and, though not having been referred to in reports thus-far, are also a factor controlling signal response properties. In the case of using as a solid-state imaging device, it is necessary to satisfy all requirements for high photoelectric conversion efficiency, low dark current, and high response speed. However, no specific proposals have so far been made as to what would be such organic photoelectric conversion materials and element structure.

SUMMARY OF THE INVENTION

An object of the present invention is to provide a photoelectric conversion element and a solid-state imaging device, which includes an organic material and which can show a high photoelectric conversion efficiency, a low dark current, and a high-speed response properties.

The object can be achieved by the following means, particularly by using a 4H-pyran compound.

(1) A photoelectric conversion element comprising:
a conductive thin layer;
an organic photoelectric conversion layer including a compound represented by formula (I); and
a transparent conductive thin layer, in this order:

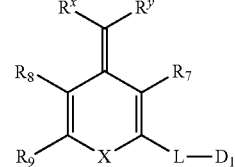

Formula (I)

wherein

X represents O, S or N—$R_{10}$, $R^x$ and $R^y$ each independently represents a hydrogen atom or a substituent, wherein at least one of $R^x$ and $R^y$ is an electron-withdrawing group, and $R^x$ and $R^y$ may be connected to each other to form a ring, provided that $R^x$ and $R^y$ do not represent a cyano group at the same time, $R_7$ to $R_{10}$ each independently represents a hydrogen atom or a substituent, wherein $R_8$ and $R_9$ may be connected to each other to form a ring, L represents a linking group comprising a conjugated bond, and $D_1$ represents a group of atoms.

(2) The photoelectric conversion element according to (1), wherein the sum of $sp^2$ carbon atoms contained in $R^x$ and $R^y$ is 3 or more.

(3) The photoelectric conversion element according to (1) or (2), wherein $D_1$ is a group containing —$NR^a(R^b)$, $R^a$ and $R^b$ each independently represents a hydrogen atom or a substituent, and $R^a$, $R^b$, and L may form a ring.

(4) The photoelectric conversion element according to (3), wherein $D_1$ represents a divalent arylene group to which —$NR^a(R^b)$ is bound.

(5) The photoelectric conversion element according to (1) or (2), wherein the compound represented by formula (I) is a compound represented formula (II):

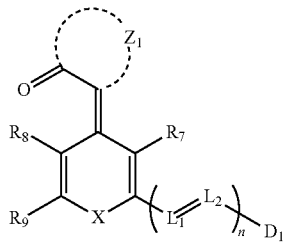

Formula (II)

wherein

X, $R_7$ to $R_{10}$, and $D_1$ are synonymous with X, $R_7$ to $R_{10}$, and $D_1$ in formula (I), respectively, $L_1$ and $L_2$ each independently represents a methine group or a substituted methine group, $Z_1$ represents the atoms necessary to complete a 5- or 6-membered ring, and n represents an integer of 1 or more. n is preferably an integer of 1 to 3.

(6) The photoelectric conversion element according to (5), wherein the compound represented by formula (II) is a compound represented by formula (III):

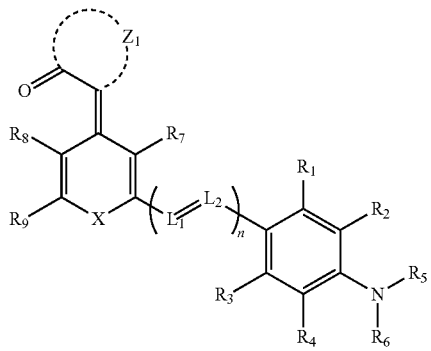

Formula (III)

wherein

X, $R_7$ to $R_{10}$, $L_1$, $L_2$, $Z_1$, and n are synonymous with X, $R_7$ to $R_{10}$, $L_1$, $L_2$, $Z_1$, and n in formula (II), respectively $R_1$ to $R_6$ each independently represents a hydrogen atom or a substituent, and $R_1$ and $R_2$, $R_3$ and $R_4$, $R_2$ and $R_5$, $R_4$ and $R_6$, or $R_5$ and $R_6$ may be connected to each other to form a ring.

(7) The photoelectric conversion element according to any one of (1) to (6), wherein X is O.

(8) The photoelectric conversion element according to (5), wherein the compound represented by formula (II) is a compound represented by formula (IV):

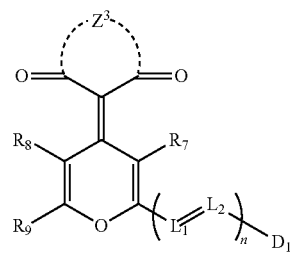

Formula (IV)

wherein $R_7$ to $R_9$, $L_1$, $L_2$, $D_1$, and n are synonymous with $R_7$ to $R_9$, $L_1$, $L_2$, $D_1$, and n in formula (II), respectively, and $Z_3$ represents the atoms necessary to complete a 5- to 6-membered ring.

(9) The photoelectric conversion element according to (5), wherein the compound represented by formula (II) is a compound represented by formula (V):

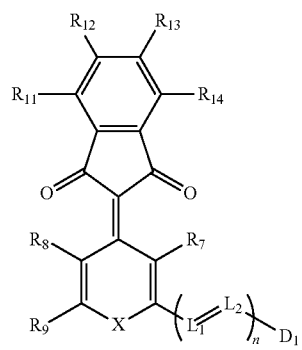

Formula (V)

wherein

X, $R_7$ to $R_{10}$, $L_1$, $L_2$, n, and $D_1$ are synonymous with X, $R_7$ to $R_{10}$, $L_1$, $L_2$, n, and $D_1$ in formula (II), respectively, and $R_{11}$ to $R_{14}$ each independently represents a hydrogen atom or a substituent.

(10) The photoelectric conversion element according to (9), wherein the compound represented by formula (V) is a compound represented by formula (VI):

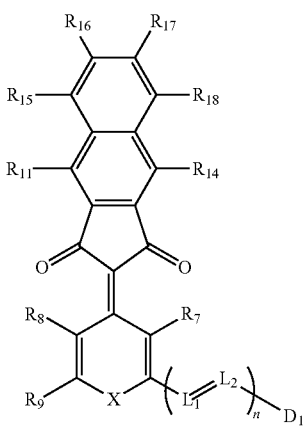

Formula (VI)

wherein

X, $R_7$ to $R_{11}$, $R_{14}$, $L_1$, $L_2$, n, and $D_1$ are synonymous with X, $R_7$ to $R_{11}$, $R_{14}$, $L_1$, $L_2$, n, and $D_1$ in formula (V), respectively, and $R_{15}$ to $R_{18}$ each independently represents a hydrogen atom or a substituent.

(11) The photoelectric conversion element according to (9), wherein each of $R_{11}$ to $R_{14}$ represents a hydrogen atom.

(12) The photoelectric conversion element according to (10), wherein each of $R_{11}$, and $R_{14}$ to $R_{18}$ represents a hydrogen atom.

(13) The photoelectric conversion element according to any one of (1) to (12), wherein $D_1$ is a group represented by formula (VII):

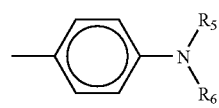

Formula (VII)

wherein $R_5$ and $R_6$ each independently represents a hydrogen atom or a substituent, and $R_5$ and $R_6$ may be connected to each other to form a ring.

(14) The photoelectric conversion element according to any one of (1) to (5) and (7) to (12), wherein $D_1$ is a group represented by formula (VIII):

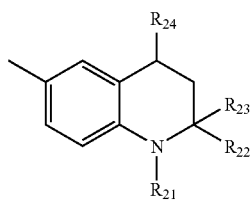

Formula (VIII)

wherein $R_{21}$ to $R_{24}$ each independently represents a hydrogen atom or a substituent, and $R_{22}$ and $R_{23}$, or $R_{21}$ and $R_{22}$, may be connected to each other to form a ring.

(15) The photoelectric conversion element according to any one of (1) to (5) and (7) to (12), wherein $D_1$ is a group represented by formula (IX):

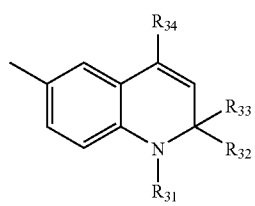

Formula (IX)

wherein $R_{31}$ to $R_{34}$ each independently represents a hydrogen atom or a substituent, and $R_{32}$ and $R_{33}$, or $R_{31}$ and $R_{32}$, may be connected to each other to form a ring.

(16) The photoelectric conversion element according to any one of (1) to (12), wherein $D_1$ is a group represented by formula (X):

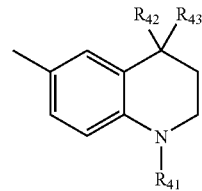

wherein $R_{41}$ to $R_{43}$ each independently represents a hydrogen atom or a substituent, and $R_{42}$ and $R_{43}$ may be connected to each other to form a ring.

(17) The photoelectric conversion element according to (14), wherein $R_{21}$ represents an ethyl group, and each of $R_{22}$, $R_{23}$, and $R_{24}$ represents a methyl group.

(18) The photoelectric conversion element according to (15), wherein $R_{31}$ represents an ethyl group, and each of $R_{32}$, $R_{33}$, and $R_{34}$ represents a methyl group.

(19) The photoelectric conversion element according to (16), wherein $R_{41}$ represents an ethyl group, and each of $R_{42}$ and $R_{43}$ represents a methyl group.

(20) The photoelectric conversion element according to any one of (1) to (19), wherein $R_9$ represents a methyl group.

(21) The photoelectric conversion element according to any one of (1) to (20), wherein the transparent conductive thin layer is an electrode layer, and light is to be introduced into the organic photoelectric conversion layer through the electrode layer.

(22) The photoelectric conversion element according to any one of (1) to (21), wherein the transparent conductive thin layer includes a transparent conductive oxide.

(23) An imaging device comprising a photoelectric conversion element described in any one of (1) to (22).

BRIEF DESCRIPTION OF THE DRAWINGS

The features of the invention will appear more fully upon consideration of the exemplary embodiments of the inventions, which are schematically set forth in the drawings, in which:

FIG. 1 is a schematic cross-sectional view showing a constitution of a photoelectric conversion element including a charge blocking layer according to an exemplary embodiment of the invention;

FIGS. 2(a) and 2(b) are energy diagrams showing a state of the intermediate levels in the two-layer structured charge blocking layer shown in FIG. 1;

DETAILED DESCRIPTION OF THE EXEMPLARY EMBODIMENTS

Figure 3:
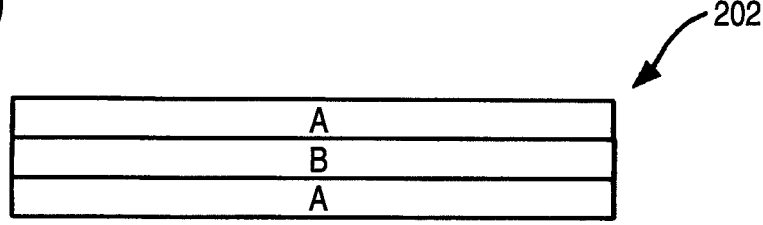
FIGS. 3(a)-3(d) are sectional views showing a combination of layers in the case where the charge blocking layer shown in FIG. 1 has a three-layer structure.
Figure 3:
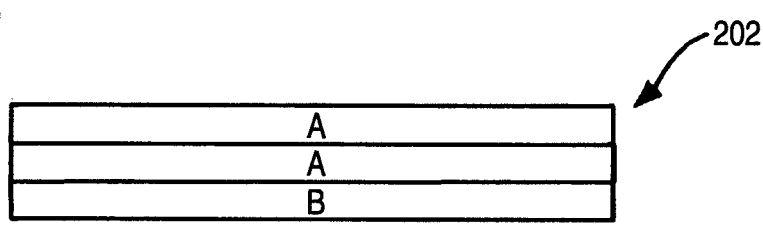
Figure 3:
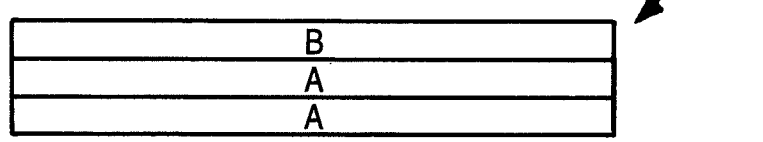
Figure 3:
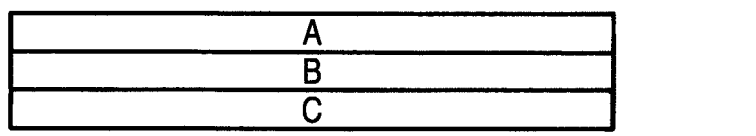

According to an exemplary embodiment of the present invention, there can be provided a photoelectric conversion element which can show a high photoelectric conversion efficiency, a low dark current, and high-speed response properties.

In an organic photoelectric conversion element according to an aspect of the invention, it is desirable for the organic photoelectric conversion layer to be used therein to satisfy the following requirements for the purpose of realizing high photoelectric conversion efficiency, low dark current, and high-speed response properties.

For attaining high photoelectric conversion efficiency and high-speed response properties, it is necessary to transfer signal charges, after dissociation of an exciton, to both electrodes rapidly with no loss. High mobility and high charge-transferring ability with less carrier-trapping sites are necessary.

In order to obtain high photoelectric conversion efficiency, it is desirable for the exciton to have such a small stabilization energy that the exciton can be dissociated rapidly by an electric field applied from outside or generated inside due to pn junction or the like (high exciton dissociation efficiency).

In the case where the material has a higher light absorbance, more generation of excitons takes place, which can be the cause of dark current. In order to minimize the amount of carriers to be generated inside in the dark, it is preferred to select a layer structure and a material having fewer intermediate levels within the material and containing a less amount of impurities which are the cause thereof.

In the case of stacking plural layers, matching of energy level with the adjacent layer becomes necessary, and formation of an energy barrier would inhibit charge transfer.

In the case of forming the organic photoelectric conversion layer by the vacuum deposition method, materials with a decomposition temperature much higher than a temperature at which vacuum deposition thereof is possible are preferred (the higher, the more preferred), since thermal decomposition can be suppressed upon vacuum deposition. The vacuum deposition method facilitates formation of a uniform layer with minimizing the possibility of contamination with impurities, and is therefore preferred for forming the layer.

As a result of intensive investigations, the inventors have found the following 4H pyran compounds which satisfy the above-described necessary requirements and can realize high photoelectric conversion efficiency, low dark current, and high-speed response properties, with showing good vacuum deposition properties.

Compounds to be used in an exemplary embodiment of the invention represented by formula (I), particularly 4H pyran compounds, will be described below.

In formula (I),

X represents O, S or N—$R_{10}$, $R^x$ and $R^y$ each independently represents a hydrogen atom or a substituent, with at least one of them being an electron-withdrawing group, or $R^x$ and $R^y$ may be connected to each other to form a ring, provided that $R^x$ and $R^y$ do not represent a cyano group at the same time, $R_7$ to $R_{10}$ each independently represents a hydrogen atom or a substituent, $R_8$ and $R_9$ may be connected to each other to form a ring, L represents a linking group comprising a conjugated bond, and $D_1$ represents a group of atoms.

As the substituents represented by $R_7$ to $R_{10}$, those which are described below as a substituent W can be applied. Also, as the substituents represented by $R^x$ and $R^y$, those which are described below as a substituent W can be applied, provided that at least one of $R^x$ and $R^y$ is an electron-withdrawing group.

As the substituent W, there are illustrated a halogen atom, an alkyl group (including a cycloalkyl group, a bicycloalkyl group, and a tricycloalkyl group), an alkenyl group (including a cycloalkenyl group and a bicycloalkenyl group), an alkynyl group, an aryl group, a heterocyclic group, a cyano group, a hydroxyl group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino or arylsulfonylamino group, a mercapto group, an alkylthio group, an arylthio group, a heterocyclic thio group, a sulfamoyl group, a sulfo group, an alkylsulfinyl or arylsulfinyl group, an alkylsulfonyl or arylsulfonyl group, an acyl group, an aryloxycarbonyl group, an alkoxycarbonyl group, a carbamoyl group, an arylazo or heterocyclic azo group, an imido group, an phosphino group, a phosphinyl group, a phosphinyloxy group, a phosphinylamino group, a phosphono group, a silyl group, a hydrazino group, a ureido group, a boric acid group (—B(OH)$_2$), a phosphato group (—OPO(OH)$_2$), a sulfato group (—OSO$_3$H), and other known substituents.

More particularly, W represents the following (1) to (48).

(1) Halogen atom

For example, a fluorine atom, a chlorine atom, a bromine atom, and an iodine atom.

(2) Alkyl group

Straight, branched or cyclic, substituted or unsubstituted alkyl groups including (2-a) to (2-e).

(2-a) Alkyl group

Preferably, alkyl groups each containing from 1 to 30 carbon atoms (e.g., methyl, ethyl, n-propyl, isopropyl, t-butyl, n-octyl, eicosyl, 2-chloroethyl, 2-cyanoethyl, and 2-ethylhexyl).

(2-b) Cycloalkyl group

Preferably, substituted or unsubstituted cycloalkyl groups each containing from 3 to 30 carbon atoms (e.g., cyclohexyl, cyclopentyl, and 4-n-dodecylcyclohexyl).

(2-c) Bicycloalkyl group

Preferably, substituted or unsubstituted bicycloalkyl groups each containing from 5 to 30 carbon atoms (e.g., bicycle[1,2,2]heptan-2-yl and bicycle[2,2,2]octan-3-yl).

(2-d) Tricycloalkyl group

Preferably, substituted or unsubstituted tricycloalkyl groups each containing from 7 to 30 carbon atoms (e.g., 1-adamantyl).

(2-e) Polycyclic cycloalkyl group having more cyclic structures

Additionally, the alkyl group (for example, the alkyl group of the alkylthio group) in the substituent to be described hereinafter means the alkyl group of the above-described concept and, in some cases, further means an alkenyl group and an alkynyl group.

(3) Alkenyl group

Straight, branched or cyclic, substituted or unsubstituted alkenyl groups. They include (3-a) to (3-c).

(3-a) Alkenyl group

Preferably, substituted or unsubstituted alkenyl groups each containing from 2 to 30 carbon atoms (e.g., vinyl, allyl, prenyl, geranyl, and oleyl).

(3-b) Cycloalkenyl group

Preferably, substituted or unsubstituted cycloalkenyl groups each containing from 3 to 30 carbon atoms (e.g., 2-cyclopenten-1-yl and 2-cyclohexen-1-yl).

(3-c) Bicycloalkenyl group

Substituted or unsubstituted bicycloalkenyl groups, preferably substituted or unsubstituted bicycloalkenyl groups each containing from 5 to 30 carbon atoms (e.g., bicycle[2,2,1]hept-2-en-1-yl and bicycle[2,2,2]oct-2-en-4-yl).

(4) Alkynyl group

Preferably, substituted or unsubstituted alkynyl groups each containing from 2 to 30 carbon atoms (e.g., ethynyl, propargyl, and trimethylsilylethynyl).

(5) Aryl group

Preferably, substituted or unsubstituted aryl groups each containing from 6 to 30 carbon atoms (e.g., phenyl, p-tolyl, naphthyl, m-chlorophenyl, o-hexadecanoylaminophenyl, and ferrocenyl).

(6) Heterocyclic group

Preferably, monovalent groups each formed by removing one hydrogen atom of a substituted or unsubstituted, aromatic or non-aromatic heterocyclic, preferably 5- or 6-membered, compound, with 5- or 6-membered aromatic heterocyclic groups containing from 3 to 50 carbon atoms being more preferred (e.g., 2-furyl, 2-thienyl, 2-pyrimidinyl, and 2-benzothiazolyl; additionally, cationic heterocyclic groups such as 1-methyl-2-pyridinio and 1-methyl-2-quinolinio being also included).

(7) Cyano group (8) Hydroxyl group (9) Nitro group

(10) Carboxy group

(11) Alkoxy group

Preferably, substituted or unsubstituted alkoxy groups each containing from 1 to 30 carbon atoms (e.g., methoxy, ethoxy, isopropoxy, t-butyoxy, n-octyloxy, and 2-methoxyethoxy).

(12) Aryloxy group

Preferably, substituted or unsubstituted aryloxy groups each containing from 6 to 30 carbon atoms (e.g., phenoxy, 2-methylphenoxy, 4-t-butylphenoxy, 3-nitrophenoxy, and 2-tetradecanoylaminophenoxy).

(13) Silyloxy group

Preferably, silyloxy groups each containing from 3 to 20 carbon atoms (e.g., trimethylsilyloxy and t-butyldimethylsilyloxy).

(14) Heterocyclic oxy group

Preferably, substituted or unsubstituted heterocyclic oxy groups each containing from 2 to 30 carbon atoms (e.g., 1-phenyltetrazol-5-oxy and 2-tetrahydropyranyloxy).

(15) Acyloxy group

Preferably, a formyloxy group, a substituted or unsubstituted alkylcarbonyloxy group containing from 2 to 30 carbon atoms, and a substituted or unsubstituted arylcarbonyloxy group containing from 6 to 30 carbon atoms (e.g., formyloxy, acetyloxy, pivaloyloxy, stearoyloxy, benzoyloxy, and p-methoxyphenylcarbonyloxy).

(16) Carbamoyloxy group

Preferably, substituted or unsubstituted carbamoyloxy groups each containing from 1 to 30 carbon atoms (e.g., N,N-dimethylcarbamoyloxy, N,N-diethylcarbamoyloxy, morpholinocarbamoyloxy, N,N-di-n-octylaminocarbonyloxy, and N-n-octylcarbamoyloxy).

(17) Alkoxycarbonyloxy group

Preferably, substituted or unsubstituted alkoxycarbonyloxy groups each containing from 2 to 30 carbon atoms (e.g., methoxycarbonyloxy, ethoxycarbonyloxy, t-butoxycarbonyloxy, and n-octylcarbonyloxy).

(18) Aryloxycarbonyloxy group

Preferably, substituted or unsubstituted aryloxycarbonyloxy groups each containing from 7 to 30 carbon atoms (e.g., phenoxycarbonyloxy, p-methoxyphenoxycarbonyloxy, and p-n-hexadecyloxyphenoxycarbonyloxy).

(19) Amino group

Preferably, substituted or unsubstituted alkylamino groups each containing from 1 to 30 carbon atoms and substituted or unsubstituted anilino groups each containing from 6 to 30 carbon atoms (e.g., amino, methylamino, dimethylamino, anilino, N-methyl-anilino, and diphenylamino).

(20) Ammonio group

Preferably, an ammonio group and ammonio groups substituted by a substituted or unsubstituted alkyl, aryl or heterocyclic group each containing from 1 to 30 carbon atoms (e.g., trimethylammonio, triethylammonio, and diphenylmethylammonio).

(21) Acylamino group

Preferably, a formylamino group, substituted or unsubstituted alkylcarbonylamino groups each containing from 1 to 30 carbon atoms and substituted or unsubstituted arylcarbonylamino groups each containing from 6 to 30 carbon atoms (e.g., formylamino, acetylamino, pivaloylamino, lauroylamino, benzoylamino, and 3,4,5-tri-n-octyloxyphenylcarbonylamino).

(22) Aminocarbonylamino group

Preferably, substituted or unsubstituted aminocarbonylamino groups each containing from 1 to 30 carbon atoms (e.g., carbamoylamino, N,N-dimethylaminocarbonylamino, N,N-diethylaminocarbonylamino, and morpholinocarbonylamino).

(23) Alkoxycarbonylamino group

Preferably, substituted or unsubstituted alkoxycarbonylamino groups each containing from 2 to 30 carbon atoms (e.g., methoxycarbonylamino, ethoxycarbonylamino, t-butoxycarbonylamino, n-octadecyloxycarbonylamino, N-methyl-methoxycarbonylamino).

(24) Aryloxycarbonylamino group

Preferably, substituted or unsubstituted aryloxycarbonylamino groups each containing from 7 to 30 carbon atoms (e.g., phenoxycarbonylamino, p-chlorophenoxycarbonylamino, and m-n-octyloxyphenoxycarbonylamino).

(25) Sulfamoylamino group

Preferably, substituted or unsubstituted sulfamoylamino groups each containing from 0 to 30 carbon atoms (e.g., sulfamoylamino, N,N-dimethylaminosulfonylamino, and N-n-octylaminosulfonylamino).

(26) Alkylsulfonylamino or arylsulfonylamino group

Preferably, substituted or unsubstituted alkylsulfonylamino groups each containing from 1 to 30 carbon atoms and substituted or unsubstituted arylsulfonylamino groups each containing from 6 to 30 carbon atoms (e.g., methylsulfonylamino, butylsulfonylamino, phenylsulfonylamino, 2,3,5-trichlorophenylsulfonylamino, and p-methylphenylsulfonylamino).

(27) Mercapto group

(28) Alkylthio group

Preferably, substituted or unsubstituted alkylthio groups each containing from 1 to 30 carbon atoms (e.g., methylthio, ethylthio, and n-hexadecylthio).

(29) Arylthio group

Preferably, substituted or unsubstituted arylthio groups each containing from 6 to 30 carbon atoms (e.g., phenylthio, p-chlorophenylthio, and m-methoxyphenylthio).

(30) Heterocyclic thio group

Preferably, substituted or unsubstituted heterocyclic thio groups each containing from 2 to 30 carbon atoms (e.g., 2-benzothiazolylthio and 1-phenyltetrazol-5-ylthio).

(31) Sulfamoyl group

Preferably, substituted or unsubstituted sulfamoyl groups each containing from 0 to 30 carbon atoms (e.g., N-ethylsulfamoyl, N-(3-dodecyloxypropyl)sulfamoyl, N,N-dimethylsulfamoyl, N-acetylsulfamoyl, N-benzoylsulfamoyl, and N—(N'-phenylcarbamoyl)sulfamoyl).

(32) Sulfo group

(33) Alkylsulfinyl or arylsulfinyl group

Preferably, substituted or unsubstituted alkylsulfinyl groups each containing from 1 to 30 carbon atoms and substituted or unsubstituted arylsulfinyl groups each containing from 6 to 30 carbon atoms (e.g., methylsulfinyl, ethylsulfinyl, phenylsulfinyl, and p-methylsulfinyl).

(34) Alkylsulfonyl or arylsulfonyl group

Preferably, substituted or unsubstituted alkylsulfonyl groups each containing from 1 to 30 carbon atoms and substituted or unsubstituted arylsulfonyl groups each containing from 6 to 30 carbon atoms (e.g., methylsulfonyl, ethylsulfonyl, phenylsulfonyl, and p-methylphenylsulfonyl).

(35) Acyl group

Preferably, a formyl group, substituted or unsubstituted alkylcarbonyl groups each containing from 2 to 30 carbon atoms, substituted or unsubstituted arylcarbonyl groups each containing from 7 to 30 carbon atoms, and substituted or unsubstituted heterocyclic carbonyl groups each containing from 4 to 30 carbon atoms wherein the heterocyclic group is connected to the carbonyl group through the carbon atom thereof (e.g., acetyl, pivaloyl, 2-chloroacetyl, stearoyl, benzoyl, p-n-octyloxyphenylcarbonyl, 2-pyridylcarbonyl, and 2-furylcarbonyl).

(36) Aryloxycarbonyl group

Preferably, substituted or unsubstituted aryloxycarbonyl groups each containing from 7 to 30 carbon atoms (e.g., phenoxycarbonyl, o-chlorophenoxycarbonyl, m-nitrophenoxycarbonyl, and p-t-butylphenoxycarbonyl).

(37) Alkoxycarbonyl group

Preferably, substituted or unsubstituted alkoxycarbonyl groups each containing from 2 to 30 carbon atoms (e.g., methoxycarbonyl, ethoxycarbonyl, t-butoxycarbonyl, and n-octadecyloxycarbonyl).

(38) Carbamoyl group

Preferably, substituted or unsubstituted carbamoyl groups each containing from 1 to 30 carbon atoms (e.g., carbamoyl, N-methylcarbamoyl, N,N-dimethylcarbamoyl, N,N-di-n-octylcarbamoyl, and N-(methylsulfonyl)carbamoyl).

(39) Arylazo and heterocyclic azo group

Preferably, substituted or unsubstituted arylazo groups each containing from 6 to 30 carbon atoms and substituted or unsubstituted heterocyclic azo groups each containing from 3 to 30 carbon atoms (e.g., phenylazo, p-chlorophenylazo, and 5-ethylthio-1,3,4-thiadiazol-2-ylazo).

(40) Imido group

Preferably, N-succinimido and N-phthalimido.

(41) Phosphino group

Preferably, substituted or unsubstituted phosphino groups containing from 2 to 30 carbon atoms (e.g., dimethylphosphino, diphenylphosphino, and methylphenylphosphino).

(42) Phosphinyl group

Preferably, substituted or unsubstituted phosphinyl groups containing from 2 to 30 carbon atoms (e.g., phosphinyl, dioctyloxyphosphinyl, and diethoxyphosphinyl).

(43) Phosphinyloxy group

Preferably, substituted or unsubstituted phosphinyloxy groups containing from 2 to 30 carbon atoms (e.g., diphenoxyphosphinyloxy and dioctyloxyphosphinyloxy).

(44) Phosphinylamino group

Preferably, substituted or unsubstituted phosphinylamino groups containing from 2 to 30 carbon atoms (e.g., dimethoxyphosphinylamino and dimethylaminophosphinylamino).

(45) Phosphono group

(46) Silyl group

Preferably, substituted or unsubstituted silyl groups containing from 3 to 30 carbon atoms (e.g., trimethylsilyl, triethylsilyl, triisopropylsilyl, t-butylsilyl, and phenyldimethylsilyl).

(47) Hydrazino group

Preferably, substituted or unsubstituted hydrazino groups containing from 0 to 30 carbon atoms (e.g., trimethylhydrazino).

(48) Ureido group

Preferably, substituted or unsubstituted ureido groups containing from 0 to 30 carbon atoms (e.g., N,N-dimethylureido).

Also, two Ws may cooperate to form a ring. Examples of such ring include aromatic or non-aromatic hydrocarbon rings, heterocyclic rings, and polycyclic condensed rings which are formed by a combination of them. For example, there are illustrated a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthenes ring, a phenoxathine ring, a phenothiazine ring, and a phenazine ring.

Of the above-described substituents of W, those which have a hydrogen atom may further be substituted by the above-described group with removing the hydrogen atom. Examples of such substituent include —CONHSO$_2$— (a sulfonylcarbamoyl group or a carbonylsulfamoyl group), —CONHCO— (a carbonylcarbamoyl group), and —SO$_2$NHSO$_2$— (a sulfonylsulfamoyl group). More specifically, there are illustrated an alkylcarbonylaminosulfonyl group (e.g., acetylaminosulfonyl), an arylcarbonylaminosulfonyl group (e.g., benzoylaminosulfonyl), an alkylsulfonylaminocarbonyl group (e.g., methylsulfonylaminocarbonyl), an arylsulfonylaminocarbonyl group (e.g., p-methylphenylsulfonylaminocarbonyl).

$R^x$ and $R^y$ each independently represents a hydrogen atom or a substituent, with at least one of them being an electron-withdrawing group. Also, $R^x$ and $R^y$ may be connected to each other to form a ring. The sum of the Sp$^2$ carbon atoms contained in $R^x$ and $R^y$ is preferably 3 or more.

As substituents represented by $R^x$ and $R^y$, there can be applied, for example, those which have been illustrated as the substituents of W. Substituents represented by $R^x$ and $R^y$ are preferably an alkyl group, an alkenyl group, an aryl group, an alkoxy group, an aryloxy group, a carbonyl group, a thiocarbonyl group, an oxycarbonyl group, an acylamino group, a carbamoyl group, a sulfonylamino group, a sulfamoyl group, a sulfonyl group, a sulfinyl group, a phosphoryl group, an imino group, a halogen atom, a silyl group, and an aromatic heterocyclic group; more preferably an electron-withdrawing group having a Hammett's σp value (definition and values of sigma para values being described in, for example, Chem. Rev. 1991, 165-195) of 0.2 or more; more preferably an aryl group, an aromatic heterocyclic group, a carbonyl group, a thiocarbonyl group, an oxycarbonyl group, a carbamoyl group, a sulfamoyl group, a sulfonyl group, an imino group, a halogen atom, and an electron-withdrawing cyclic group formed by both $R^x$ and $R^y$ connected to each other; particularly preferably an aromatic heterocyclic group, a carbonyl group, an imino group, and an electron-withdrawing cyclic group formed by both $R^x$ and $R^y$ connected to each other; most preferably an electron-withdrawing cyclic group formed by both $R^x$ and $R^y$ connected to each other.

$R^7$ to $R^{10}$ each independently represents a hydrogen atom or a substituent. As substituents represented by $R^7$ to $R^{10}$, there can be applied those which have been illustrated as substituents of W.

$R^7$ is preferably a hydrogen atom, an alkyl group, an aryl group, a halogen atom, or a cyano group, more preferably a hydrogen atom or an alkyl group, still more preferably a hydrogen atom.

$R^8$ is preferably a hydrogen atom, an alkyl group, an aryl group, a heteroaryl group, or is connected to $R^9$ to form a ring, more preferably a hydrogen atom or an alkyl group, still more preferably a hydrogen atom.

$R^9$ is preferably a hydrogen atom, an alkyl group, an alkenyl group, an aryl group, a heteroaryl group, or is connected to $R^8$ to form a ring, more preferably an alkyl group (preferably an alkyl group containing from 2 to 20 carbon atoms, more preferably a branched or cyclic alkyl group containing from 3 to 20 carbon atoms, still more preferably a branched or cyclic alkyl group containing from 4 to 12 carbon atoms and having a quaternary carbon atom, particularly preferably a tert-butyl group), an alkenyl group (an alkenyl group containing preferably from 2 to 30 carbon atoms, more preferably from 3 to 25 carbon atoms, still more preferably from 4 to 25 carbon atoms), an aryl group (preferably an aryl group having a substituent at o-position, more preferably an alkyl-substituted phenyl group containing from 7 to 30 carbon atoms and having a substituent at o-position, still more preferably a 2,6-dimethyl-substituted phenyl group, particularly preferably a 2,4,6-trimethylphenyl group), particularly preferably a tert-butyl group or a 2,4,6-trimethylphenyl group, most preferably a tert-butyl group.

X represents an oxygen atom, a sulfur atom or N—R$^{10}$, wherein R$^{10}$ represents a hydrogen atom or a substituent. X is preferably an oxygen atom or N—R$^{10}$, more preferably an oxygen atom.

The substituent represented by $R^{10}$ is an alkyl group, an alkenyl group, an alkynyl group, an aryl group, an acyl group, an alkoxycarbonyl group, an aryloxycarbonyl group, a sulfamoyl group, a carbamoyl group, a sulfonyl group, a sulfinyl group or a heterocyclic group, more preferably an alkyl group, an alkenyl group, an alkynyl group, an aryl group or a heterocyclic group, still more preferably an alkyl group, an aryl group or an aromatic heterocyclic group, yet more preferably an alkyl group or an aryl group. The substituent represented by $R^{10}$ may further be substituted. Also, in the case where two or more substituents exist, they may be the same or different and, if possible, they may be connected to each other to form a ring.

L represents a linking group containing conjugated bond. The linking group represented by L is preferably a conjugated bond type linking group formed by C, N, O, S, Se, Te, Si, Ge, etc., more preferably alkenylene, alkynylene, arylene, divalent aromatic hetero ring (preferably an aromatic hetero ring formed by azine, azole, thiophene or furan ring), azo, imine, or a group comprising N and a combination of these, more preferably alkenylene, arylene, divalent aromatic hetero ring, or a group comprising N and a combination of these, particularly preferably a group comprising a combination of alkenylene and arylene containing from 6 to 30 carbon atoms (more preferably from 6 to 20 carbon atoms, particularly preferably from 6 to 12 carbon atoms). As specific examples of the linking group represented by L, there are illustrated, for example, the following ones.

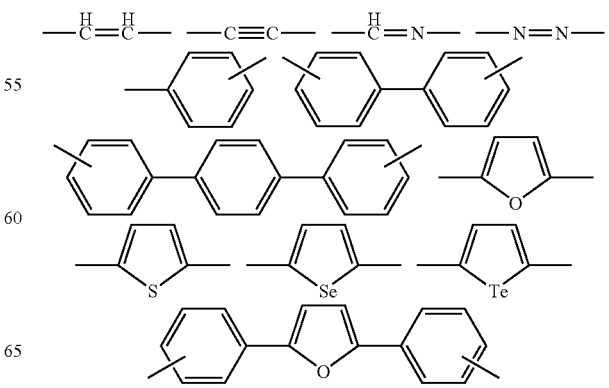

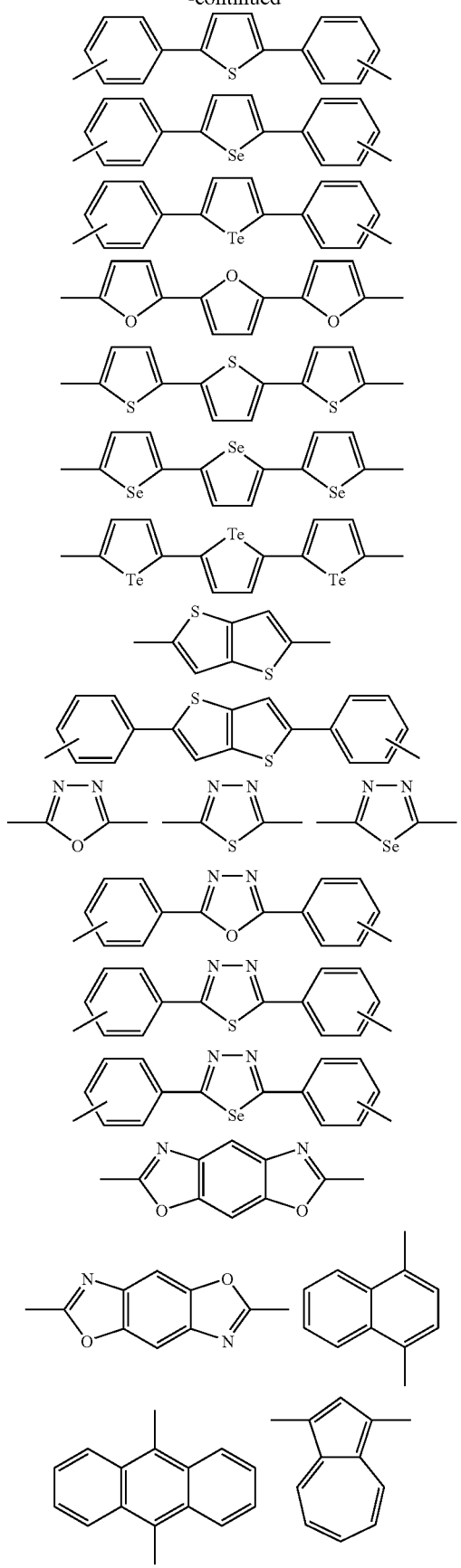
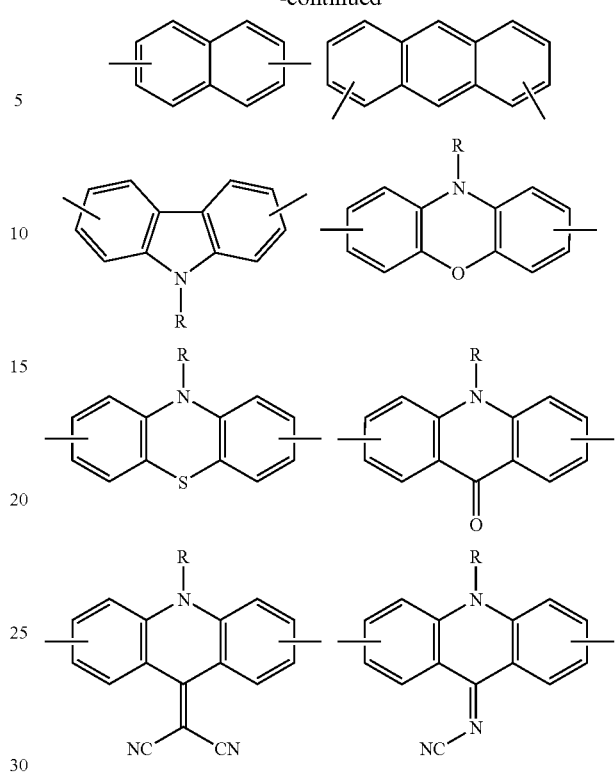
R represents a hydrogen atom, an aliphatic hydrocarbon group, an aryl group or a heterocyclic group.
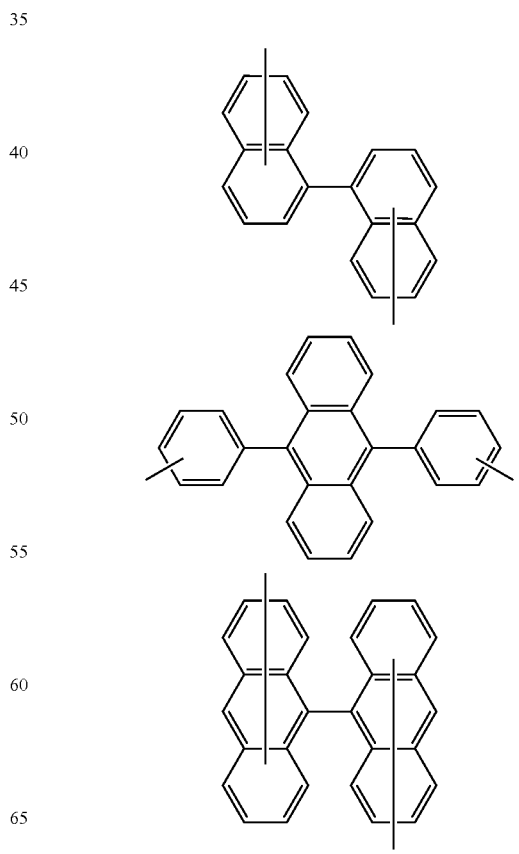

-continued

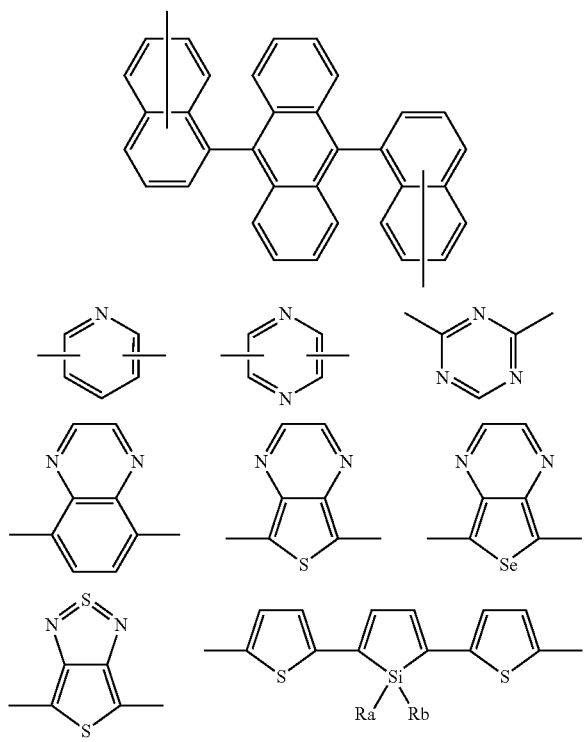

Ra and Rb each represents an aliphatic hydrocarbon group, an aryl group or a heterocyclic group.

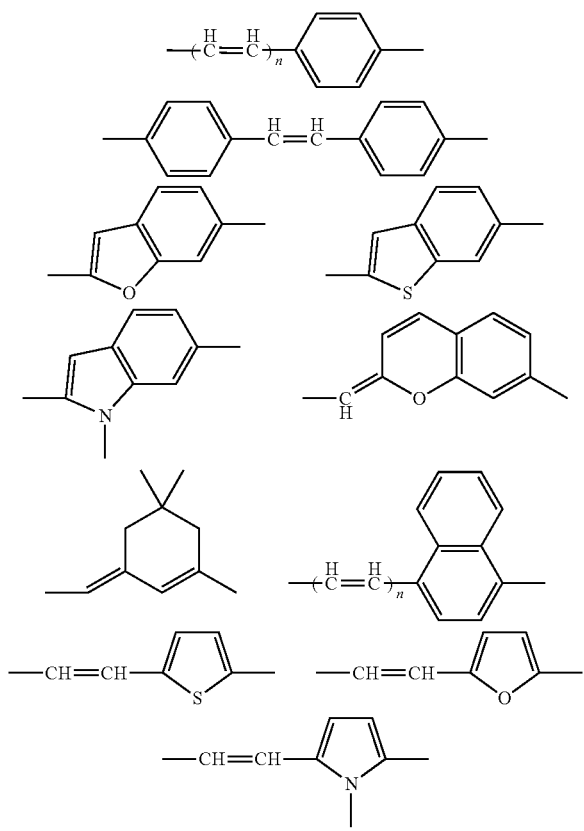

-continued

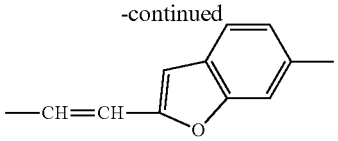

n = 1, 2, 3

$D_1$ represents a group of atoms. $D_1$ is preferably a group containing —NR$^a$(R$^b$), more preferably a divalent arylene group to which —NR$^a$(R$^b$) is bound. R$^a$ and R$^b$ each independently represents a hydrogen atom or a substituent, or R$^a$, R$^b$, and L may form a ring. R$^a$ and R$^b$ may be connected to each other to form a ring (preferably a 5- or 6-membered ring, more preferably a 6-membered ring), or each of R$^a$ and R$^b$ may be connected to a substituent in L to form a ring (preferably a 5- or 6-membered ring, more preferably a 6-membered ring). As the substituents represented by R$^a$ and R$^b$, there are illustrated the substituents of W described hereinbefore, with an aliphatic hydrocarbon group, an aryl group, and a heterocyclic group being preferred.

$D_1$ is preferably a divalent arylene group (preferably a phenylene group) to which an amino group is bound at p-position. The amino group may be substituted, and the substituent on the amino group may be connected to the substituent of the aryl group (preferably a benzene ring of a phenyl group) in the arylene group to form a ring. As the substituents on the amino group, there are illustrated the aforesaid substituents of W, with an aliphatic hydrocarbon group, an aryl group, and a heterocyclic group being preferred.

As substituents in the case where R$^a$ and R$^b$ each is an aliphatic hydrocarbon group, an aryl group or a heterocyclic group, an alkyl group, an alkenyl group, an aryl group, an alkoxy group, an aryloxy group, an acyl group, an alkoxycarbonyl group, an aryloxycarbonyl group, an acylamino group, a sulfonylamino group, a sulfonyl group, a silyl group, and an aromatic heterocyclic group are preferred, an alkyl group, an alkenyl group, an aryl group, an alkoxy group, an aryloxy group, a silyl group, and an aromatic heterocyclic group are more preferred, an alkyl group, an aryl group, an alkoxy group, an aryloxy group, a silyl group, and an aromatic heterocyclic group are still more preferred. As specific examples thereof, there can be applied those which have been illustrated as the substituents of W.

R$^a$ and R$^b$ each is preferably an alkyl group, an aryl group or an aromatic heterocyclic group. R$^a$ and R$^b$ each is particularly preferably an alkyl group, an alkylene group connected to L to form a ring, or an aryl group, more preferably an alkyl group containing from 1 to 8 carbon atoms, an alkylene group connected to L to form a 5- or 6-membered ring, or a substituted or unsubstituted phenyl group.

As compounds represented by formula (I), compounds represented by formula (II) are more preferred. The compounds represented by formula (II) are compounds wherein R$^x$ and R$^y$ in formula (I) are connected to each other to form a ring. $Z^1$ represents the atoms necessary to complete a 5- to 6-membered ring and, as the ring to be formed, those which are commonly used as acidic nuclei in merocyanine dyes are preferred. Specific examples thereof are those which are illustrated below.

(a) 1,3-dicarbonyl nucleus: for example, 1,3-indanedione nucleus, 1,3-cyclohexanedione nucleus, 5,5-dimethyl-1,3-cyclohexanedione nucleus, and 1,3-dioxane-4,6-dione nucleus.

(b) pyrazolinone nucleus: for example, 1-phenyl-2-pyrazolin-5-one, 3-methyl-1-phenyl-2-pyrazolin-5-one, and 1-(2-benzothiazoyl)-3-methyl-2-pyrazolin-5-one.
(c) isoxazolinone nucleus: for example, 3-phenyl-2-isoxazolin-5-one, and 3-methyl-2-isoxazolin-5-one.
(d) oxyindole nucleus: for example, 1-alkyl-2,3-dihydro-2-oxyindole.
(e) 2,4,6-triketohexahydropyrimidine nucleus: for example, barbituric acid, 2-thiobarbituric acid and derivatives thereof. Examples of such derivatives include 1-alkyl derivatives such as 1-methyl and 1-ethyl derivatives; 1,3-dialkyl derivatives such as 1,3-diethyl and 1,3-dibutyl derivatives; 1,3-diaryl derivatives such as 1,3-diphenyl, 1,3-di(p-chlorophenyl), and 1,3-di(p-ethoxycarbonylphenyl) derivatives; 1-alkyl-3-aryl derivatives such as 1-ethyl-3-phenyl derivative; and 1,3-di-heterocyclic derivatives such as 1,3-di(2-pyridyl) derivatives.
(f) 2-thio-2,4-thiazolidinedion nucleus: for example, rhodanine and derivatives thereof. Examples of such derivatives include 3-alkylrhodanine such as 3-methylrhodanine, 3-ethylrhodanine, and 3-allylrhodanine; 3-arylrhodanine such as 3-phenylrhodanine; and 3-hetero ring-substituted rhodanine such as 3-(2-pyridyl)rhodanine.
(g) 2-thio-2,4-oxazolidinedione (2-thio-2,4-(3H,5H)-oxazoledione) nucleus: for example, 3-ethyl-2-thio-2,4-oxazolidinedione.
(h) thianaphthenone nucleus: for example, 3-(2H)-thianaphthenone-1,1-dioxide.
(i) 2-thio-2,5-thiazolidinedione nucleus: for example, 3-ethyl-2-thio-2,5-thiazolidinedione.
(j) 2,4-thiazolidinedione nucleus: for example, 2,4-thiazolidinedione, 3-ethyl-2,4-thiazolidinedione, and 3-phenyl-2,4-thiazolidinedione.
(k) thiazolin-4-one nucleus: for example, 4-thiazolinone, 2-ethyl-4-thiazolinone.
(l) 2,4-imidazolidinedione (hydantoin nucleus): for example, 2,4-imidazolidinedione and 3-ethyl-2,4-imidazolidinedione.
(m) 2-thio-2,4-imidazolidinedione (2-thiohydantoin) nucleus: for example, 2-thio-2,4-imidazolidinedione and 3-ethyl-2-thio-2,4-imidazolidinedione.
(n) imidazolin-5-one nucleus: for example, 2-propylmercapto-2-imidazolin-5-one.
(o) 3,5-pyrazolidinedione nucleus: for example, 1,2-diphenyl-3,5-pyrazolidinedione and 1,2-dimethyl-3,5-pyrazolidinedione.
(p) benzothiophen-3-one nucleus: for example, benzothiophen-3-one, oxobenzothiophen-3-one, and dioxobenzothiophen-3-one.
(q) indanone nucleus: for example, 1-indanone, 3-phenyl-1-indanone, 3-methyl-1-indanone, 3,3-diphenyl-1-indanone, and 3,3-dimethyl-1-indanone.

The ring formed by $Z^1$ is preferably a 1,3-dicarbonyl nucleus, a pyrazolinone nucleus, a 2,4,6-triketohexahydropyrimidine nucleus (including a thioketone derivative), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus or an indanone nucleus, more preferably a 1,3-dicarbonyl nucleus, a 2,4,6-triketohexahydropyrimidine nucleus (including a thioketone derivative), a 3,5-pyrazolidinedione nucleus, a benzothiophen-3-one nucleus or an indanone nucleus, still more preferably a 1,3-dicarbonyl nucleus or a 2,4,6-triketohexahydropyrimidine nucleus (including a thioketone derivative), particularly preferably a 1,3-indanedione nucleus.

$L_1$ and $L_2$ each independently represents an unsubstituted methine group or a substituted methine group. As substituents on the substituted methine group, there are illustrated the aforesaid substituents of W. However, both $L_1$ and $L_2$ are preferably an unsubstituted methine group.

n represents an integer of 1 or more, preferably 1.

As the compounds represented by formula (II), compounds represented by formula (III) are more preferred. In the compounds represented by formula (III), X, $R_7$ to $R_{10}$, $L_1$, $L_2$, $Z_1$, and n are the same as X, $R_7$ to $R_{10}$, $L_1$, $L_2$, $Z_1$, and n in formula (II), and preferred ones are also the same as described there.

$R_1$ to $R_6$ each independently represents a hydrogen atom or a substituent. Preferred examples of the substituent include an aliphatic hydrocarbon group (preferably an alkyl group or an alkenyl group) and an alkoxy group.

$R_1$ and $R_2$, $R_3$ and $R_4$, $R_2$ and $R_5$, $R_4$ and $R_6$, or $R_5$ and $R_6$, may be connected to each other to form a ring. In a preferred case, $R_2$ and $R_5$ are connected to each other to form a 6-membered ring.

As the compounds represented by formula (II), compounds represented by formula (IV) are more preferred. In the compounds represented by formula (IV), $R_7$ to $R_9$, $L_1$, $L_2$, $D_1$, and n are the same as $R_7$ to $R_9$, $L_1$, $L_2$, $D_1$, and n in formula (II), and preferred ones are also the same as described there.

$Z^3$ represents the atoms necessary to complete a 5- or 6-membered ring. Of the rings formed by $Z^1$ in formula (I), the ring formed by $Z^3$ is, for example, a ring which has a 1,3-dicarbonyl structure within the ring, and includes 1,3-cyclopentanedione, 1,3-cyclohexanedione, 1,3-indanedione, 3,5-pyrazolidinedione, and 2,4,6-triketohexahydropyrimidine nucleus, preferably 1,3-indanedione, 3,5-pyrazolidinedione, and barbituric acid or 2-thiobarbituric acid and the derivatives thereof, more preferably 1,3-indanedione, and 1,2-diaryl-3,5-pyrazolidinedione, still more preferably 1,3-indanedione and 1,2-diphenyl-3,5-pyrazolidinedione, particularly preferably 1,3-indanedione. The ring represented by $Z^3$ may have a substituent and, as the substituent, there can be applied, for example, those which have been illustrated as substituents of W.

As the compounds represented by formula (II), compounds represented by formula (V) are more preferred. In the compounds represented by formula (V), X, $R_7$ to $R_{10}$, $L_1$, $L_2$, n, and $D_1$ are the same as X, $R_7$ to $R_{10}$, $L_1$, $L_2$, n, and $D_1$ in formula (II), and preferred ones are also the same as described there.

$R_{11}$ to $R_{14}$ each independently represents a hydrogen atom or a substituent. As the substituent, there can be applied, for example, those which have been illustrated as substituents of W. Preferably, $R_{11}$ to $R_{14}$ all represent a hydrogen atom.

As the compounds represented by formula (II), compounds represented by formula (VI) are more preferred. In the compounds represented by formula (VI), X, $R_7$ to $R_{11}$, $R_{14}$, $L_1$, $L_2$, n, and $D_1$ are the same as X, $R_7$ to $R_{11}$, $R_{14}$, $L_1$, $L_2$, n, and $D_1$ in formula (V), and preferred ones are also the same as described there.

$R_{15}$ to $R_{18}$ each independently represents a hydrogen atom or a substituent. As the substituent, there can be applied, for example, those which have been illustrated as substituents of W. Preferably, $R_{15}$ to $R_{18}$ all represent a hydrogen atom.

In formula (VII), substituents represented by $R_5$ and $R_6$ are the same as $R^a$ and $R^b$, and preferred examples are also the same as described therein.

In formula (VIII), $R_{21}$ to $R_{24}$ each independently represents a hydrogen atom or a substituent. $R_{22}$ and $R_{23}$, and $R_{21}$ and $R_{22}$, may be connected to each other to form a ring. Substituents represented by $R_{21}$ to $R_{24}$ are preferably an alkyl group. Particularly preferably, $R_{21}$ represents an ethyl group, and $R_{22}$, $R_{23}$, and $R_{24}$ all represent a methyl group.

In formula (IX), $R_{31}$ to $R_{34}$ each independently represents a hydrogen atom or a substituent. $R_{32}$ and $R_{33}$, and $R_{31}$ and $R_{32}$, may be connected to each other to form a ring. Substituents represented by $R_{31}$ to $R_{34}$ are preferably an alkyl group. Particularly preferably, $R_{31}$ represents an ethyl group, and $R_{32}$, $R_{33}$, and $R_{34}$ all represent a methyl group.

In formula (X), $R_{41}$ to $R_{43}$ each independently represents a hydrogen atom or a substituent. $R_{42}$ and $R_{43}$ may be connected to each other to form a ring. Substituents represented by $R_{41}$ to $R_{43}$ are preferably an alkyl group. Particularly preferably, $R_{41}$ represents an ethyl group, and $R_{42}$ and $R_{43}$ all represent a methyl group.

Specific examples of the compounds represented by formula (I) will be shown below. However, the invention is not limited only to them.

(D-1)

(D-2)

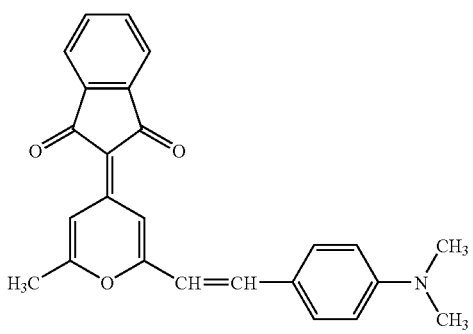

(D-3)

(D-4)

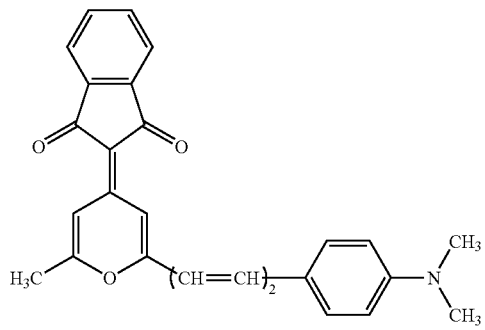

(D-5)

(D-6)

(D-7)

-continued
(D-8)
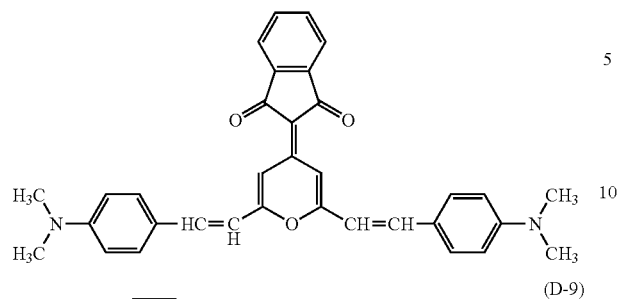
(D-9)
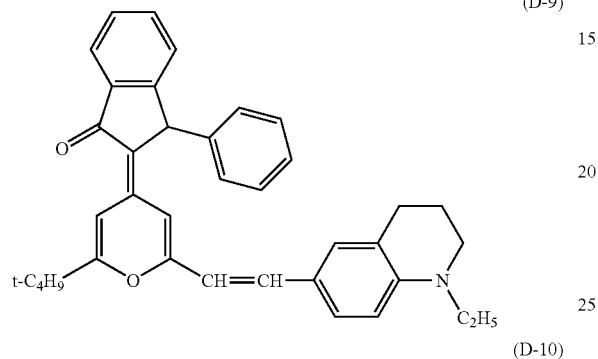
(D-10)
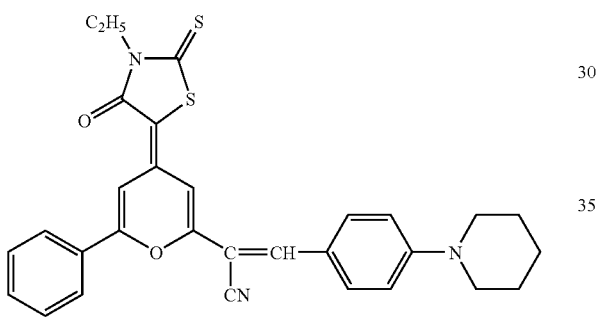
(D-11)
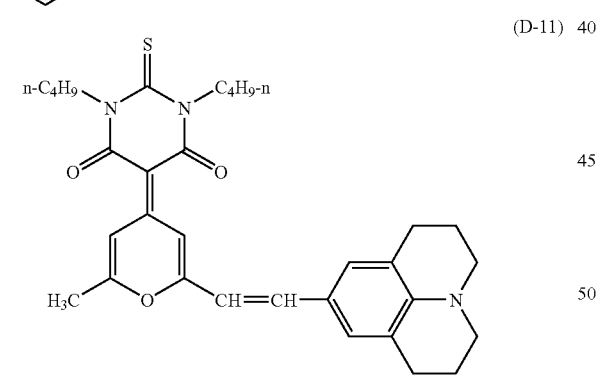
(D-12)
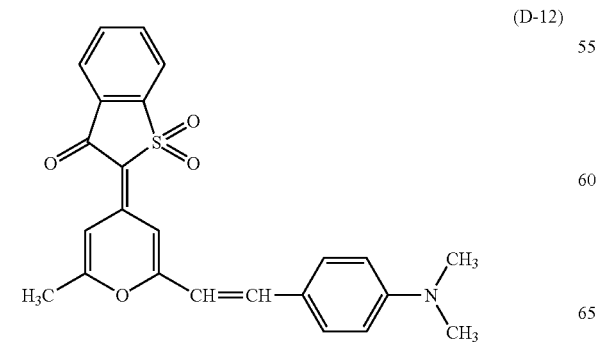
-continued
(D-13)
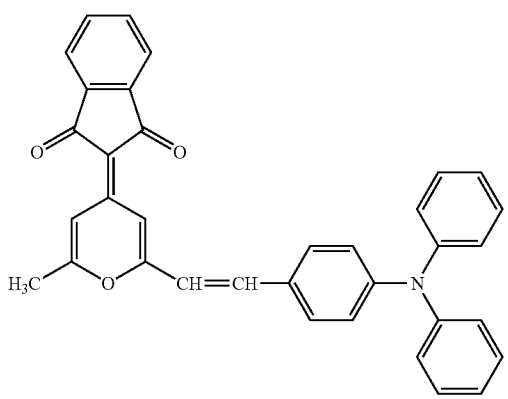
(D-14)
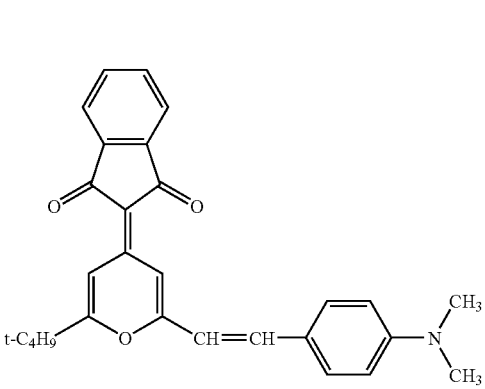
(D-15)
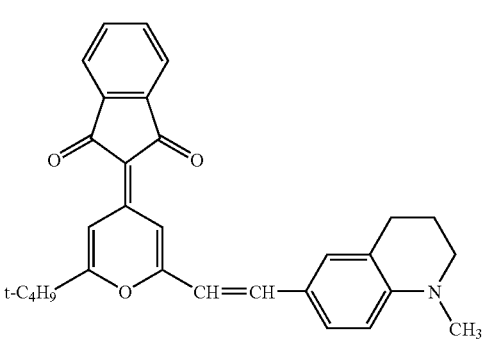
(D-16)
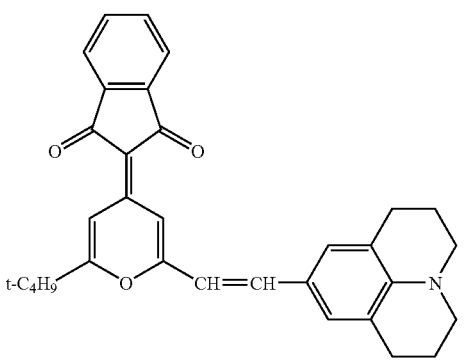

-continued
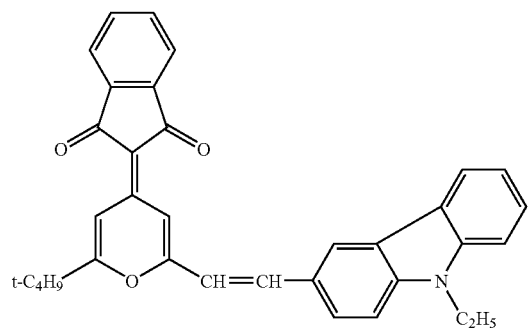
(D-17)
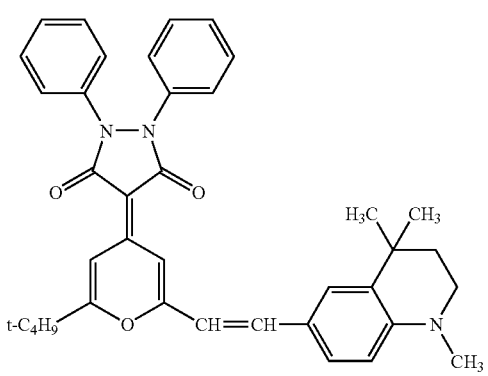
(D-18)
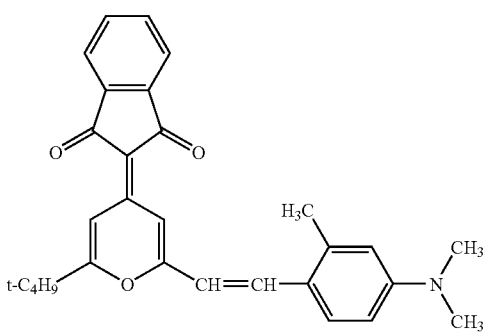
(D-19)
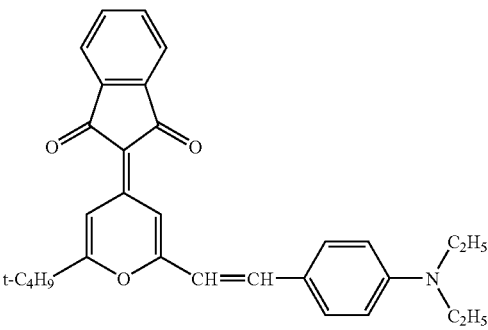
(D-20)
-continued
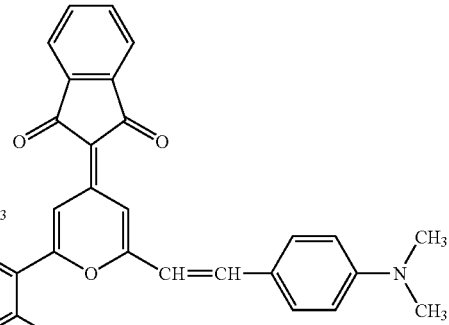
(D-21)
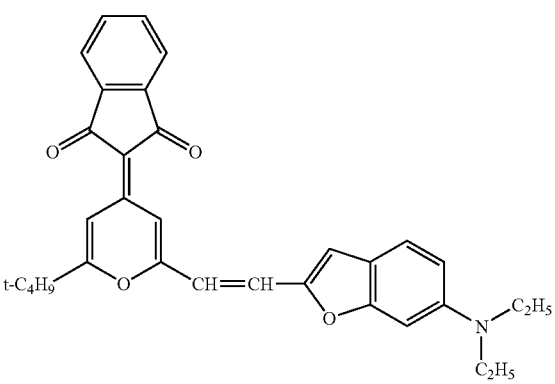
(D-22)
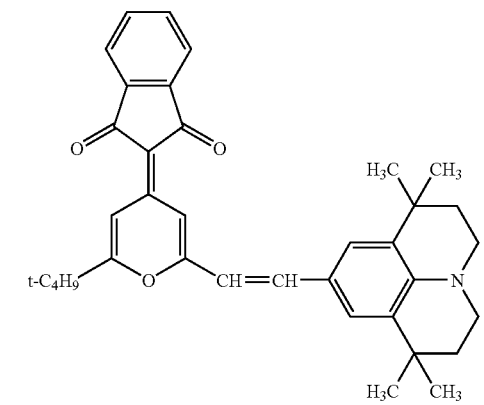
(D-23)
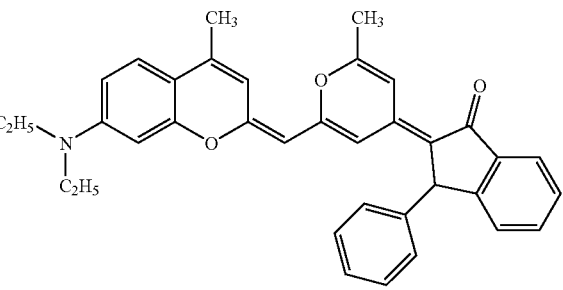
(D-24)

(D-25)
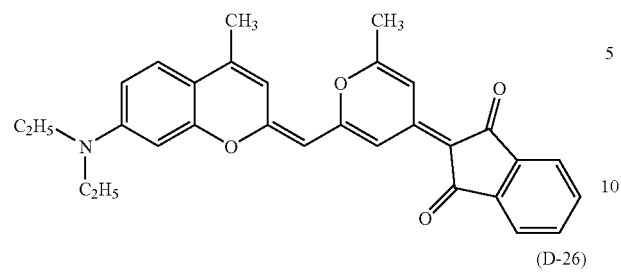
(D-26)
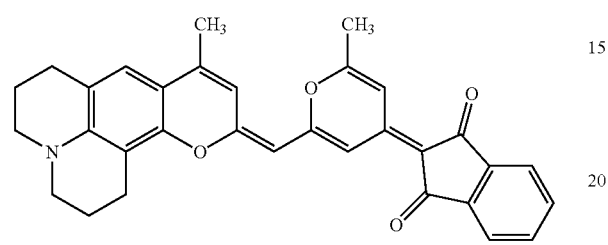
(D-27)
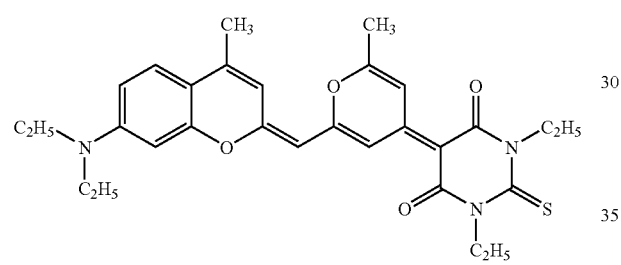
(D-28)
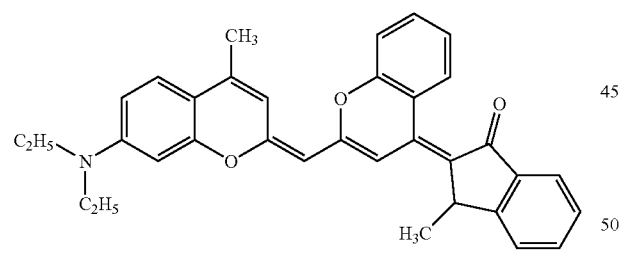
(D-29)
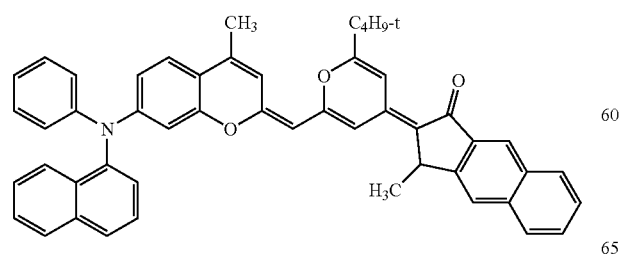
(D-30)
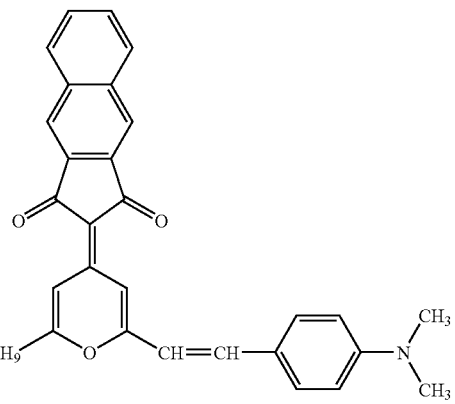
(D-31)
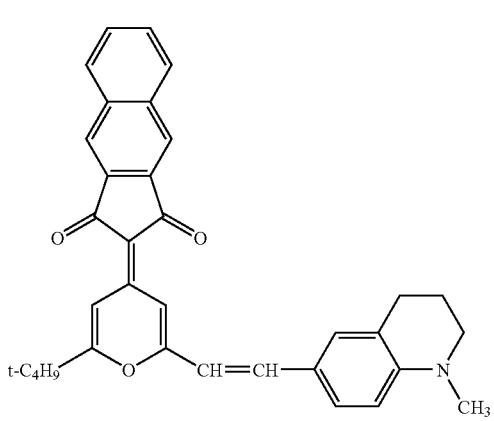
(D-32)
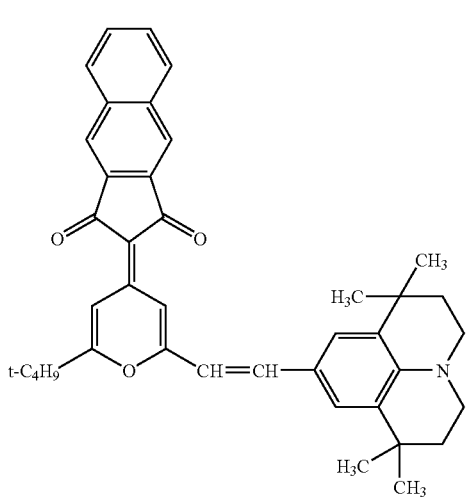

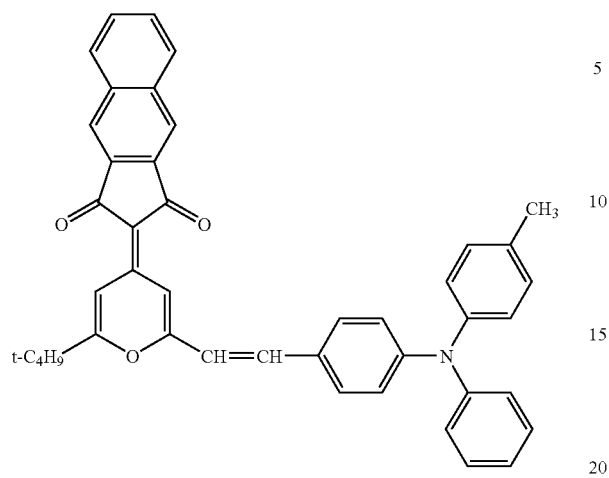
(D-33)
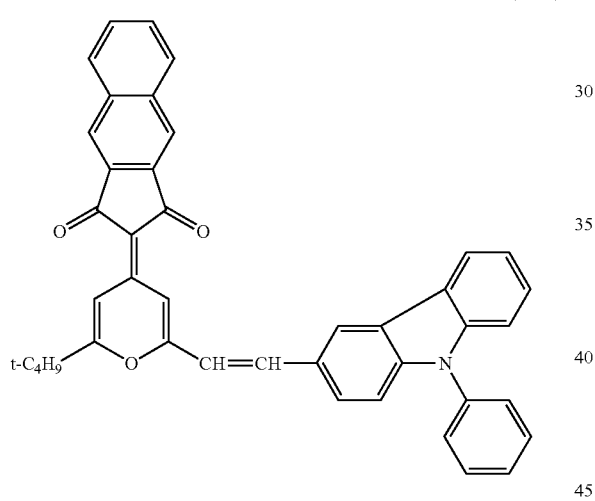
(D-34)
(D-35)
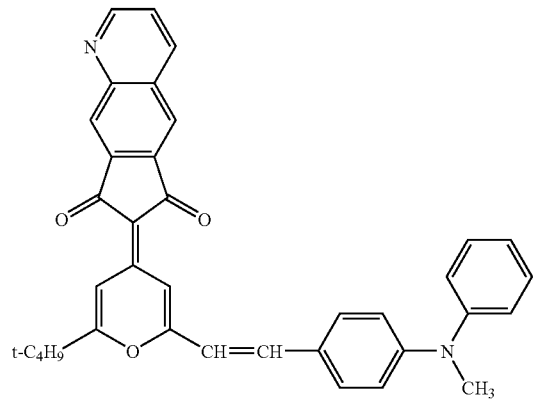
(D-36)
(D-37)
(D-38)
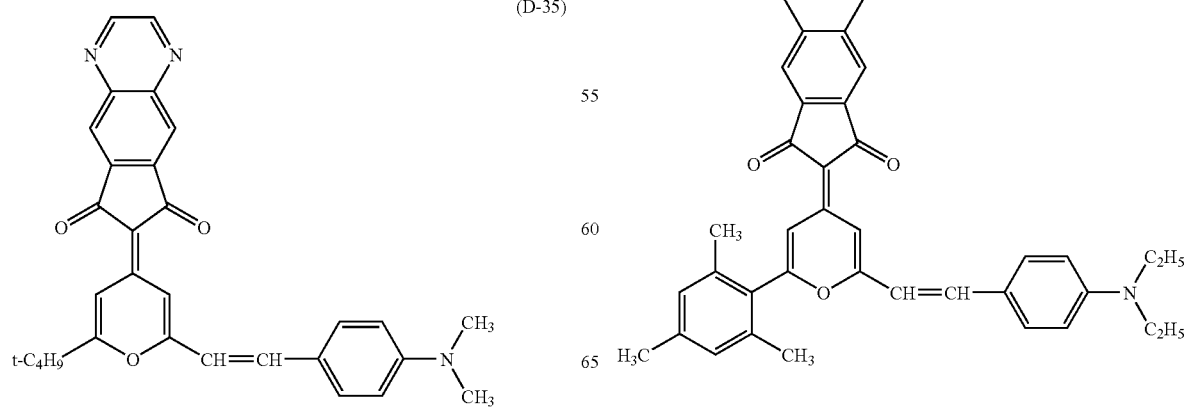

-continued
(D-39)
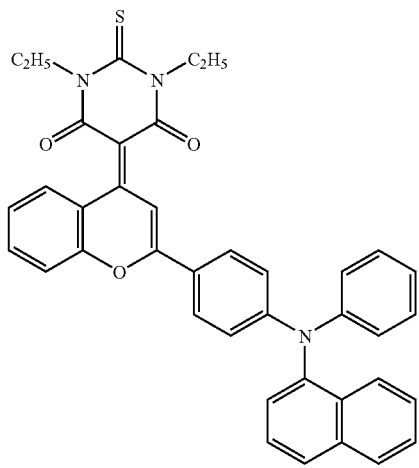
(D-42)
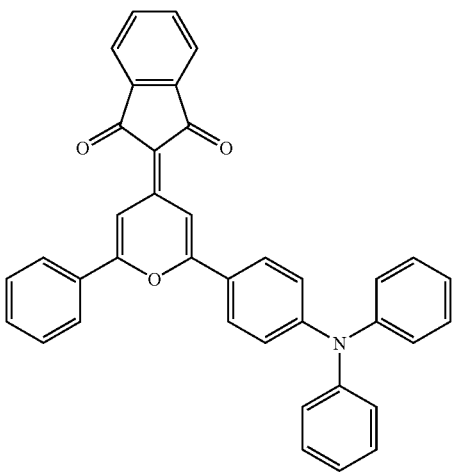
(D-40)
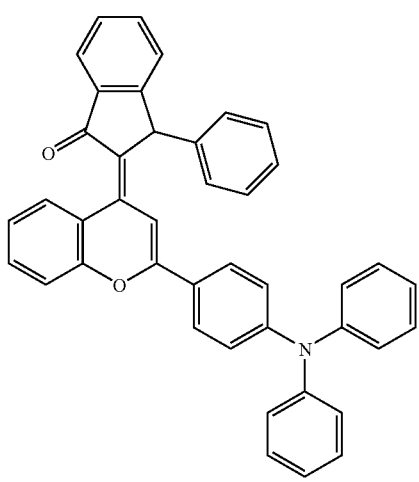
(D-43)
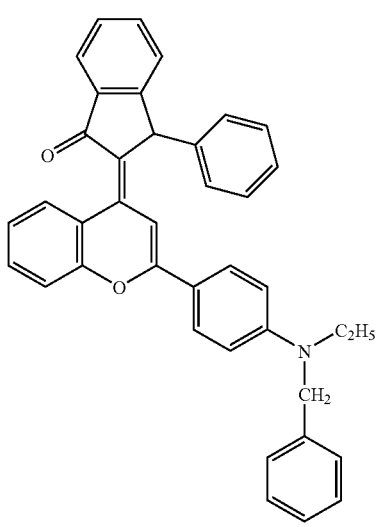
(D-41)
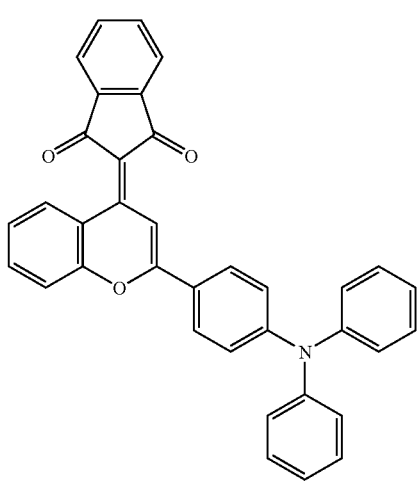
(D-44)
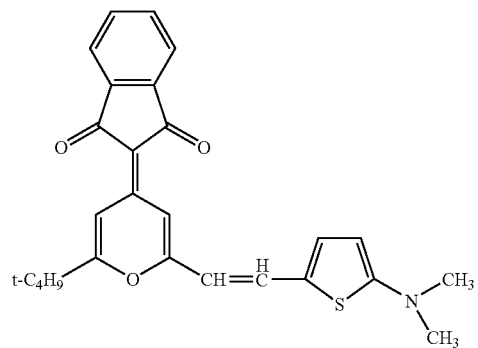

(D-45)
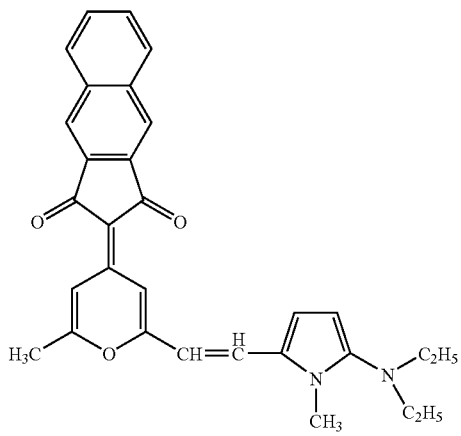
(D-46)
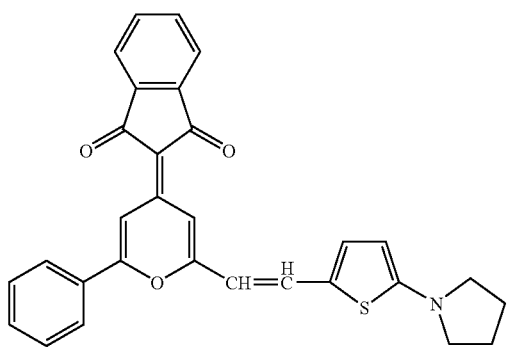
(D-47)
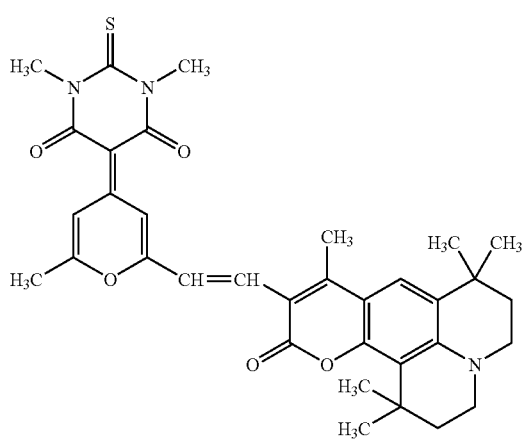
(D-48)
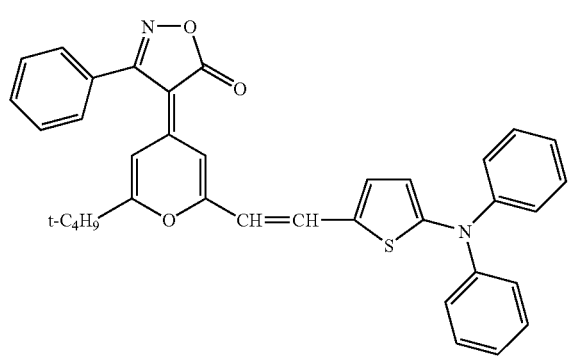
(D-49)
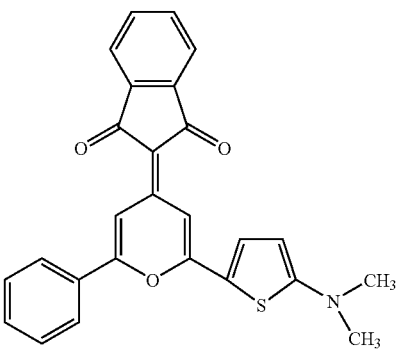
(D-50)
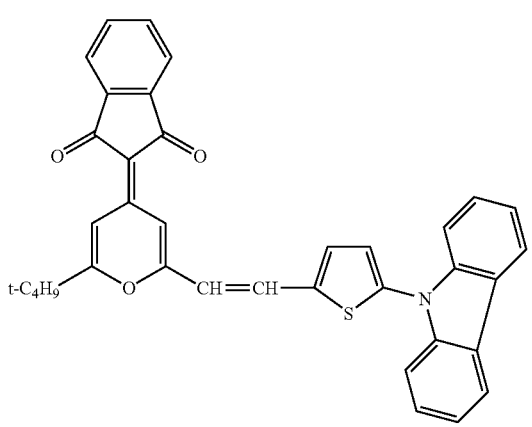
(D-51)
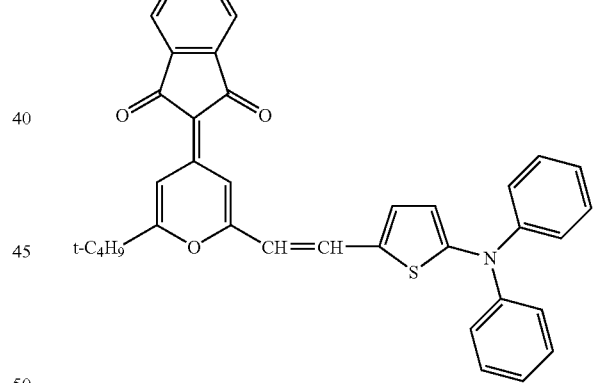
(D-52)
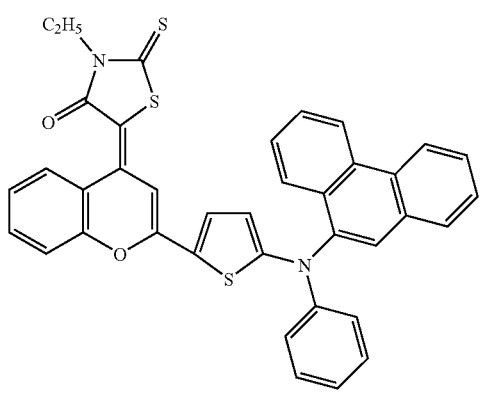

(D-53)
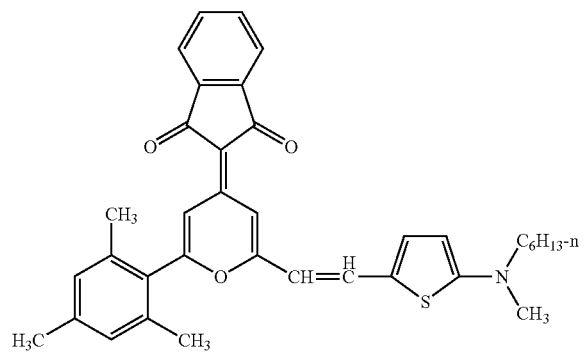
(D-57)
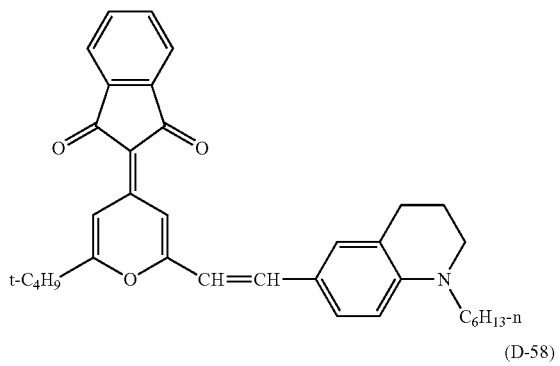
(D-54)
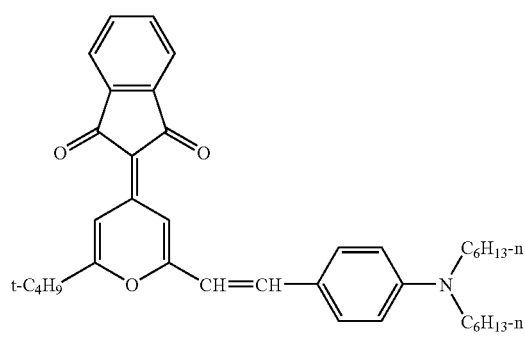
(D-58)
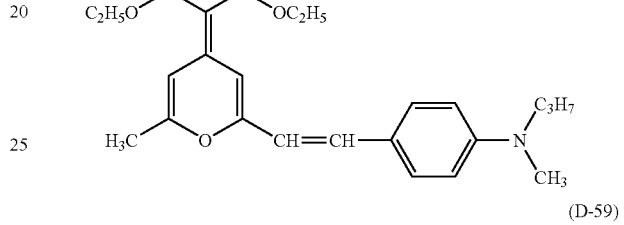
(D-59)
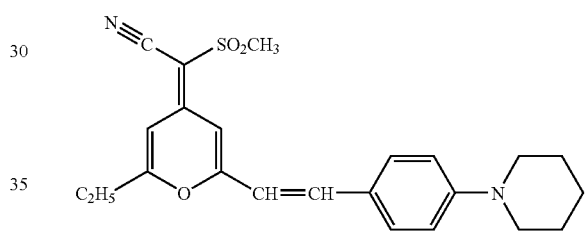
(D-55)
(D-60)
(D-56)
(D-61)
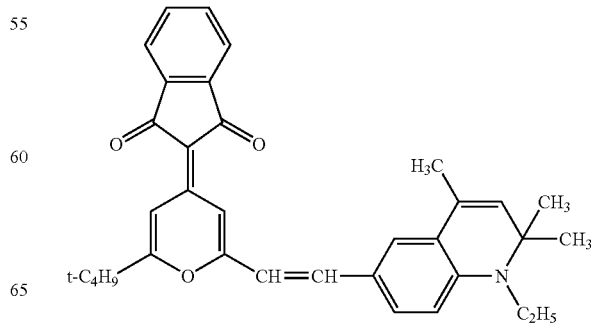

(D-62)
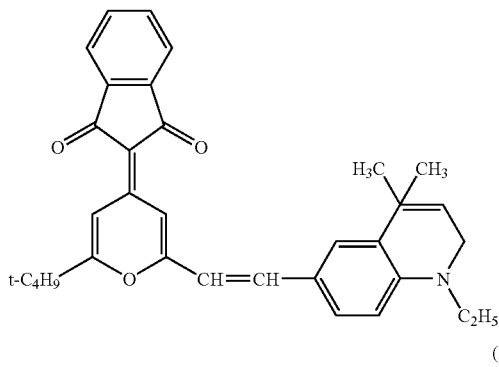
(D-63)
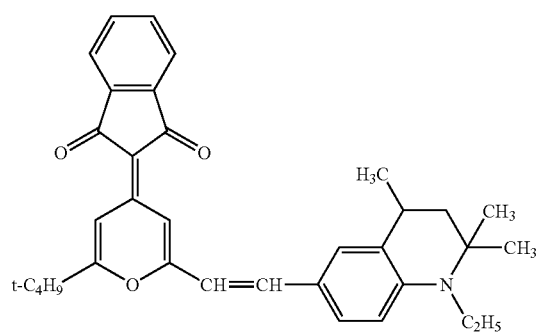
(D-64)
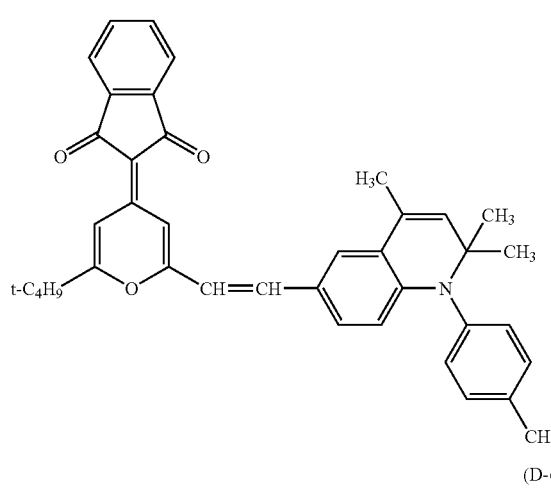
(D-65)
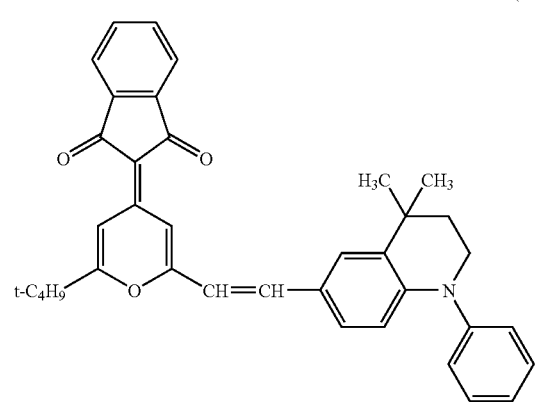
(D-66)
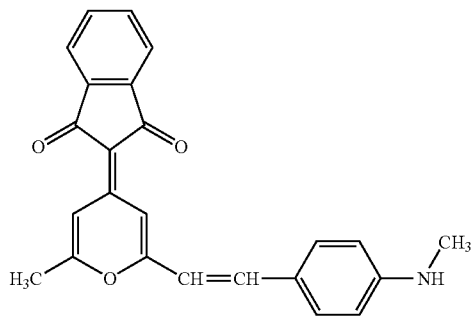
(D-67)
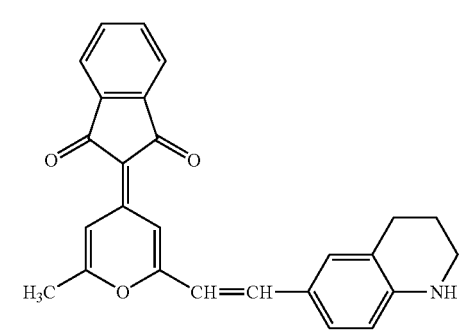
(D-68)
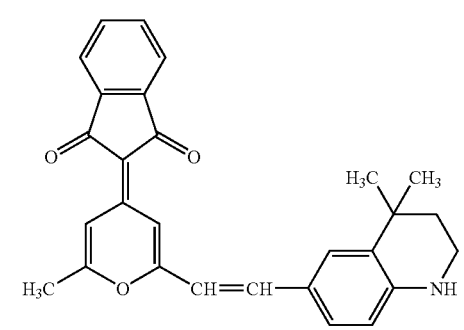
(D-69)
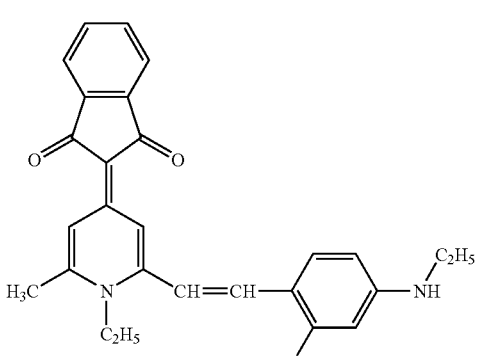
(D-70)
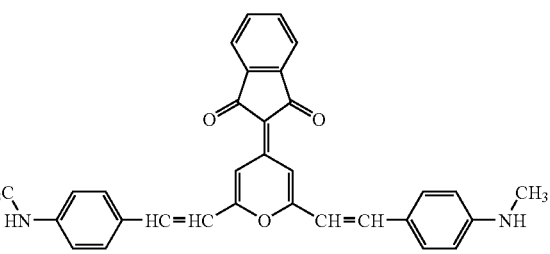

(D-71)
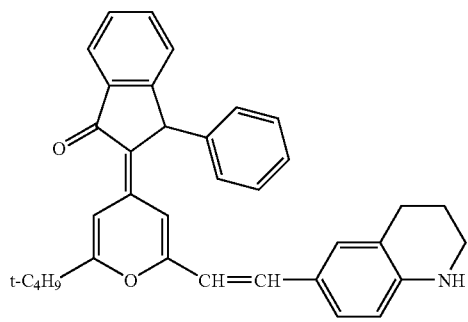
(D-72)
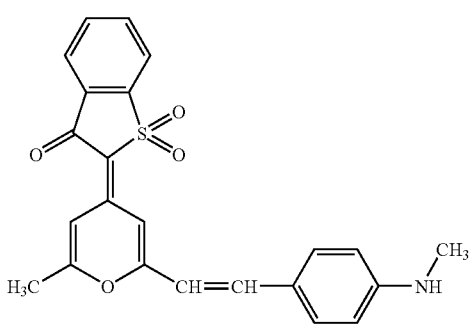
(D-73)
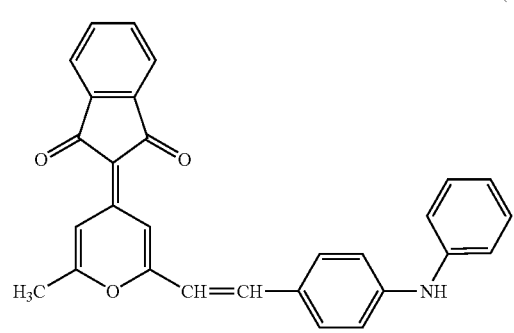
(D-74)
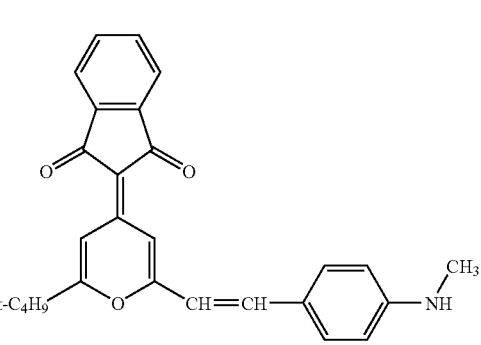
(D-75)
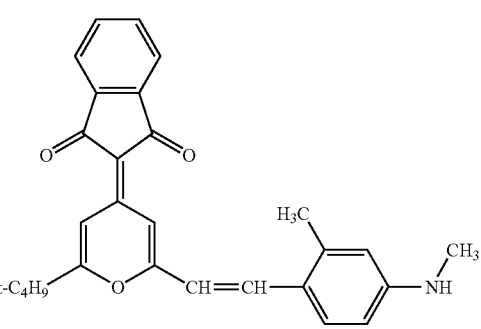
(D-76)
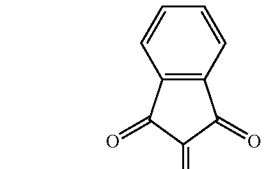
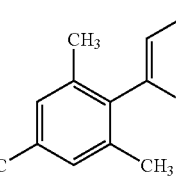
(D-77)
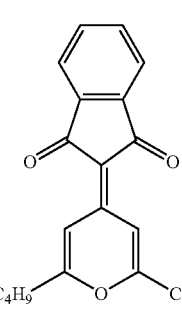
(D-78)
(D-79)
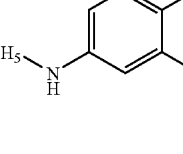
(D-80)
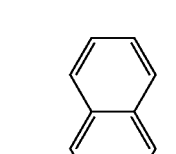

(D-81)
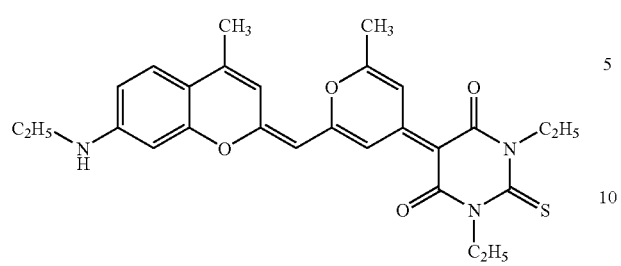
(D-82)
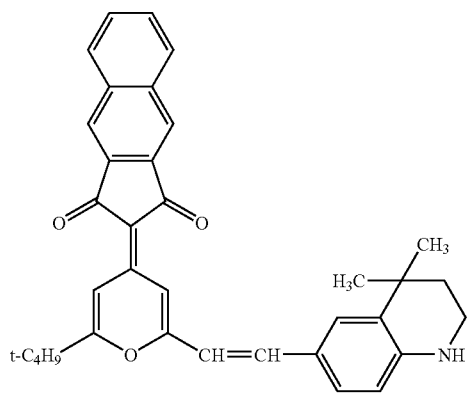
(D-83)
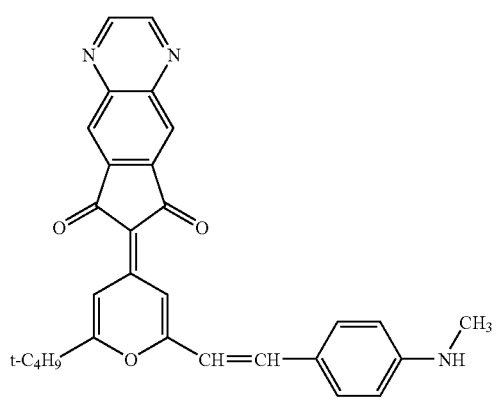
(D-84)
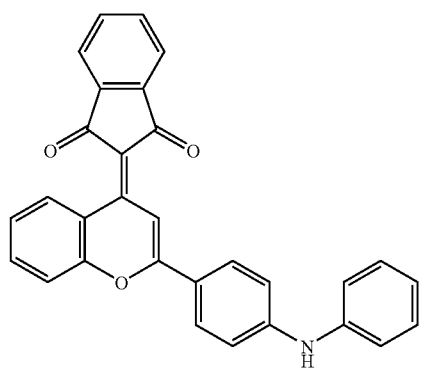
(D-85)
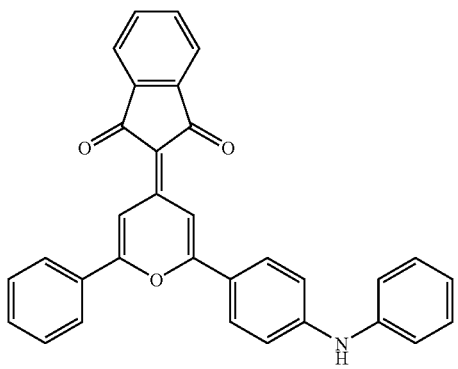
(D-86)
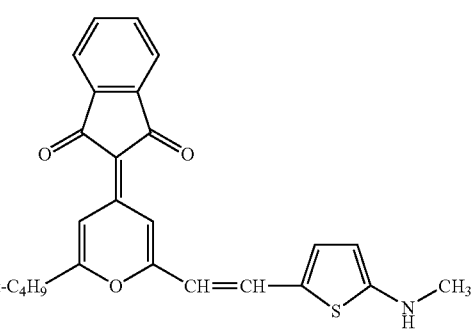
(D-87)
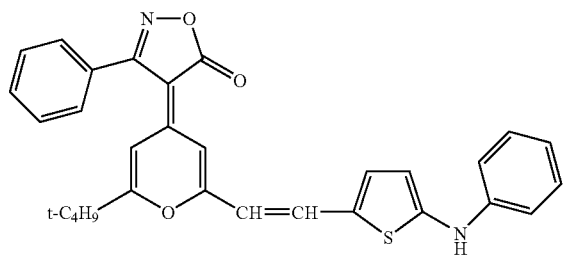
(D-88)
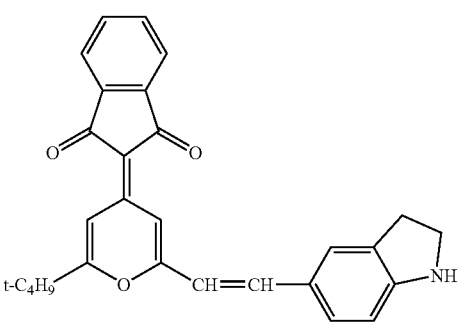
(D-89)
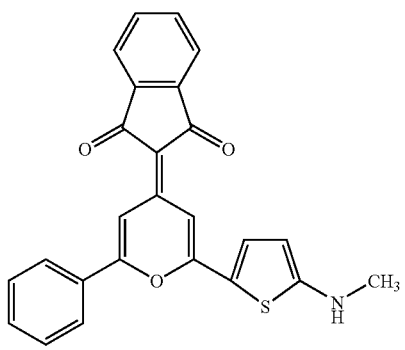

-continued
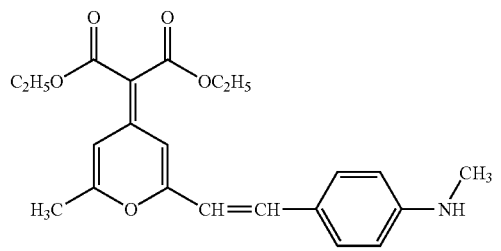
(D-90)
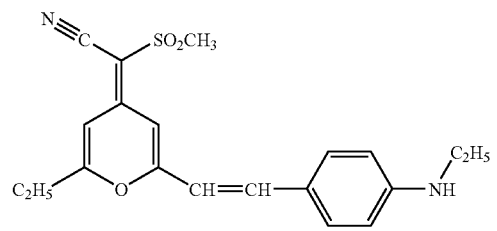
(D-91)
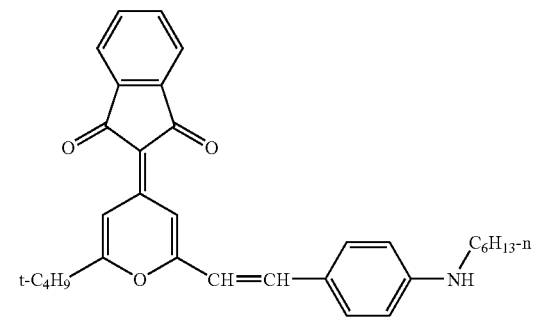
(D-92)
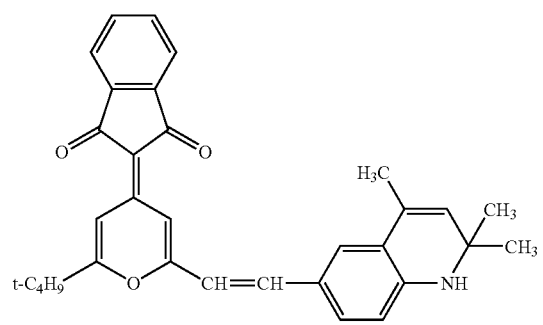
(D-93)
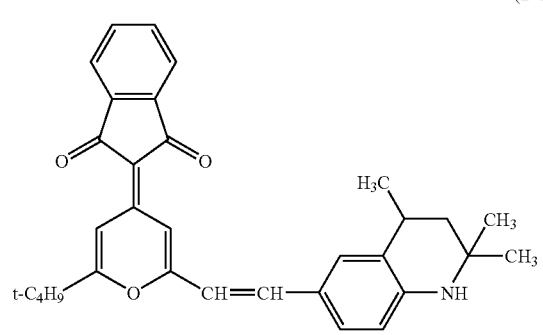
(D-94)
-continued
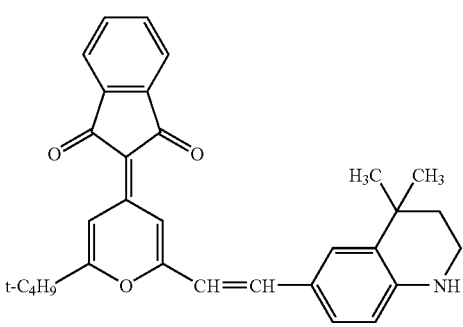
(D-95)
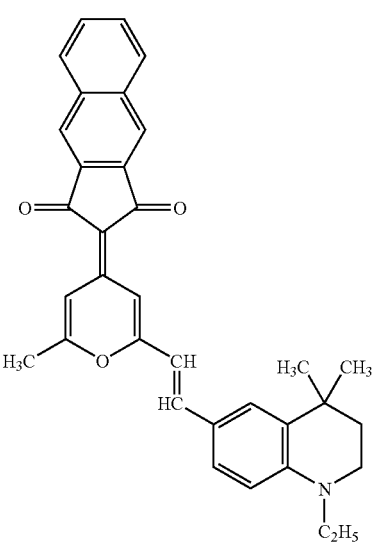
(D-96)
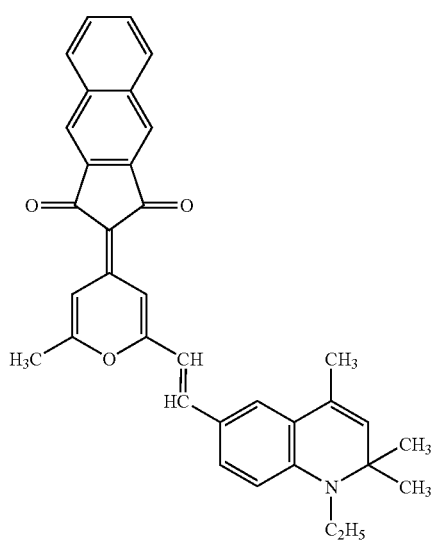
(D-97)

(D-98)

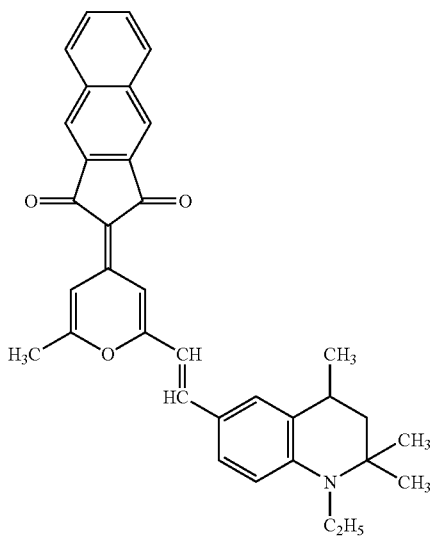

(D-99)

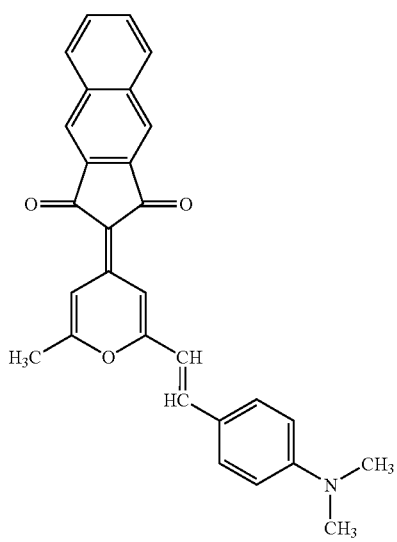

(D-100)

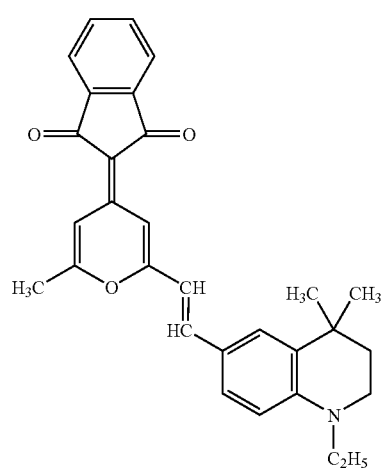

(D-101)

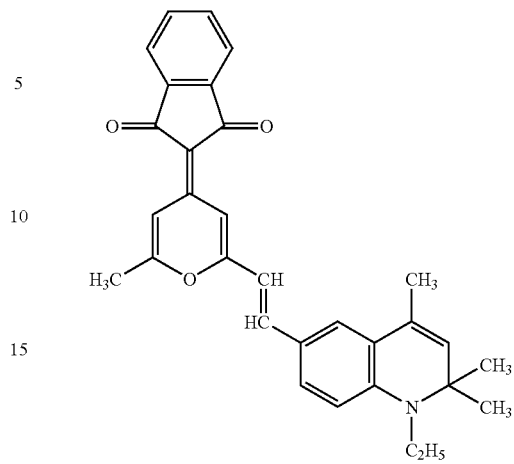

(D-102)

Compounds represented by formula (I) can be synthesized according to various synthesizing processes. For example, there can be applied a process of formylating the aryl group of a disubstituted aniline structure, then reacting with an active methylene compound in the presence or absence of a base. Such synthesis can be performed by reference to processes described in, for example, JP-A-11-335661, JP-A-11-292875, JP-A-11-335368, JP-A-2000-351774, and JP-A-2001-81451.

Next, exemplary embodiments of the invention will be described below by reference to drawings.

The compounds represented by formula (I) are preferably contained in the following photoelectric conversion layer. Exemplary embodiments of other materials than the compounds represented by formula (I) to be used in the photoelectric conversion layer including this photoelectric conversion layer, constituting elements such as other layers to be used in the photoelectric conversion element including the photoelectric conversion layer, and an imaging device including the photoelectric conversion element will be described below.

Embodiments (first to sixth embodiments) capable of providing a photoelectric conversion element which can suppress injection of charge carriers (electrons and holes) from electrodes into a photoelectric conversion layer to thereby effectively reduce dark current will be described below.

In these embodiments of photoelectric conversion elements each having a pair of electrodes and a photoelectric conversion layer disposed between the pair of electrodes, a first charge blocking layer capable of suppressing injection of charge from one of the pair of electrodes into the photoelectric conversion layer is provided between the one of the pair of electrodes and the photoelectric conversion layer, with the first charge blocking layer being constituted by plural layers so as to more suppress dark current than in the case where the first charge blocking layer is constituted by one layer. Further, in the constitution where a second charge blocking layer capable of suppressing injection of charge carriers from the other of the pair of electrodes into the photoelectric conversion layer is provided between the other of the pair of the electrodes and the photoelectric conversion layer, dark current can be more suppressed by making the second charge blocking layer from plural layers than in the constitution where the second charge blocking layer is constituted by one layer. Further, the dark current-suppressing effect can be more enhanced when at least two of the plural layers constituting the first charge blocking layer and at least two of the plural layers constituting the second charge blocking layer comprise different materials from each other. Still further, the dark current-suppressing effect can be much more enhanced when at least two of the plural layers are a layer comprising an inorganic material and a layer comprising an organic material, respectively. Specific constitutions of the charge blocking layers will be described in the following first to sixth embodiments.

(First Embodiment)

FIG. 1 is a cross-sectional schematic view showing a constitution of the photoelectric conversion element having the charge blocking layer of this embodiment.

In FIG. 1, reference numeral 200 designates a photoelectric conversion layer, 202 designates a charge blocking layer of two-layer structure, 202a and 202b designate layers constituting the charge blocking layer 202, and 201 and 204 each designates an electrode.

For example, when the electrode 204 serves as an electrode on the light incident side, the electrode 204 is preferably constituted by a material having a high transparency since it is necessary to introduce light into the photoelectric conversion layer 200 through the electrode. As an electrode having a high transparency, there is illustrated a transparent conductive oxide (TCO). Also, preferably, the electrode 201 is likewise constituted by a material having a high transparency since, as will be seen in the constitution of the imaging device to be described hereinafter, there exists the case where it is necessary to transmit light in the downward direction. Also, when the electrode 201 serves as an electrode on the light incident side, it is preferred that both of the electrodes 204 and 201 are constituted by a material having a high transparency.

The charge blocking layer 202 is a layer for suppressing transfer of charge carriers from the electrode 204 to the photoelectric conversion layer 200 when a voltage is applied across the electrode 201 and the electrode 204. When the charge blocking layer 202 is of a single layer structure, intermediate levels (an impurity level, etc.) exists in the material itself constituting the charge blocking layer 202, and transfer of charge carriers (electrons, holes) occurs via the intermediate levels, resulting in an increase in dark current. Therefore, in this embodiment, the charge blocking layer 202 is constituted not as a single layer structure but as a two-layer structure in order to prevent this transfer of charge carriers.

It may be attributed to that, by formation of the interface between the layers 202a and 202b constituting the charge blocking layer 202, there arises discontinuity in the intermediate levels existing in the individual layers of 202a and 202b and, as a result, transfer of carrier via the intermediate levels becomes difficult, thus dark current being suppressed. However, in case when the layers 202a and 202b are formed of the same material, there might be the case where the intermediate levels in the layer 202a and the intermediate levels in the layer 202b are absolutely the same. Therefore, in order to more enhance the dark current-suppressing effect, it is preferred to constitute the layers 202a and 202b by different materials from each other.

FIGS. 2(a) and 2 are energy diagrams showing the state of the intermediate levels in the two-layer structured charge blocking layer shown in FIG. 1, wherein FIG. 2(a) shows a case in which the layer 202a and the layer 202b are made of the same material, and FIG. 2(b) shows a case in which the layer 202a and the layer 202b are made of different materials from each other.

In the case when the layer 202a and the layer 202b are made of the same material, dark current can be reduced in comparison with the single layer structure due to formation of the interface as is described above. However, as is shown in FIG. 2(a), when the intermediate levels of the layer 202a and those of the layer 202b (S1, S2) are at about the same energy levels, there occurs transfer of charge carriers (shown by the arrow in FIG. 2(a)) via the intermediate levels of layers 202a and 202b.

Here, when the layers 202a and 202b are made of different materials from each other, for example, the intermediate levels (S20) of the layer 202b are at higher energy levels than the intermediate levels (S10) of the layer 202a as is seen in FIG. 2(b) and, therefore, the difference in energy level functions as a barrier and suppresses transfer of charge carriers in proportion to the difference. Thus, by forming the two layers constituting the charge blocking layer 202 from different materials from each other, positions of the intermediate levels of the two layers can surely be dispersed, which serves to enhance the effect of suppressing transfer of carrier via the intermediate levels.

FIG. 1 shows an example wherein the photoelectric conversion element has one charge blocking layer. However, in the case of providing a charge blocking layer between the electrode 201 and the photoelectric conversion layer 200 shown in FIG. 1 for suppressing transfer of charge carriers from the electrode 201 into the photoelectric conversion layer 200 when a voltage is applied across the electrode 201 and the electrode 204, dark current can be suppressed as well by forming the charge blocking layer as two-layer structure.

In the above description, an example is shown wherein the charge blocking layer 202 is of a two-layer structure. However, the charge blocking layer 202 may be of a structure of three or more layers. In such cases, it suffices that at least two of the layers constituting the charge blocking layer are made of different materials from each other in order to surely form difference in intermediate level within the charge blocking layer as described above. For example, in the case of forming a charge blocking layer of three-layer structure, it suffices to make the lowermost layer and the uppermost layer of a material A and make the intermediate layer there between of a material B which is different from the material A, as shown in FIG. 3(a). Or, as is shown in FIG. 3(b), the lowermost layer may be made of the material B, and the intermediate layer and the uppermost layer may be made of the material A. Or, as is shown in FIG. 3(c), the lowermost layer and the intermediate layer may be made of the material A, and the uppermost layer may be made of the material B. Or again, as is shown in FIG. 3(d), the lowermost layer may be made of a material C which is different from the materials A and B, the intermediate layer may be made of the material B, and the uppermost layer may be made of the material A.

Figure 4:
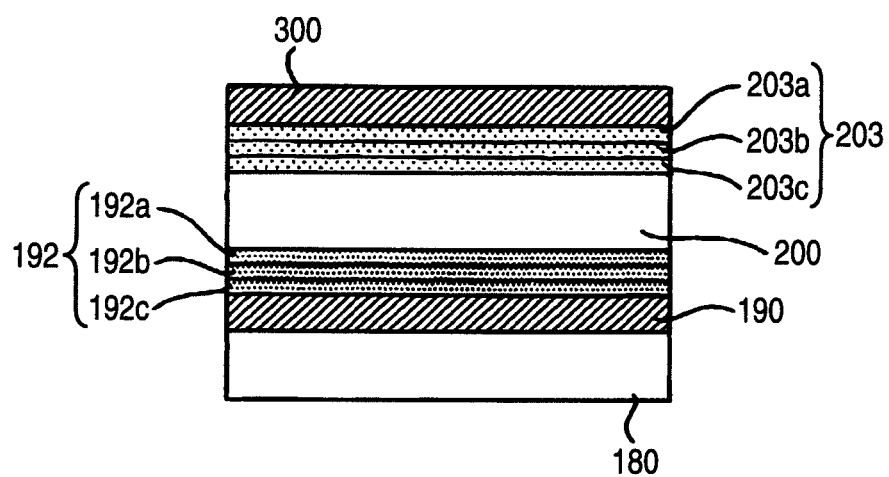
FIG. 4 is a schematic cross-sectional view of a photoelectric conversion element having an electron blocking layer of three-layer structure and a hole blocking layer of three-layer structure.
Figure 5:
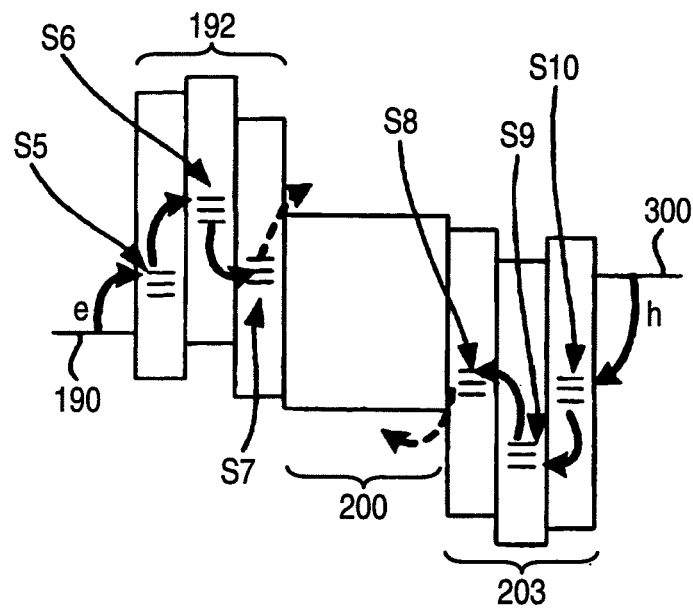
FIG. 5 is an energy diagram for illustrating a manner of carrier transfer via the intermediate levels of the charge blocking layer upon applying a voltage to the photoelectric conversion element of FIG. 4.

FIG. 4 is a cross-sectional view showing another example of the photoelectric conversion element of this embodiment (photoelectric conversion element having a n electron blocking layer of three-layer structure and a hole blocking layer of three-layer structure). FIG. 5 is an energy diagram for illustrating progress of transfer of charge carriers via intermediate levels of the electron blocking layer and the hole blocking layer when a voltage is applied to the photoelectric conversion element shown in FIG. 4.

The photoelectric conversion element of FIG. 4 has a structure wherein a pixel electrode (transparent electrode) 190 is provided on a transparent substrate 180, and an electron blocking layer 192 of three-layer structure (having a structure wherein layers 192a to 192c are stacked), a photoelectric conversion layer 200, and a hole blocking layer 203 (having a structure wherein layers 203a to 203c are stacked) are stacked in this order on the transparent electrode 190 and, further, an opposed electrode 300 is provided thereon. Of the layers 192a to 192c, at least two layers comprise different materials from each other. Here, individual layers 192a to 192c comprise different materials from each other. Likewise, of the layers 203a to 203c, at least two layers comprise different materials from each other. Here, individual layers 203a to 203c comprise different materials from each other.

As is shown in FIG. 5, such constitution provides different energy levels of the intermediate levels (S5, S6, S7) of the layers in the electron blocking layer 192 upon application of a voltage, and the difference functions as an energy barrier, thus transfer of electrons becoming difficult. Likewise, the energy levels of the intermediate levels (S8, S9, S10) of the layers in the hole blocking layer 203 are different, and the difference functions as an energy barrier to make transfer of holes difficult.

Next, other effects of constituting the blocking layer as having a plural-layer structure than the effect with respect to intermediate level will be described below.

The technique having so far been described of shifting the intermediate levels existing in the individual layers by stacking them suppresses dark current by "inhibiting transportation of injected charge". In addition, the technique of forming the blocking layer by stacking plural layers has the effect of reducing dark current by "suppressing injection of charge from the electrode".

In order to suppress injection of charge from the electrode, it is of importance "to enlarge the energy barrier between the electrode and the layer adjacent thereto" and "to make the blocking layer homogeneous so as not to allow the electrode to be in the vicinity of the layer (photoelectric conversion layer) under the blocking layer.

The former is a solution technique of providing a energetic barrier against injection, and the latter is a solution technique of preventing, through physical structure, an electrode-constituting material from entering into fine defects of the layer, which brings the photoelectric conversion layer close to the electrode to form leak positions.

When the blocking layer is formed as having a plural-layer structure, the layer in contact with the electrode, among the plural layers, can be selected so as to establish an energy barrier difference from the electrode, and the layer not in contact with the electrode can be formed as a layer which has a charge-transporting ability and is enough homogeneous to avoid generation of leak positions, thus each layer separately performing the functions.

As a result of intensive investigations from this point of view, the inventors have found that dark current can be more markedly suppressed without inhibiting readout of signal charge by using an inorganic material layer comprising an inorganic material as a blocking layer in contact with the electrode and by using an organic material layer comprising an organic material as a blocking layer under the inorganic layer (i.e., between the inorganic layer and the photoelectric conversion layer).

That is, the inventors have found that dark current can be more markedly suppressed without inhibiting readout of signal charge by forming, in FIG. 1, the layer 202a as an inorganic material layer and the layer 202b as an organic material layer, by forming, in FIGS. 3(b) and 3(d), A as an inorganic material layer and B as an organic material layer, by forming, in FIG. 3(c), B as an inorganic material layer and A as an organic material layer, or by forming, in FIG. 4, 192c and 203a as inorganic material layers and 192a, 192b, 203b, and 203c as organic material layers.

As inorganic materials for constituting the inorganic material layer, use of any one of Si, Mo, Ce, Li, Hf, Ta, Al, Ti, Zn, W, and Zr is preferred. Or, as the inorganic material, use of an oxide is preferred. As the oxide, SiO is particularly preferred to use.

In order to prevent injection of charge from the electrode, the inorganic material layer is required to have an enough ionization energy Ip to generate energy barrier between the layer and the work function of the adjacent electrode, and an inorganic material layer having a larger Ip is more desired. However, when the charge blocking layer comprises only this inorganic material layer, leak positions will be generated between the electrode and the photoelectric conversion layer if the thickness of the charge blocking layer is small, thus sufficient injection-preventing effect not being obtained, whereas charge-transporting ability will be reduced if the thickness of the charge blocking layer is large, thus readout of signal charge becoming difficult.

Thus, it is of importance to provide, in addition to this inorganic material layer, an organic material layer under the inorganic material layer. Preferably, the organic material layer is a layer which has enough charge-transporting ability to transport signal charge generated in the photoelectric conversion layer and is a homogeneous layer, and is made of a material having only a small amount of carriers which can be the cause of dark current generated from the material.

Such organic material layer serves to form a homogeneous and thick blocking layer without increasing dark current resulting from the blocking layer and without reducing the photoelectric conversion efficiency, and it becomes possible to suppress dark current together with the effect of the inorganic material layer.

Next, candidates for the organic materials constituting the hole blocking layer and the electron blocking layer will be described below.

(Hole Blocking Layer)

Electron-accepting organic materials can be used for the hole blocking layer.

As the electron-accepting materials, oxadiazole derivatives such as 1,3-bis(4-tert-butylphenyl-1,3,4-oxadiazolyl) phenylene (OXD-7), anthraquinodimethane derivatives, diphenylquinone derivatives, bathocuproine, bathophenanthroline, and derivatives thereof, triazole compounds, tris(8-hydroxyquinolinato)aluminum complex, bis(4-methyl-8-quinolinato)aluminum complex, distyrylarylene derivatives, silole compounds, etc. can be used. Also, materials which are not electron-accepting organic materials can be used as long as they have sufficient electron-transporting properties. Porphyrin compounds, styryl compounds such as DCM (4-dicyanomethylene-2-methyl-6-(4-(dimethylaminostyryl))-4H-pyrane), and 4H-pyran can be used.

The thickness of the hole blocking layer is preferably from 10 nm to 200 nm, more preferably from 30 nm to 150 nm, particularly preferably from 50 nm to 100 nm. Because, when this thickness is too small, there results decreased dark current-suppressing effect whereas, when too large, there results decreased photoelectric conversion efficiency.

As candidates for the hole blocking materials, there are specifically illustrated materials shown by the following HB-1 to HB-5, and BCP. Ea stands for the electron affinity of the material, and 1p stands for the ionization potential of the material.

HB-1:

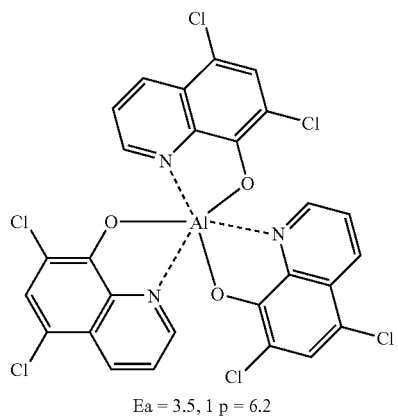

Ea = 3.5, 1 p = 6.2

HB-2:

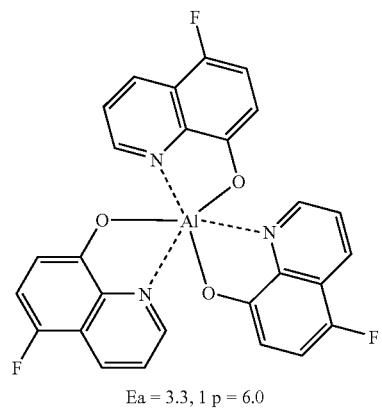

Ea = 3.3, 1 p = 6.0

HB-3:

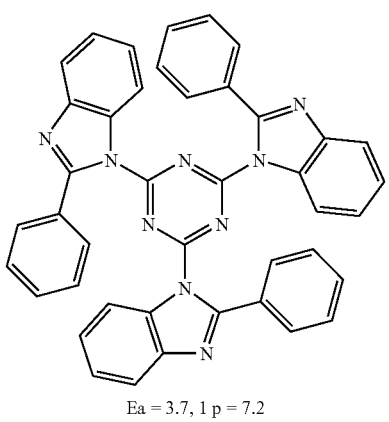

Ea = 3.7, 1 p = 7.2

HB-4:

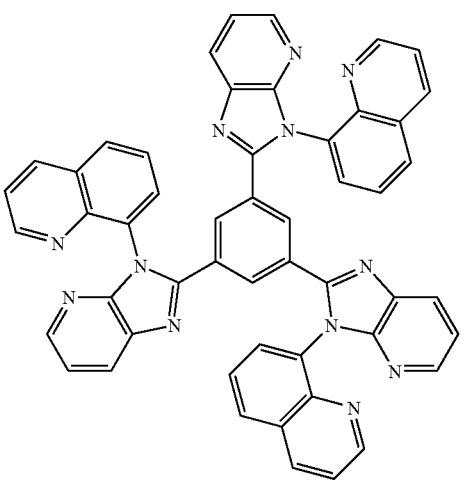

Ea = 3.6, 1 p = 7.6

HB-5:

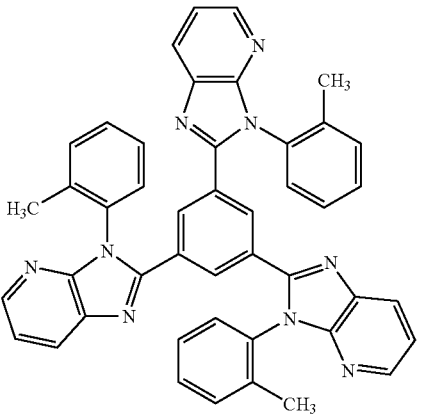

Ea = 3.6, 1 p = 7.6

BCP:

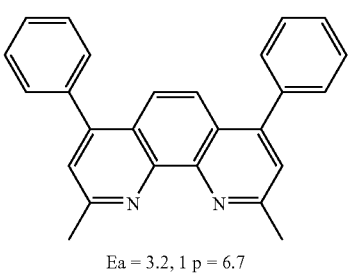

Ea = 3.2, 1 p = 6.7

A choice range of the materials to be actually used for the hole blocking layer is restricted by the material of the adjacent electrode and the material of the adjacent photoelectric conversion layer. Materials having an ionization potential (Ip) larger than the work function (Wf) of the material of the adjacent electrode by 1.3 eV or more and having the electron affinity (Ea) equal to or more than the Ea of the material of the adjacent photoelectric conversion layer are appropriate.

(Electron Blocking Layer)

Electron donative organic materials can be used for the electron blocking layer. Specifically, low-molecular materials such as aromatic diamine compounds (e.g., N,N'-bis(3-methylphenyl)-(1,1'-biphenyl)-4,4'-diamine (TPD) and 4,4'-bis[N-(naphthyl)-N-phenyl-amino]biphenyl(α-NPD)), oxazole, oxadiazole, triazole, imidazole, imidazolone, stilbene derivatives, pyrazoline derivatives, tetrahydroimidazole, polyarylalkane, butadiene, 4,4',4"-tris(N-(3-methylphenyl)-N-phenylamino)triphenylamine (m-MTDATA), porphyrin compounds (e.g., porphine, tetraphenylporphine copper, phthalocyanine, and copper phthalocyanine, titanium phthalocyanine oxide), triazole derivatives, oxadiazole derivatives, imidazole derivatives, polyarylalkane derivatives, pyrazoline derivatives, pyrazolone derivatives, phenylenediamine derivatives, anylamine derivatives, amino-substituted chalcone derivatives, oxazole derivatives, styrylanthracene derivatives, fluorenone derivatives, hydrazone derivatives, and silazane derivatives; and high-molecular materials such as polymers of phenylenevinylene, fluorene, carbazole, indole, pyrene, pyrrole, picoline, thiophene, acetylene, and diacetylene and derivatives thereof can be used. Materials which are not electron donative compounds can be used as long as they have sufficient hole-transporting properties.

The thickness of the electron blocking layer is preferably from 10 nm to 200 nm, more preferably from 30 nm to 150 nm, particularly preferably from 50 nm to 100 nm. Because, when this thickness is too small, there results decreased dark current-suppressing effect whereas, when too large, there results decreased photoelectric conversion efficiency.

As candidates for the electron blocking materials, there are specifically illustrated materials shown by the following EB-1 to EB-5, TPD, and m-MTDATA.

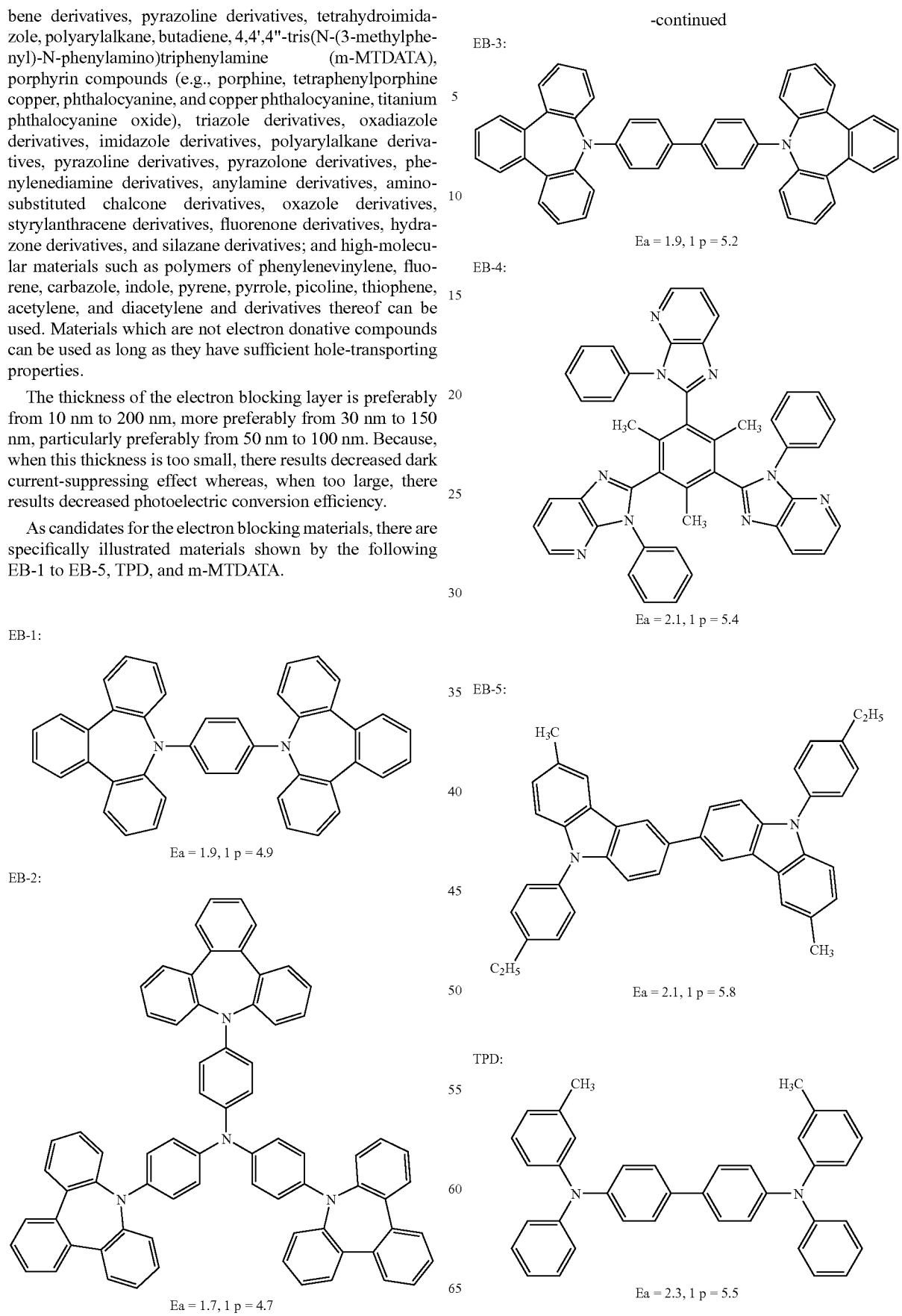

m-MTDATA:

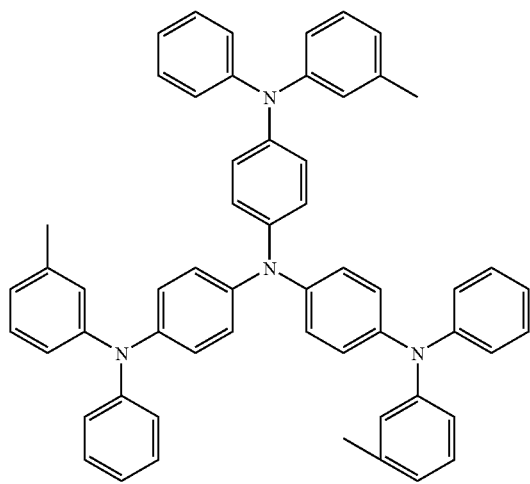

Ea = 1.9, 1p = 5.1

A choice range of the materials to be actually used for the electron blocking layer is restricted by the material of the adjacent electrode and the material of the adjacent photoelectric conversion layer. Materials having an electron affinity (Ea) larger than the work function (Wf) of the material of the adjacent electrode by 1.3 eV or more and having the ionization potential (Ip) equal to or more than the Ip of the material of the adjacent photoelectric conversion layer are appropriate.

According to this embodiment, injection of carrier from the electrode into the photoelectric conversion layer upon application of an external electric field can be suppressed by providing not a single-layer charge blocking layer having conventionally been employed but a blocking layer of the plural-layer structure, thus the photocurrent/dark current ratio of the photoelectric conversion element being remarkably improved.

(Second Embodiment)

In this embodiment, a specific example of a photoelectric conversion element having a charge blocking layer of the plural-layer structure will be described by reference to FIGS. 6 to 11.

The charge blocking layer includes "a hole blocking layer" which has a large barrier for hole injection from the adjacent electrode and "an electron blocking layer" which has a large barrier for electron injection from the adjacent electrode a high ability of transporting holes which are a carrier of photocurrent. In organic light-emitting elements, a blocking layer using an organic material has already been used in order to prevent penetration of the carrier through a light-emitting layer, as is described in JP-A-11-339966 and JP-A-2002-329582. By sandwiching such organic blocking layer between the electrode and the photoelectric conversion layer in the photoelectric conversion portion, the photoelectric conversion efficiency and the response speed can be improved without reduction of the S/N ratio upon applying thereto an external voltage.

As materials to be used for the hole blocking layer, those materials are used which have an ionization potential equal to or higher than the work function of the material of the adjacent electrode and have an electron affinity equal to or more than the electron affinity of the material of the adjacent photoelectric conversion layer. As materials to be used for the electron blocking layer, those materials are used which have an electron affinity equal to or lower than the work function of the material of the adjacent electrode and have an ionization potential equal to or less than the ionization potential of the material of the adjacent photoelectric conversion layer. Specific examples are as described in the first embodiment.

The structure of the photoelectric conversion element containing the photoelectric conversion portion having such charge blocking layer will be described below.

First, a structure having a hole blocking layer will be described below.

Figure 6:
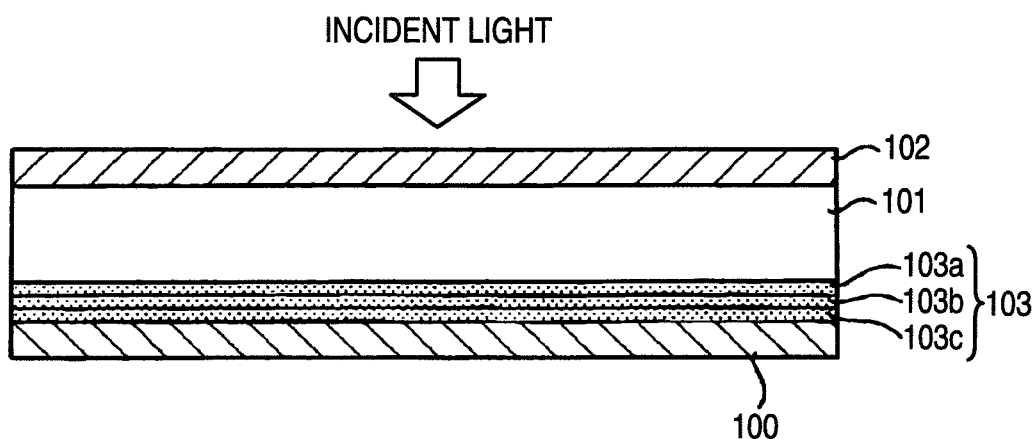
FIG. 6 is a schematic cross-sectional view showing a structure of a photoelectric conversion element according to an exemplary embodiment of the invention.

FIG. 6 is a cross-sectional view schematically showing the structure of the photoelectric conversion element of this embodiment.

The photoelectric conversion element shown in FIG. 6 has a structure containing the photoelectric conversion portion which comprises a pair of opposed electrodes 100 and 102, a photoelectric conversion layer 101 formed between the electrodes 100 and 102, and a hole blocking layer 103 formed between the photoelectric conversion layer 101 and the electrode 100.

As is shown in FIG. 6, the hole blocking layer 103 has a three-layer structure wherein material layers 103a to 103c are stacked one over the other. As has been described hereinbefore, at least two of the material layers 103a to 103c preferably comprise different materials from each other. Also, it suffices that the hole blocking layer 103 has a plural-layer structure.

With the photoelectric conversion element shown in FIG. 6, light is to be introduced from above the electrode 102 and, therefore, the electrode 102 acts as an electrode on the light incident side. Also, with the photoelectric conversion element shown in FIG. 6, a voltage is to be applied across the electrodes 100 and 102 so that, of charge carriers (holes and electrons) generated in the photoelectric conversion layer 101, holes are allowed to migrate to the electrode 102 whereas electrons are allowed to migrate to the electrode 100 (namely, the electrode 100 being an electrode for taking out electrons).

As materials to be used for the hole blocking layer 103, those materials are used which have an ionization potential equal to or higher than the work function of the material of the adjacent electrode 100 and have an electron affinity equal to or more than the electron affinity of the material of the adjacent photoelectric conversion layer 101. By providing this hole blocking layer 103 between the electrode 100 and the photoelectric conversion layer 101, electrons generated in the photoelectric conversion layer 101 can be allowed to migrate to the electrode 100 and, at the same time, injection of holes from the electrode 100 into the photoelectric conversion layer can be suppressed, when a voltage is applied across the electrodes 100 and 102. In addition, the three-layer structure of the hole blocking layer 103 serves to enhance the effect of suppressing injection of holes from the electrode 100 into the photoelectric conversion layer 101 via the intermediate levels.

The entire thickness of the hole blocking layer 103 is most preferably from 10 nm to 200 nm. Because, when the thickness is too large, the external quantum efficiency is decreased, though blocking properties are improved, since it is necessary to allow electrons generated in the photoelectric conversion layer 101 to migrate to the electrode 100.

Also, the value obtained by dividing the voltage to be applied across the electrodes 100 and 102 from outside by the sum of the thickness of the hole blocking layer 103 and the thickness of the photoelectric conversion layer 101 (corresponding to the distance between the electrode 100 and the electrode 102) is preferably from $1.0 \times 10^5$ V/cm to $1.0 \times 10^7$ V/cm.

Also, since light must be introduced into the photoelectric conversion layer 101 of the photoelectric conversion element shown in FIG. 6, the electrode 102 is preferably a transparent electrode. The term "transparent" as used herein means that 80% or more of visible light of from about 420 nm to about 660 nm in wavelength can be transmitted.

Preferably, the electrode 100 in the photoelectric conversion element shown in FIG. 6 is also a transparent electrode since, as will be described hereinafter, there exists the case where it is necessary to transmit light to under the electrode 100, with the hole blocking layer 103 being preferably transparent.

Figure 7:
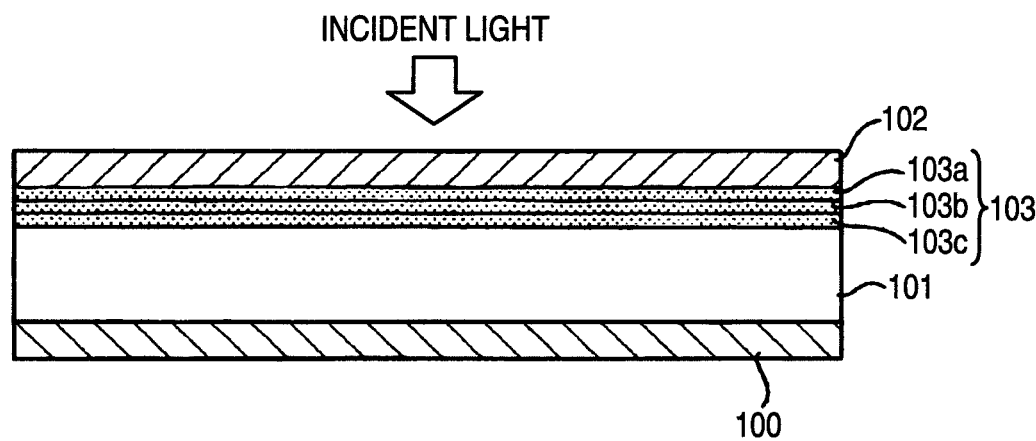
FIG. 7 is a schematic cross-sectional view showing a modified example of the photoelectric conversion element shown in FIG. 6.

FIG. 7 is a cross-sectional view showing a modified example of the photoelectric conversion element of the structure shown in FIG. 6. It suffices that, in the photoelectric conversion element shown in FIG. 6, a hole blocking layer (having a three-layer structure in which material layers 103a to 103c are stacked) is provided between the electrode 102 and the photoelectric conversion layer 101 as shown in FIG. 7 so that, of the charge carriers (holes and electrons) generated in the photoelectric conversion layer 101, electrons are allowed to migrate to the electrode 102 whereas holes are allowed to migrate to the electrode 100 when a voltage is to be applied across the electrodes 100 and 102. In this case, the hole blocking layer 103 must be transparent. Such structure can suppress dark current.

Additionally, dark current can be more markedly suppressed while preventing inhibition of readout of signal charge, as described above, by constituting a structure wherein an inorganic material layer is disposed at the interface with an electrode and an organic material layer is disposed between the inorganic material layer and the photoelectric conversion layer, for example, by constituting in FIG. 6 the material layer 103c as a layer comprising an inorganic material and constituting each of the material layers 103a and 103b as a layer comprising an organic material; or by constituting in FIG. 7 the material layer 103a as a layer comprising an inorganic material and constituting each of the material layers 103b and 103c as a layer comprising an organic material.

Next, a constitution having an electron blocking layer will be described below.

Figure 8:
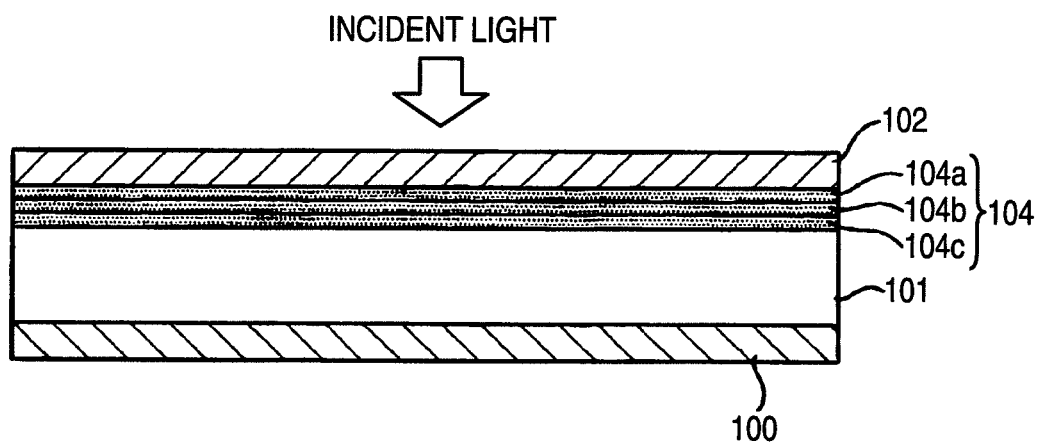
FIG. 8 is a schematic cross-sectional view showing a constitution of other example of the photoelectric conversion element.

FIG. 8 is a cross-sectional view schematically showing the structure of other example (an example having an electron blocking layer) of the photoelectric conversion element of this embodiment. In FIG. 8, the same constituent as in FIG. 6 is given the same reference number or sign.

The photoelectric conversion element shown in FIG. 8 has a structure containing a photoelectric conversion portion which comprises a pair of opposed electrodes 100 and 102, a photoelectric conversion layer 101 formed between the electrode 100 and the electrode 102, and an electron blocking layer 104 (having a three-layer structure wherein material layers 104a to 104c are stacked) formed between the photoelectric conversion layer 101 and the electrode 102. As is described above, at least two layers of the material layers 104a to 104c preferably comprises different materials from each other. It suffices that the electron blocking layer 104 has a plural-layer structure.

With the photoelectric conversion element shown in FIG. 8, light is to be introduced from above the electrode 102 and, therefore, the electrode 102 acts as an electrode on the light incident side. Also, with the photoelectric conversion element shown in FIG. 8, a voltage is to be applied across the electrodes 100 and 102 so that, of charge carriers (holes and electrons) generated in the photoelectric conversion layer 101, holes are allowed to migrate to the electrode 102 whereas electrons are allowed to migrate to the electrode 100 (namely, the electrode 100 being an electrode for taking out electrons).

As materials to be used for the electron blocking layer 104, those materials are used which have an electron affinity equal to or lower than the work function of the material of the adjacent electrode 102 and have an ionization potential equal to or less than the ionization potential of the material of the adjacent photoelectric conversion layer 101. By providing this electron blocking layer 104 between the electrode 102 and the photoelectric conversion layer 101, holes generated in the photoelectric conversion layer 101 can be allowed to migrate to the electrode 102 and, at the same time, injection of electrons from the electrode 102 into the photoelectric conversion layer can be suppressed, when a voltage is applied across the electrodes 100 and 102.

The thickness of the electron blocking layer 104 is most preferably from 10 nm to 200 nm. Because, when the thickness is too large, the external quantum efficiency is decreased, though blocking properties are improved, since it is necessary to allow holes generated in the photoelectric conversion layer 101 to migrate to the electrode 102.

Also, the value obtained by dividing the voltage to be applied across the electrodes 100 and 102 from outside by the sum of the thickness of the electron blocking layer 104 and the thickness of the photoelectric conversion layer 101 (corresponding to the distance between the electrode 100 and the electrode 102) is preferably from $1.0 \times 10^5$ V/cm to $1.0 \times 10^7$ V/cm.

Also, since light must be introduced into the photoelectric conversion layer 101 of the photoelectric conversion element shown in FIG. 8, the electrode 102 and the electron blocking layer 104 are preferably transparent.

Preferably, the electrode 100 in the photoelectric conversion element shown in FIG. 8 is also a transparent electrode since, as will be described hereinafter, there exists the case where it is necessary to transmit light to under the electrode 100.

Figure 9:
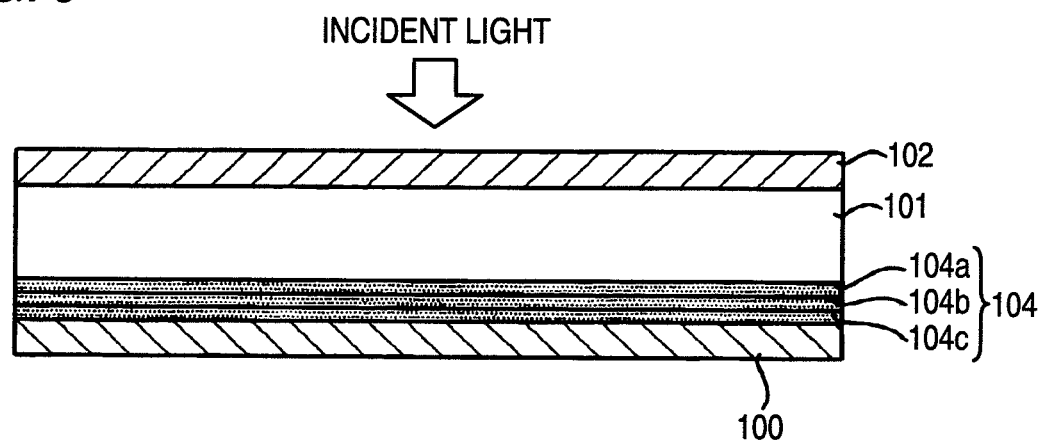
FIG. 9 is a cross-sectional view showing a modified example of the photoelectric conversion element shown in FIG. 8.

FIG. 9 is a cross-sectional view showing a modified example of the photoelectric conversion element of the structure shown in FIG. 8. It suffices that, in the photoelectric conversion element shown in FIG. 8, an electron blocking layer is provided between the electrode 100 and the photoelectric conversion layer 101 as shown in FIG. 9 so that, of the charge carriers (holes and electrons) generated in the photoelectric conversion layer 101, electrons are allowed to migrate to the electrode 102 whereas holes are allowed to migrate to the electrode 100 when a voltage is to be applied across the electrodes 100 and 102 (namely, the electrode 102 being an electrode for taking out electrons). Such structure can suppress dark current.

Additionally, dark current can be more markedly suppressed while preventing inhibition of readout of signal charge, as described above, by constituting a structure wherein an inorganic material layer is disposed at the interface with an electrode and an organic material layer is disposed between the inorganic material layer and the photoelectric conversion layer, for example, by constituting in FIG. 8 the material layer 104a as a layer comprising an inorganic material and constituting each of the material layers 104b and 104c as a layer comprising an organic material; or by constituting in FIG. 9 the material layer 104c as a layer comprising an inorganic material and constituting each of the material layers 104a and 104b as a layer comprising an organic material.

Next, a constitution which has an electron blocking layer and a hole blocking layer will be described below.

Figure 10:
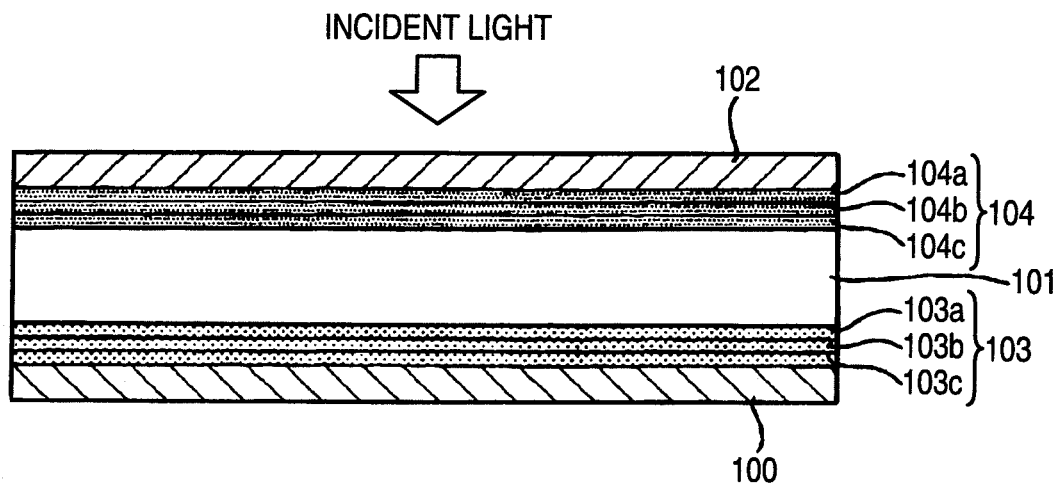
FIG. 10 is a schematic cross-sectional view showing a constitution of other example of the photoelectric conversion element of the embodiment of the invention.

FIG. 10 is a cross-sectional view schematically showing the structure of other example (an example having both an electron blocking layer and a hole blocking layer) of the photoelectric conversion element of this embodiment. In FIG. 10, the same constituent as in FIGS. 6 and 8 is given the same reference number or sign.

The photoelectric conversion element shown in FIG. 10 has a structure containing a photoelectric conversion portion which comprises a pair of opposed electrodes 100 and 102, a photoelectric conversion layer 101 formed between the electrode 100 and the electrode 102, a hole blocking layer 103 (103a to 103c) formed between the photoelectric conversion layer 101 and the electrode 100, and an electron blocking layer 104 (104a to 104c) formed between the photoelectric conversion layer 101 and the electrode 102.

With the photoelectric conversion element shown in FIG. 10, light is to be introduced from above the electrode 102 and, therefore, the electrode 102 acts as an electrode on the light incident side. Also, with the photoelectric conversion element shown in FIG. 10, a voltage is to be applied across the electrodes 100 and 102 so that, of charge carriers (holes and electrons) generated in the photoelectric conversion layer 101, holes are allowed to migrate to the electrode 102 whereas electrons are allowed to migrate to the electrode 100 (namely, the electrode 100 being an electrode for taking out electrons).

Also, the value obtained by dividing the voltage to be applied across the electrodes 100 and 102 from outside by the sum of the thickness of the hole blocking layer 103, the thickness of the electron blocking layer 104, and the thickness of the photoelectric conversion layer 101 (corresponding to the distance between the electrode 100 and the electrode 102) is preferably from $1.0 \times 10^5$ V/cm to $1.0 \times 10^7$ V/cm.

Such constitution can suppress injection of charge carriers from both of the electrodes 100 and 102, thus generation of dark current being effectively suppressed.

Figure 11:
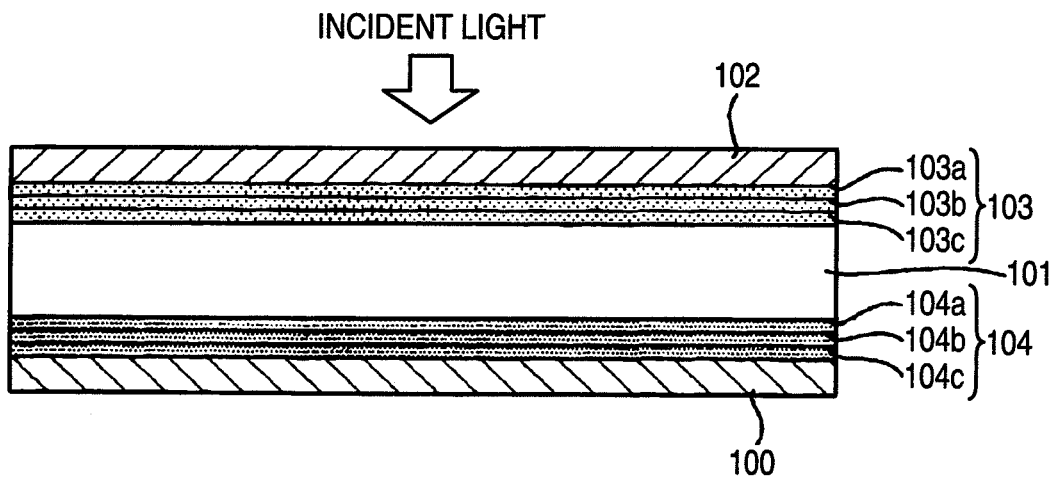
FIG. 11 is a schematic cross-sectional view showing a modified example of the photoelectric conversion element shown in FIG. 10.

FIG. 11 is a cross-sectional view showing a modified example of the photoelectric conversion element of the structure shown in FIG. 10. It suffices that, in the photoelectric conversion element shown in FIG. 10, an electron blocking layer 104 is provided between the electrode 100 and the photoelectric conversion layer 101 and the hole blocking layer 103 is provided between the electrode 100 and the photoelectric conversion layer 101 as shown in FIG. 11 so that, of the charge carriers (holes and electrons) generated in the photoelectric conversion layer 101, electrons are allowed to migrate to the electrode 102 whereas holes are allowed to migrate to the electrode 100 when a voltage is to be applied across the electrodes 100 and 102 (namely, the electrode 102 being an electrode for taking out electrons).

Such structure can suppress injection of charge carriers from both the electrode 100 and the electrode 102, thus generation of dark current being effectively suppressed.

(Third Embodiment)

An example of the constitution of an imaging device using the photoelectric conversion element of the structure shown in FIG. 11 will be described below. In the following descriptions, reference is made to FIGS. 12 to 16. In each drawing, both the hole blocking layer and the electron blocking layer have a plural-layer structure as is the same with the above-described embodiment. However, for drawing convenience, each blocking layer is not drawn as separate plural layers in FIG. 12 to 16.

Figure 12:
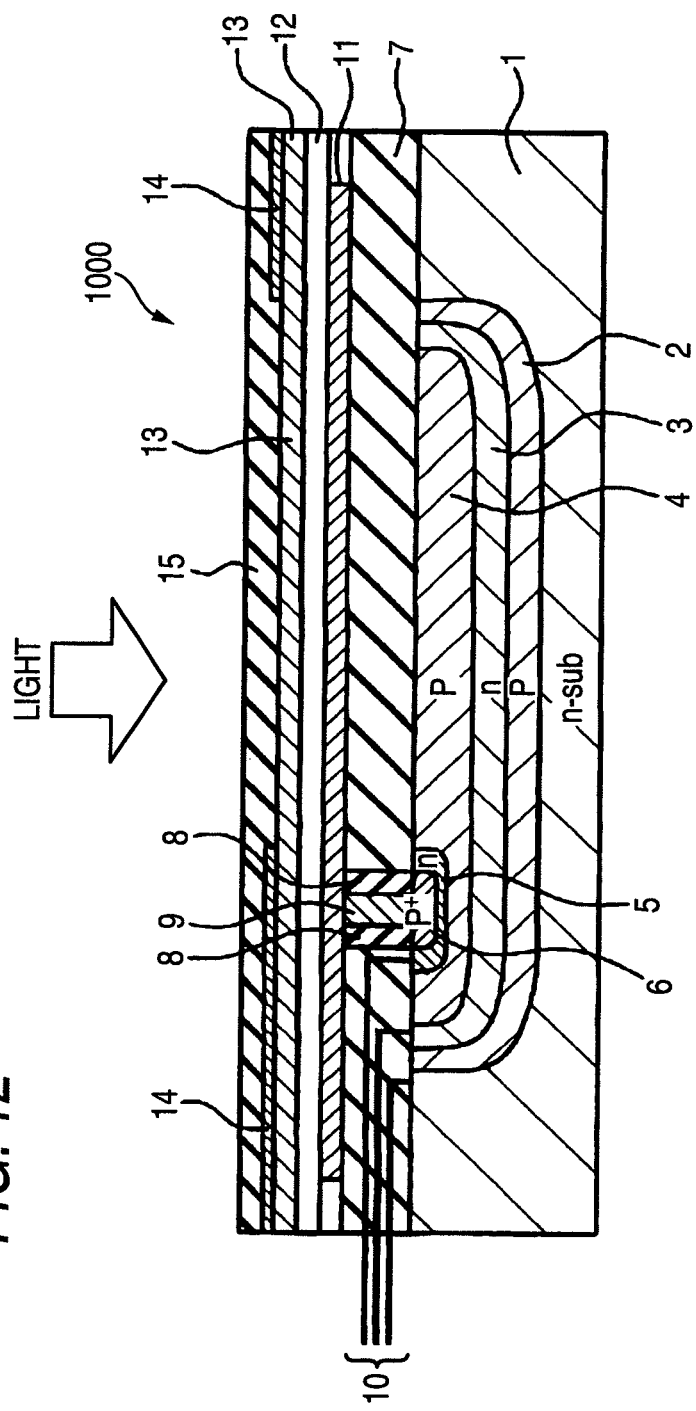
FIG. 12 is a schematic cross-sectional view showing one pixel of a solid-state imaging device for illustrating a third exemplary embodiment of the invention.
Figure 13:
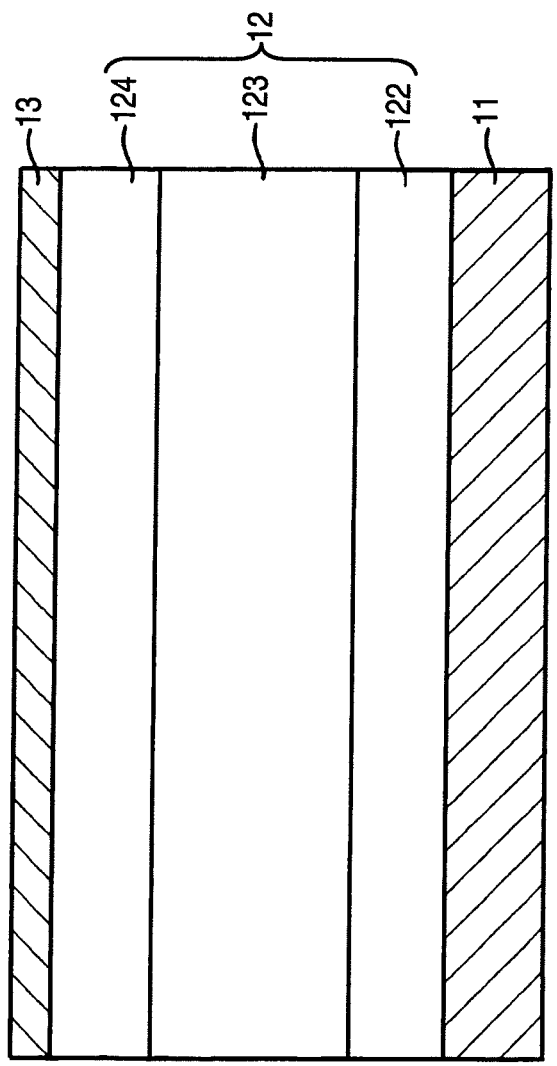
FIG. 13 is a schematic cross-sectional view of intermediate layer shown in FIG. 12.

FIG. 12 is a cross-sectional schematic view showing one pixel of a solid-state imaging device for illustrating the third embodiment of the invention. FIG. 13 is a cross-sectional schematic view of an intermediate layer shown in FIG. 12. In this solid-state imaging device, a number of pixels shown in FIG. 12 are arranged on the same plane in an array pattern, and data on one pixel of an image data can be generated by a signal obtained from the one pixel.

One pixel of the solid-state imaging device shown in FIG. 12 is constituted by including an n-type silicon substrate 1, a transparent insulating layer 7 formed on the n-type silicon substrate 1, and a photoelectric conversion portion comprising a first electrode 11 formed on the insulating layer 7, an intermediate layer 12 formed on the first electrode 11, and a second electrode 13 formed on the intermediate layer 12 and, on the photoelectric conversion portion, a light shielding layer 14 having an opening is formed. This light shielding layer 14 functions to restrict the light-receiving region of the intermediate layer 12. A transparent layer 15 is formed on the light shielding layer 14 and the second electrode layer 13. Additionally, the photoelectric conversion portion formed on the insulating layer 7 may have the constitution of the photoelectric conversion element described in the first embodiment and the second embodiment.

As is shown in FIG. 13, the intermediate layer 12 is constituted by stacking, on the first electrode layer 11, an undercoating and electron blocking layer 122, a photoelectric conversion layer 123, and a hole blocking and buffering layer 124 in this order. The electron blocking layer 122 and the hole blocking and buffering layer 124 are respectively constituted by plural layers as has been described in the first embodiment and the second embodiment.

The photoelectric conversion layer 123 is constituted by including a material which has such characteristics that charge carriers including electrons and holes are generated in proportion to the amount of incident light from above the second electrode 13, that the mobility of electrons is smaller than the mobility of holes, and that more electrons and more holes are generated in the vicinity of the second electrode layer 13 than in the vicinity of the first electrode layer 11. Typical examples of such photoelectric conversion layer are organic materials. In the constitution of FIG. 12, the photoelectric conversion layer 123 uses a material which absorbs green light and generates electrons and holes in proportion to the amount of absorbed green light. The photoelectric conversion layer 123 can be commonly used in all pixels, and hence it may be of a one-sheet structure, with separation of individual pixels from each other not being necessary.

As to the organic materials for constituting the photoelectric conversion layer 123, it is preferred that at least either of organic p-type semiconductor and organic n-type semiconductor. As the organic p-type semiconductor and the organic n-type semiconductor, any one of quinacridone derivatives, naphthalene derivatives, anthracene derivatives, phenanthrene derivatives, tetrhacene derivatives, pyrene derivatives, perylene derivatives, and fluoranthene derivatives can particularly preferably be used.

The organic p-type semiconductors (compounds) are donor organic semiconductors (compounds), are mainly represented by those organic compounds which transport holes, and are organic compounds having easily electron-donating properties. More particularly, when two organic compounds are used in contact with each other, the organic compound showing a smaller ionization potential is referred to as the organic p-type semiconductor. Therefore, any organic compound that has electron-donating properties can be used as the donor organic compound. For example, triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic hydrocarbon ring compounds (e.g., naphthalene derivatives, anthracene derivatives, phenanthrene derivatives, tethracene derivatives, pyrene derivatives, perylene derivatives, and fluoranthene derivatives), and metal complexes having as a ligand a nitrogen-containing hetero ring compound can be used. Additionally, these are not limitative and, as is described above, an organic compound having a smaller ionization potential than the organic compound used as an n-type (acceptor) compound may be used as the donor organic semiconductor.

The organic n-type semiconductors (compounds) are donor organic semiconductors (compounds), are mainly represented by those organic compounds which transport electrons, and are organic compounds having easily electron-accepting properties. More particularly, when two organic compounds are used in contact with each other, the organic compound showing a larger electron affinity is referred to as the organic n-type semiconductor. Therefore, any organic compound that has electron-accepting properties can be used as the acceptor organic compound. For example, condensed aromatic hydrocarbon ring compounds (e.g., naphthalene derivatives, anthracene derivatives, phenenthrene derivatives, thetracene derivatives, pyrene derivatives, perylene derivatives, and fluoranthene derivatives), 5- to 7-membered hetero ring compounds containing nitrogen atom, oxygen atom or sulfur atom (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrazolidine, pyrrolopyridine, thiadiazolopyridine, dibenzazepine, tribenzazepine, etc.), polyarylene compounds, fluorene compounds, cyclopentadiene compounds, silyl compounds, and metal complexes having as a ligand a nitrogen-containing hetero ring compound are illustrated. Additionally, these are not limitative and, as is described above, an organic compound having a larger electron affinity than the organic compound used as a donor organic compound may be used as the acceptor organic semiconductor.

As p-type organic dyes or n-type organic dyes, any dye may be used, but preferred examples thereof include cyanine dyes, styryl dyes, hemicyanine dyes, merocyanine dyes (including zero methine merocyanines (simple merocyanines)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squalium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugido dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, condensed aromatic hydrocarbon ring series dyes (naphthalene derivatives, anthracene derivatives, phenanthrene derivatives, tethracene derivatives, pyrene derivatives, perylene derivatives, and fluoranthene derivatives).

Next, the metal complex compounds will be described below. The metal complex compounds are metal complexes which have a ligand containing at least one nitrogen atom, oxygen atom or sulfur atom and coordinating to a metal. The metal ion in the metal complex is not particularly limited, but is preferably beryllium ion, magnesium ion, aluminum ion, gallium ion, zinc ion, indium ion, or tin ion, more preferably beryllium ion, aluminum ion, gallium ion, or zinc ion, still more preferably aluminum ion or zinc ion. As the ligand contained in the above-described metal complex, various publicly known ligands may be cited. For example, there are illustrated those ligands which are described in *Photochemistry and Photophysics of Coordination Compounds*, published by Springer-Verlag in 1987 and written by H. Yersin; and *Yuki Kinzoku Kagaku-Kiso to Oyo* published by Shokabo in 1982 and written by Akio Yamamoto.

The ligand is preferably a nitrogen-containing hetero ring ligand (containing preferably from 1 to 30 carbon atoms, more preferably from 2 to 20 carbon atoms, particularly preferably from 3 to 15 carbon atoms) and may be a monodentate ligand or a ligand having two or more coordinating sites. The ligand is preferably a bidentate ligand. Examples thereof include a pyridine ligand, a bipyridyl ligand, a quinolinol ligand, a hydroxyphenylazole ligand (e.g., a hydroxyphenylbenzimidazole ligand, a hydroxyphenylbenzoxazole ligand or a hydroxyphenylimidazole ligand), an alkoxy ligand (containing preferably from 1 to 30 carbon atoms, more preferably from 1 to 20 carbon atoms, particularly preferably from 1 to 10 carbon atoms, and being exemplified by methoxy, ethoxy, butoxy, and 2-ethylhexyloxy), an aryloxy ligand (containing preferably from 6 to 30 carbon atoms, more preferably from 6 to 20 carbon atoms, particularly preferably from 6 to 12 carbon atoms, and being exemplified by phenyloxy, 1-naphthyloxy, 2-naphthyloxy, 2,4,6-trimethylphenyloxy, and 4-biphenyloxy), a heteroaryloxy ligand (containing preferably from 1 to 30 carbon atoms, more preferably from 1 to 20 carbon atoms, particularly preferably from 1 to 12 carbon atoms, and being exemplified by pyridyloxy, pyrazyloxy, pyrimidyloxy, and quinolyloxy), an alkylthio ligand (containing preferably from 1 to 30 carbon atoms, more preferably from 1 to 20 carbon atoms, particularly preferably from 1 to 12 carbon atoms, and being exemplified by methylthio and ethylthio), an arylthio ligand (containing preferably from 6 to 30 carbon atoms, more preferably from 6 to 20 carbon atoms, particularly preferably from 6 to 12 carbon atoms, and being exemplified by phenylthio), a hetero ring-substituted thio ligand (containing preferably from 1 to 30 carbon atoms, more preferably from 1 to 20 carbon atoms, particularly preferably from 1 to 12 carbon atoms, and being exemplified by pyridylthio, 2-benzimidazolylthio, 2-benzoxazolylthio, and 2-benzothiazolylthio), or a siloxy ligand (containing preferably from 1 to 30 carbon atoms, more preferably from 3 to 25 carbon atoms, particularly preferably from 6 to 20 carbon atoms, and being exemplified by a triphenylsiloxy group, a triethoxysiloxy group, and a triisopropylsiloxy group), more preferably a nitrogen-containing hetero ring ligand, an aryloxy ligand, a heteroaryloxy ligand, or a siloxy ligand, sill more preferably a nitrogen-containing hetero ring ligand, an aryloxy ligand, or a siloxy ligand.

With the intermediate layer 12, the case is preferred wherein it has a p-type semiconductor layer and an n-type semiconductor layer, with at least one of the p-type semiconductor layer and the n-type semiconductor layer being an organic semiconductor, and a bulk heterojunction structure layer containing the p-type semiconductor and the n-type semiconductor as an interlayer between these semiconductor layers. In such case, by providing a bulk heterojunction structure in the intermediate layer 12, a drawback that the photoelectric conversion layer 123 has a short carrier diffusion length is compensated, thereby improving the photoelectric conversion efficiency of the photoelectric conversion layer 123. Additionally, the bulk heterojunction structure is described in detail in Japanese Patent Application No. 2004-080639.

Also, the case is preferred where a photoelectric conversion layer has a structure constituted by two or more repeating structures (tandem structures) of a pn junction layer formed of the p-type semiconductor layer and the n-type semiconductor layer; and the case is more preferred where a thin layer made of an conductive material is inserted between the foregoing repeating structures. The number of the repeating structure (tandem structure) of a pn junction layer is not limited. For the purpose of enhancing the photoelectric conversion efficiency, the number of the repeating structure (tandem structure) of a pn junction layer is preferably from 2 to 50, more preferably from 2 to 30, and especially preferably from 2 to 10. The conductive material is preferably silver or gold, most preferably silver. Additionally, the tandem structure is described in detail in Japanese Patent Application No. 2004-079930.

With the photoelectric conversion layer contained in the intermediate layer 12, the case is preferred wherein the photoelectric conversion layer has a layer of a p-type semiconductor and a layer of an n-type semiconductor (preferably a mixed or dispersed (bulk heterojunction structure) layer) and contains an orientation-controlled organic compound in at least one of the p-type semiconductor and the n-type semiconductor; and the case is more preferred wherein an orientation-controlled (orientation controllable) organic compound is contained in both the p-type semiconductor and the n-type semiconductor. As the organic compound, an organic compound having a π-conjugated electron is preferably used. The π-electron plane is not vertical to a substrate (electrode substrate) and is oriented at an angle close to parallel to the substrate as far as possible. The angle against the substrate is preferably 0° or more and not more than 80°, more preferably 0° or more and not more than 60°, still more preferably 0° or more and not more than 40°, yet more preferably 0° or more and not more than 20°, particularly preferably 0° or more and not more than 10°, most preferably 0° (namely, in parallel to the substrate). As described previously, it suffices that only a part of the layer of the orientation-controlled organic compound is contained over the whole of the intermediate layer 12. A proportion of the orientation-controlled portion to the whole of the intermediate layer 12 is preferably 10% or more, more preferably 30% or more, still more preferably 50% or more, yet more preferably 70% or more, particularly preferably 90% or more, most preferably 100%. In the photoelectric conversion layer, by controlling the orientation of the organic compound contained in the intermediate layer 12, the foregoing state compensates a drawback that the photoelectric conversion layer has a short carrier diffusion length, thereby improving the photoelectric conversion efficiency.

In the case where the orientation of an organic compound is controlled, it is more preferred that the heterojunction plane (for example, a pn junction plane) is not in parallel to a substrate. In this case, it is preferred that the heterojunction plane is not in parallel to the substrate (electrode substrate) but is oriented at an angle close to verticality to the substrate as far as possible. The angle to the substrate is preferably 10° or more and not more than 90°, more preferably 30° or more and not more than 90°, still more preferably 50° or more and not more than 90°, yet more preferably 70° or more and not more than 90°, particularly preferably 80° or more and not more than 90°, most preferably 90° (namely, vertical to the substrate). As described previously, it suffices that only a part of the layer of the heterojunction plane-controlled organic compound is contained over the whole of the intermediate layer 12. A proportion of the orientation-controlled portion to the whole of the intermediate layer 12 is preferably 10% or more, more preferably 30% or more, still more preferably 50% or more, yet more preferably 70% or more, particularly preferably 90% or more, most preferably 100%. In such case, the area of the heterojunction plane in the intermediate layer 12 increases and the amount of a carrier such as an electron generated on the interface, a hole, and a pair of an electron and a hole increases so that it is possible to improve the photoelectric conversion efficiency. In the photoelectric conversion layer in which the orientation of the organic compound on both the heterojunction plane and the π-electron plane is controlled, it is possible to improve especially the photoelectric conversion efficiency. These states are described in detail in Japanese Patent Application No. 2004-079931. From the standpoint of optical absorption, it is preferred that the layer thickness of the organic dye layer is as large as possible. However, taking into consideration a proportion which does not contribute to the charge separation, the layer thickness of the organic dye layer is preferably 30 nm or more and not more than 300 nm, more preferably 50 nm or more and not more than 250 nm, particularly preferably 80 nm or more and not more than 200 nm.

The intermediate layer 12 containing the organic compound is formed by a dry layer formation method or a wet layer formation method. Specific examples of the dry layer formation method include physical vapor phase epitaxy methods such as a vacuum vapor deposition method, a sputtering method, an ion plating method, and an MBE method and CVD methods such as plasma polymerization. Examples of the wet layer formation method include a casting method, a spin coating method, a dipping method, and an LB method.

In the case of using a high molecular compound as at least one of the p-type semiconductor (compound) and the n-type semiconductor (compound), it is preferred that the layer formation is achieved by a wet layer formation method which is easy to perform. In the case of employing a dry layer formation method such as vapor deposition, the use of a high molecular compound is difficult because of possible occurrence of decomposition, but its oligomer can be preferably used instead of that. On the other hand, in the case of using a low molecular compound, a dry layer formation method is preferably employed, and a vacuum vapor deposition method is particularly preferably employed. In the vacuum vapor deposition method, a method for heating a compound such as a resistance heating vapor deposition method and an electron beam heating vapor deposition method, the shape of a vapor deposition source such as a crucible and a boat, a degree of vacuum, a vapor deposition temperature, a substrate temperature, a vapor deposition rate, and the like are basic parameters. In order to achieve uniform vapor deposition, it is preferred that the vapor deposition is carried out while rotating the substrate. A higher degree of vacuum is preferred. The vacuum vapor deposition is carried out at a degree of vacuum of not more than $10^{-4}$ Torr, preferably not more than $10^{-6}$ Torr, and particularly preferably not more than $10^{-8}$ Torr. It is preferred that all steps at the time of vapor deposition are carried out in vacuo. Basically, the vacuum vapor position is carried out in such a manner that the compound does not come into direct contact with the external oxygen and moisture. The foregoing conditions of the vacuum vapor deposition must be strictly controlled because they affect crystallinity, amorphous properties, density, compactness, and so on. It is preferably employed to subject the vapor deposition rate to PI or PID control using a layer thickness monitor such as a quartz oscillator or an interferometer. In the case of vapor depositing two or more kinds of compounds at the same time, a co-vapor deposition method, a flash vapor deposition method and so on can be preferably employed.

With the photoelectric conversion layer 123 comprising the organic material, when light is introduced from above the second electrode 13 in the aforesaid constitution, electrons and holes are generated by absorption of light in a large amount in the vicinity of the second electrode 13 and in a not so much amount in the vicinity of the first electrode 11 in general. This is caused due to the matter that most of light of wavelength near the absorption peak wavelength of the photoelectric conversion layer 123 is absorbed in the vicinity of the second electrode and that the light absorption decreases as the distance from the vicinity of the second electrode 13 increases. Therefore, unless electrons or holes generated in the vicinity of the second electrode 13 are allowed to migrate to the silicon substrate with good efficiency, there results decreased photoelectric conversion efficiency, eventually causing a decrease in sensitivity of the device. Also, a signal due to the light wavelength strongly absorbed in the vicinity of the second electrode 13 is reduced, resulting in a so-called broadening that the width of the spectral sensitivity is widened.

Also, in the photoelectric conversion layer 123 comprising an organic material, it is general that the mobility of electrodes is very small as compared with that of holes. In addition, it is also known that the mobility of electrons in the photoelectric conversion layer 123 comprising an organic material is so susceptible to oxygen that, when the photoelectric conversion layer 123 is exposed to the air, the mobility of electrons is further lowered. Thus, in the case where it is intended to allow the electrons to migrate to the silicon substrate 1, too long transfer distance of the electrons generated in the vicinity of the second electrode 13 within the photoelectric conversion layer 123 can lead to deactivation of part of the electrons during transfer, thus the part of the electrons not being collected by the electrode. As a result, there occurs reduction of sensitivity and broadening of the spectral sensitivity.

In order to prevent reduction of sensitivity and broadening of the spectral sensitivity, it is effective to allow electrons or holes generated in the vicinity of the second electrode 13 to the silicon substrate 1 with high efficiency. For realizing this, it becomes the subject how to handle the electrons or holes generated within the photoelectric conversion layer 123.

With a solid-state imaging device 1000 having the photoelectric conversion layer 123 with the above-described characteristic properties, the external quantum efficiency can be enhanced by utilizing holes collected by the first electrode layer 11 which is an opposed electrode to the electrode of the light incident side, which serves to improve sensitivity and sharpen the spectral sensitivity. For this reason, with the solid-state imaging device 1000, a voltage is applied across the first electrode layer 11 and the second electrode 13 so that electrons generated in the photoelectric conversion layer 123 can migrate to the second electrode layer 13 whereas holes generated in the photoelectric conversion layer 123 can migrate to the first electrode 11.

One function of the undercoating and electron blocking layer 122 is to reduce unevenness on the first electrode layer 11. When uneven portions exist on the first electrode layer 11 or when dust is adhered to the first electrode layer 11, fine cracks are formed in the photoelectric conversion layer 123 at the uneven portions when the photoelectric conversion layer 123 is formed by vapor deposition of a low molecular organic material, that is, portions where the photoelectric conversion layer 123 is thin are liable to be formed. In this occasion, when the second electrode layer 13 is further formed thereon, the cracked portions are covered by the second electrode layer 13 and become close to the first electrode layer 11, thus DC short circuit or an increase in leak current being liable to occur. In particular, in the case where TCO is used as the second electrode layer 13, such a tendency is remarkable. Therefore, previous formation of the undercoating and electron blocking layer 122 on the first electrode layer 11 serves to relieve the unevenness and suppress these phenomena.

It is of importance for the undercoating and electron blocking layer 122 to be a uniform and flat layer. In the case of obtaining a particularly flat layer, preferred materials include organic high molecular materials such as polyaniline, polythiophene, polypyrrole, polycarbazole, PTPDES, and PTPDEK, and the layer may be formed by a spin coating method.

The electron blocking layer 122 is provided for reducing dark current caused due to injection of electrons from the first electrode layer 11 and functions to prevent injection of electrons from the first electrode layer 11 to the photoelectric conversion layer 123.

The hole blocking and buffering layer 125 is provided as a hole blocking layer for reducing dark current caused by injection of holes from the second electrode layer 13. The hole blocking and buffering layer 125 performs not only the function of inhibiting injection of holes from the second electrode layer 13 into the photoelectric conversion layer 123 but, in some cases, also the function to reduce damages which are given to the photoelectric conversion layer 123 upon formation of the second electrode layer 13.

In the case where the second electrode layer 13 is formed on the photoelectric conversion layer 123, there is some possibility that the photoelectric conversion layer 123 undergoes denaturation and generates deterioration in performance such as an increase of the leak current and reduction of sensitivity due to collision of high-energy particles present in an apparatus to be used for formation of the second electrode layer 13, for example, sputtering particles in the sputtering method, secondary electrons, Ar particles, and oxygen negative ion. As one technique for preventing this matter, it is preferred to provide a buffering layer 125 on the photoelectric conversion layer 123.

Now returning to FIG. 12, within the n-type silicon substrate 1, a p-type semiconductor region (hereinafter abbreviated as "p region") 4, an n-type semiconductor region 3 (hereinafter abbreviated as "n region"), and a p region 2 are formed in this order from the shallow side of the substrate 1. In the surface portion of the p region 4 light-shielded by the light-shielding layer 14, a highly concentrated p region (referred to as p+ region) 6 is formed, and is surrounded by an n-region 5.

The depth from the surface of the n-type silicon substrate 1 to the pn junction surface between the p region 4 and the n region 3 is adjusted to be a depth of absorbing blue light (about 0.2 μm). Thus, the p region 4 and the n region 3 form a photodiode (B photodiode) which absorbs blue light and accumulate holes in an amount in proportion to the absorbed light. The holes generated in the B photodiode are accumulated in the p region 4.

The depth from the surface of the n-type silicon substrate 1 to the pn junction surface between the p region 2 and the n-type silicon substrate 1 is adjusted to be a depth of absorbing red light (about 2 μm). Thus, the p region 2 and the n-type silicon substrate 1 form a photodiode (R photodiode) which absorbs red light and accumulate holes generated in an amount in proportion to the absorbed light. The holes generated in the R photodiode are accumulated in the p region 2.

The p+ region 6 is electrically connected to the first electrode layer 11 via a connecting portion 9 formed in the opening formed in the insulating layer 7, and accumulates holes collected by the first electrode layer 11. The connecting portion 9 is electrically insulated by the insulating layer 8 except for the first electrode 11 and the p+ region 6.

Holes accumulated in the p region 2 are converted to a signal corresponding to the charge amount by a MOS circuit (not shown) comprising a p-channel MOS transistor formed within the n-type silicon substrate 1, holes accumulated in the p region 4 are converted to a signal corresponding to the charge amount by a MOS circuit (not shown) comprising a p-channel MOS transistor formed within the n region 3, and electrons accumulated in the p+ region 6 are converted to a signal corresponding to the charge amount by a MOS circuit (not shown) comprising a p-channel MOS transistor formed within the n region 5, and then outputted to the outside of the solid-state imaging device 1000. These MOS circuits constitute the signal readout portion described in the claims. Each MOS circuit is connected to a signal read-out pad not shown by a wiring 10. Additionally, when the p region 2 and the p region 4 are provided with extraction electrodes and a predetermined reset voltage is applied thereto, each region is depleted, and the capacity of each pn junction portion becomes extremely small. Thus, the capacity to be generated at the junction surface can be made extremely small.

By the above-described structure, for example, G light can be photoelectrically converted in the photoelectric conversion layer 123, and B light and R light can be photoelectrically converted by the B photodiode and the R photodiode within the n-type silicon substrate 1, respectively. Also, since G light is first absorbed by the upper portion, color separation between B and G and between G and R is excellent. This is the greatly excellent point in comparison with a solid-state imaging device of the type wherein three PDs are stacked within the silicon substrate and all of B, G, and R lights are separated from each other within the substrate. In the following descriptions, the portions (B photodiode and R photodiode) where photoelectric conversion is performed and which is formed within the n-type silicon substrate 1 of the solid-state imaging device 1000 and comprises an inorganic material is also referred to as inorganic layers.

Additionally, it is possible to provide, between the n-type silicon substrate 1 and the first electrode layer 11 (for example between the insulating layer 7 and the n-type silicon substrate 1), an inorganic photoelectric conversion portion which comprises an inorganic material and which absorbs light having been transmitted through the photoelectric conversion layer 123 and accumulates charge generated in an amount in proportion to the light intensity. In this case, it suffices to provide a MOS circuit for reading out a signal corresponding to the amount of charge accumulated in the charge-accumulating region of this inorganic photoelectric conversion portion and connect the wiring 10 to this MOS circuit as well.

The first electrode layer 11 functions to collect the holes having been generated in the photoelectric conversion layer 123 and having migrated thereto. The first electrode layer 11 is formed as portions spaced from each other per pixel, which serves to generate image data. In the constitution shown in FIG. 12, photoelectric conversion is conducted in the n-type silicon substrate 1 as well, and hence the first electrode layer 11 has a transmittance for visible light of preferably 60% or more, more preferably 90% or more. In the constitution wherein no photoelectric conversion region exists under the first electrode layer 11, the first electrode layer 11 may have a low transmittance. As the material for the electrode, any one of ITO, IZO, $ZnO_2$, $SnO_2$, $TiO_2$, FTO, AL, Ag, and Au can most preferably be used. Details on the first electrode layer 11 will be given hereinafter.

The second electrode layer 13 functions to discharge electrons having been generated in the photoelectric conversion layer 123 and having migrated therefrom. The second electrode layer 13 can be commonly used for all pixels. Therefore, in the solid-state imaging device 1000, the second electrode layer 13 is constituted as a common sheet for all pixels. Since light must be introduced into the photoelectric conversion layer 123, it is necessary to use a material having a high transmittance for visible light for the second electrode layer 13. The second electrode 13 has a transmittance for visible light of preferably 60% or more, more preferably 90% or more. As the material for the electrode, any one of ITO, IZO, $ZnO_2$, $SnO_2$, $TiO_2$, FTO, AL, Ag, and Au can most preferably be used. Details on the second electrode layer 13 will be given hereinafter.

With respect to the inorganic layer, pn junction or pin junction of crystalline silicon, amorphous silicon, or a compound semiconductor such as GaAs is generally employed. In this case, since the color separation is carried out with a light penetration depth of silicon, a spectrum range to be detected in each of the stacked light receiving parts becomes broad. However, by using the photoelectric conversion layer 123 as the upper layer as shown in FIG. 12, namely by detecting the light which has transmitted through the photoelectric conversion layer 123 in the depth direction of silicon, the color separation is remarkably improved. In particular, when G light is detected by the photoelectric conversion layer 123 as shown in FIG. 12, the light which has transmitted through the photoelectric conversion layer 123 becomes B light and R light and, therefore, only BR lights are subjective to separation of light in the depth direction in silicon, thus the color separation being improved. Even in the case where the photoelectric conversion layer 123 detects the B light or the R light, the color separation is remarkably improved by properly selecting the depth of the pn junction interface of silicon.

With respect to the constitution of the inorganic layer, npn junction or pnpn junction from the incident side of light is preferred. In particular, the pnpn junction is more preferred because, by providing a p layer on the surface and increasing a potential of the surface, it is possible to trap holes generated in the vicinity of the surface and a dark current, thereby reducing the dark current.

Additionally, while FIG. 12 shows the constitution in which one photoelectric conversion portion is stacked above the n-type silicon substrate 1, it is also possible to employ a constitution in which a plurality of the photoelectric conversion portions are stacked above the n-type silicon substrate 1. The constitution in which a plurality of the photoelectric conversion portions are stacked will be described in an embodiment to be described hereinafter. In such case, the light to be detected in the inorganic layer may be a single color, and preferred color separation can be achieved. Furthermore, in the case where it is intended to detect lights of four colors in one pixel of the solid-state imaging device 1000, for example, there may be thought a constitution in which one color is detected in one photoelectric conversion portion and the remaining three colors are detected in the inorganic layer; a constitution in which two photoelectric conversion portions are stacked to thereby detect two colors therein and the remaining two colors are detected in the inorganic layer; and a constitution in which three photoelectric conversion portions are stacked to thereby detect three colors therein and the remaining one color is detected in the inorganic layer. Furthermore, the solid-state imaging device 1000 may be constituted to detect only one color in one pixel.

This case corresponds to the constitution as shown in FIG. 1, except that the p region 2, the n region 3 and the p region 4 are eliminated.

The inorganic layer will be described in more detail below. Preferred examples of the constitution of the inorganic layer 5 include light receiving elements of a photoconductive type, a p-n junction type, a shotkey junction type, a PIN junction type or an MSM (metal-semiconductor-metal) type; and light receiving elements of a phototransistor type. In particular, as shown in FIG. 12, it is preferred to use an inorganic layer in which a plural number of a first conducting type region and a second conducting type region which is a reversed conducting type to the first conducting type are alternately stacked within a single semiconductor substrate and each of the junction interfaces of the first conducting type and second conducting type regions is formed in a depth suitable for mainly subjecting each of plural lights of a different wavelength region to photoelectric conversion. The single semiconductor substrate is preferably single crystalline silicon, and the color separation can be carried out by utilizing absorption wavelength characteristics relying upon the depth direction of the silicon substrate.

As the inorganic semiconductor, InGaN based, InAlN based, InAlP based, or InGaAlP based inorganic semiconductors can also be used. The InGaN based inorganic semiconductor is an inorganic semiconductor which is adjusted so as to have a maximum absorption value within a blue wavelength range by properly changing the In content therein. That is, the composition becomes $In_xGa_{1-x}N$ ($0 \leq x < 1$). Such a compound semiconductor is produced by employing a metal organic chemical vapor deposition method (MOCVD method). With respect to the InAlN based nitride semiconductor using, as a raw material, Al of the Group 13 similar to Ga, it can be used as a short wavelength light receiving portion similar to the InGaN based semiconductor. Furthermore, InAlP or InGaAlP which is lattice matched with a GaAs substrate can also be used.

The inorganic semiconductor may be of a buried structure. The "buried structure" as used herein refers to a constitution in which the both ends of a short wavelength light receiving portion are covered by a semiconductor different from the short wavelength light receiving portion. The semiconductor for covering the both ends is preferably a semiconductor having a band gap wavelength shorter than or equal to a band gap wavelength of the short wavelength light receiving portion.

As materials for the first electrode layer 11 and the second electrode layer 13, metals, alloys, metal oxides, conductive compounds, or mixtures thereof can be used. Examples of the metal materials include an arbitrary combination of those selected from among Li, Na, Mg, K, Ca, Rb, Sr, Cs, Ba, Fr, Ra, Sc, Ti, Y, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Al, Ga, In, Tl, Si, Ge, Sn, Pb, P, As, Sb, Bi, Se, Te, Po, Br, I, At, B, C, N, F, O, S, and N, with Al, Pt, W, Au, Ag, Ta, Cu, Cr, Mo, Ti, Ni, Pd, and Zn being particularly preferred.

Since the first electrode layer 11 extracts holes from a hole transporting photoelectric conversion layer or a hole transport layer which is contained in the intermediate layer 12 and collects them, the first electrode layer 11 is selected in consideration of adhesion to an adjacent layer such as the hole transporting photoelectric conversion layer and the hole transport layer, electron affinity, ionization potential, and stability. Since the second electrode layer 13 extracts electrons from an electron transporting photoelectric conversion layer or an electron transport layer which is contained in the intermediate layer 12 and discharges them, the second electrode layer 13 is selected in consideration of adhesion to an adjacent layer such as the electron transporting photoelectric conversion layer and the electron transporting layer, electron affinity, ionization potential, and stability. Specific examples thereof include conductive metal oxides such as tin oxide, zinc oxide, indium oxide, and indium tin oxide (ITO); metals such as gold, silver, chromium, and nickel; mixtures or stacks of such a metal and such an conductive metal oxide; inorganic conductive substances such as copper iodide and copper sulfide; organic conductive materials such as polyaniline, polythiophene, and polypyrrole; silicon compounds; and stack materials thereof with ITO. Of these, conductive metal oxides are preferred; and ITO and IZO are particularly preferred in view of productivity, high conductivity, and transparency.

In the preparation of the electrode, various methods are employable depending upon the material. For example, in the case of ITO, the electrode is formed by a method such as an electron beam method, a sputtering method, a resistance heating vapor deposition method, a chemical reaction method (for example, a sol-gel method), and a method of coating a dispersion of indium tin oxide. In the case of ITO, a UV-ozone treatment, a plasma treatment, or the like can be applied.

Conditions upon formation of a transparent electrode layer will be mentioned below. A substrate temperature upon formation of a transparent electrode layer is preferably not higher than 500° C., more preferably not higher than 300° C., still more preferably not higher than 200° C., and yet more preferably not higher than 150° C. Furthermore, a gas may be introduced during the formation of the transparent electrode. Basically, though the gas species is not limited, Ar, He, oxygen, nitrogen, and so on can be used. Furthermore, a mixed gas of such gases may be used. In particular, in the case of an oxide material, it is preferred to use oxygen since oxygen deficiency often occurs.

Furthermore, with respect to a surface resistance of the transparent electrode layer, its preferred range varies depending upon, for example, whether the transparent electrode layer is the first electrode layer 11 or the second electrode layer 13. In the case where the read-out portion is of a CMOS structure, the surface resistance of the transparent conductive layer is preferably not more than 10,000Ω/□, more preferably not more than 1,000Ω/□. In the case where the read-out portion is of a CCD structure, the surface resistance is preferably not more than 1,000Ω/□, more preferably not more than 100Ω/□. In the case where the transparent electrode layer is used for the second electrode layer 13, the surface resistance is preferably not more than 1,000,000Ω/□, more preferably not more than 100,000 Ω/□.

As the material of the transparent electrode layer, any one material of ITO, IZO, $SnO_2$, ATO (antimony-doped tin oxide), ZnO, AZO (Al-doped zinc oxide), GZO (gallium-doped zinc oxide), $TiO_2$, or FTO (fluorine-doped tin oxide) is particularly preferred. A light transmittance of the transparent electrode layer is preferably 60% or more, more preferably 80% or more, still more preferably 90% or more, yet more preferably 95% or more at an absorption peak wavelength of the photoelectric conversion layer to be contained in the photoelectric conversion portion containing the transparent electrode layer.

Furthermore, in the case where a plural number of the intermediate layer 12 is stacked, the first electrode layer 11 and the second electrode layer 13 are required to transmit light other than the light to be detected by respective photoelectric conversion layers of from the photoelectric conversion layer located in the closet position to the light incident side to the photoelectric conversion layer located in the farthest position from the light incident side. It is preferred to use a material capable of transmitting 90% or more, more preferably 95% or more of light against visible light.

The second electrode layer 13 is preferably formed under plasma-free conditions. Formation of the second electrode layer 13 under the plasma-free conditions serves to reduce detrimental influences of plasma on the substrate, thus good photoelectric conversion characteristics being obtained. The term "plasma-free" as used herein means that no plasma is generated during formation of the second electrode layer 13 or that the distance between the plasma-generating source and the substrate is 2 cm or more, preferably 10 cm or more, more preferably 20 cm or more, thus plasma reaching the substrate being reduced.

Examples of an apparatus in which plasma is not generated during formation of the second electrode layer 13 include an electron beam vapor deposition apparatus (EB vapor deposition apparatus) and a pulse laser vapor deposition apparatus. With respect to the EB vapor deposition apparatus or pulse laser vapor deposition apparatus, apparatuses as described in *Tomei Dodenmaku no Shintenkai* (Developments of Transparent Conductive Layers), supervised by Yutaka Sawada (published by CMC publishing Co. Ltd., 1999); *Tomei Dodenmaku no Shintenkai II* (Developments of Transparent Conductive Layers II), supervised by Yutaka Sawada (published by CMC publishing Co. Ltd., 2002); *Tomei Dodenmaku no Gijutsu* (Technologies of Transparent Conductive Layers) written by Japan Society for the promotion of Science (published by Ohmsha, Ltd., 1999); and references as added therein can be used. In the following, the method for achieving formation of a transparent electrode layer using an EB vapor deposition apparatus is referred to as "EB vapor deposition method"; and the method for achieving formation of a transparent electrode layer using a pulse laser vapor deposition apparatus is referred to as "pulse laser vapor deposition method".

With respect to the apparatus capable of realizing the state that a distance from the plasma-generating source to the substrate is 2 cm or more and that the plasma which reaches the substrate is reduced (hereinafter referred to as "plasma-free layer-forming apparatus"), for example, a counter target type sputtering apparatus and an arc plasma vapor deposition method can be thought. With respect to these matters, apparatuses as described in *Tomei Dodenmaku no Shintenkai* (Developments of Transparent Conductive Layers), supervised by Yutaka Sawada (published by CMC publishing Co. Ltd., 1999); *Tomei Dodenmaku no Shintenkai II* (Developments of Transparent Conductive Layers II), supervised by Yutaka Sawada (published by CMC publishing Co. Ltd., 2002); *Tomei Dodenmaku no Gijutsu* (Technologies of Transparent Conductive Layers) written by Japan Society for the promotion of Science (published by Ohmsha, Ltd., 1999); and references as added therein can be used.

In the case where a transparent conductive layer such as TCO is used as the second electrode layer 13, a DC short circuit or an increase of the leak current may possibly be generated. It is thought that one of these causes resides in the matter that fine cracks which are introduced into the photoelectric conversion layer 123 are covered by a dense layer such as TCO, whereby the conductivity with the first electrode layer 11 in the opposite side increases. For that reason, in the case of an electrode which is relatively inferior in layer quality, such as Al, the increase of the leak current scarcely occurs. By controlling the thickness of the second electrode layer 13 against the thickness of the photoelectric conversion layer 123 (namely, the crack depth), the increase of the leak current can be largely reduced. The thickness of the second electrode layer 13 is not more than $1/5$, preferably not more than $1/10$ of the thickness of the photoelectric conversion layer 123.

Usually, when thickness of the conductive layer is smaller than a certain range, a sharp increase of the resistance value occurs. In the solid-state imaging device 1000 of this embodiment, the sheet resistance may be preferably from 100 to 10,000Ω/□, and the degree of freedom with respect to the range of the thickness within which the layer can be thinned is large. Further, as the thickness of the transparent conductive thin layer is reduced, the amount of light to be absorbed increases, and the light transmittance generally increases. The increase of the light transmittance is very preferable because the light absorption in the photoelectric conversion layer 123 is increased and the light conversion ability is increased. Taking into account the reduction of the leak current, the increase of the resistance value of the thin layer, and the increase of the light transmittance following thinning of the layer, it is desirable that the thickness of the transparent conductive thin layer is preferably from 5 to 100 nm, more preferably from 5 to 20 nm.

As the material for the transparent electrode layer, materials which can formed into a layer by a plasma-free layer-forming apparatus, an EB vapor deposition apparatus or a pulse laser vapor deposition apparatus are preferred. For example, metals, alloys, metal oxides, metal nitrides, metal borides, organic conductive compounds, and mixtures thereof can be suitably illustrated. Specific examples thereof include conductive metal oxides such as tin oxide, zinc oxide, indium oxide, indium zinc oxide (IZO), indium tin oxide (ITO), and indium tungsten oxide (IWO); metal nitrides such as titanium nitride; metals such as gold, platinum, silver, chromium, nickel, and aluminum; mixtures or stacks of such a metal and such an conductive metal oxide; inorganic conductive substances such as copper iodide and copper sulfide; organic conductive materials such as polyaniline, polythiophene, and polypyrrole; and stacks thereof with ITO. Also, materials described in detail in *Tomei Dodenmaku no Shintenkai* (Developments of Transparent Conductive Layers), supervised by Yutaka Sawada (published by CMC publishing Co. Ltd., 1999); *Tomei Dodenmaku no Shintenkai II* (Developments of Transparent Conductive Layers II), supervised by Yutaka Sawada (published by CMC publishing Co. Ltd., 2002); *Tomei Dodenmaku no Gijutsu* (Technologies of Transparent Conductive Layers) written by Japan Society for the promotion of Science (published by Ohmsha, Ltd., 1999); and references as added therein may be used.

(Fourth Embodiment)

In this embodiment, two photodiodes in the inorganic layer of the structure shown in FIG. 12 used for describing the third embodiment are not stacked within the n-type silicon substrate 1, but are arranged in the vertical direction to the entering direction of the incident light to detect two color lights within the n-type substrate.

Figure 14:
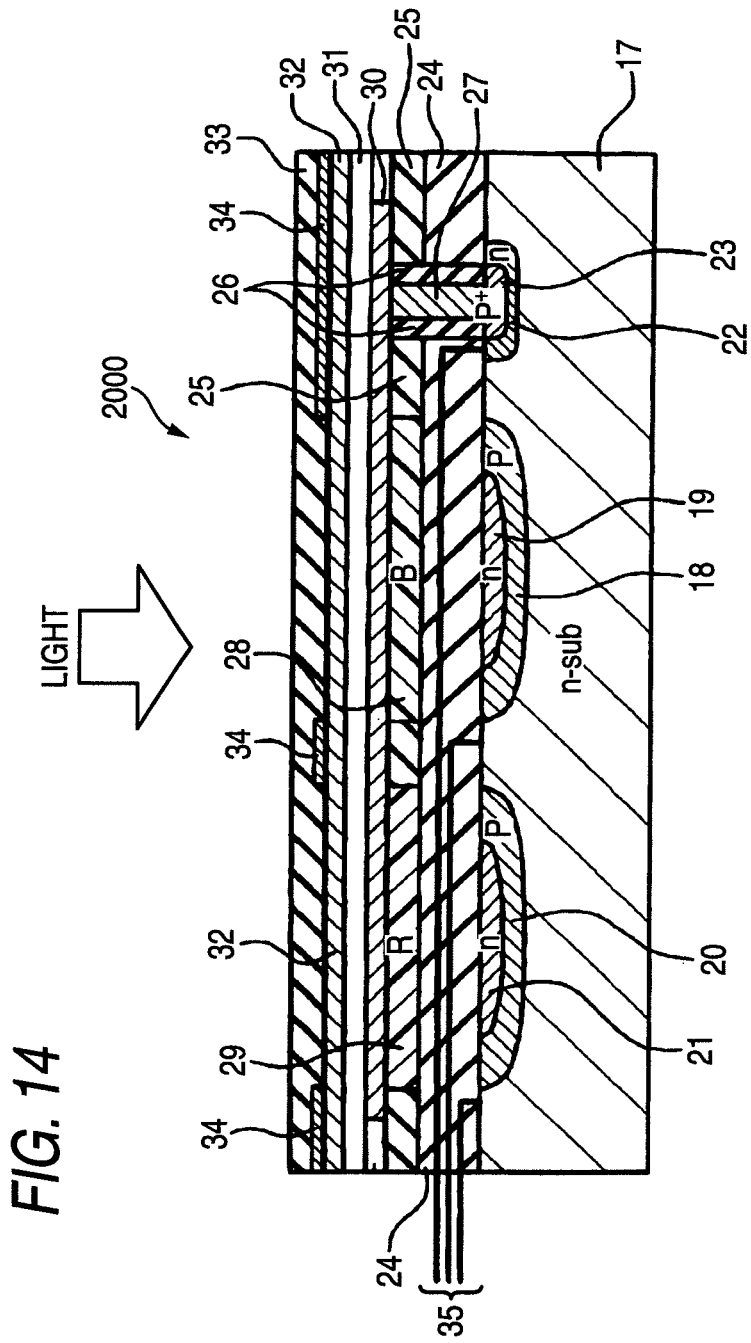
FIG. 14 is a schematic cross-sectional view showing one pixel of a solid-state imaging device for illustrating a fourth exemplary embodiment of the invention.

FIG. 14 is a cross-sectional schematic view showing one pixel of a solid-state imaging device for illustrating the fourth embodiment of the invention.

One pixel of the solid-state imaging device 2000 shown in FIG. 14 is constituted by including a n-type silicon substrate 17, and a photoelectric conversion element of the structure comprising a first electrode layer 30 formed above the n-type silicon substrate 17, an intermediate layer 31 formed on the first electrode 30, and a second electrode layer 32 formed on the intermediate layer 31 and, on the photoelectric conversion element, a light shielding layer 34 having an opening is formed, with the light-receiving region of the intermediate layer 31 being restricted by the light-shielding layer 34. Also, a transparent insulating layer 33 is formed on the light-shielding layer 34.

The first electrode layer 30, the intermediate layer 31, and the second electrode layer 32 have the same constitutions as the first electrode layer 11, the intermediate layer 12, and the second electrode layer 13, respectively.

In the surface portion of the n-type silicon substrate 17 located under the opening of the light-shielding layer 34, a photodiode comprising a n region 19 and a p region 18 and a photodiode comprising a n region 21 and an p region 20 are formed side by side. Any plane direction on the surface of the n-type silicon substrate 17 is vertical to the incident direction of an entering light.

A color filter 28 capable of transmitting B light via a transparent insulating layer 24 is formed above the photodiode comprising the n region 19 and the p region 18, and the first electrode layer 30 is formed thereon. A color filter 29 capable of transmitting R light via a transparent insulating layer 24 is formed above the photodiode comprising the n region 21 and the p region 20, with the first electrode layer 30 being formed thereon. The color filters 28 and 29 are surrounded by a transparent insulating layer 25.

The photodiode comprising the n region 19 and the p region 18 absorbs B light having transmitted through the color filter 28, generates holes in proportion to the amount of absorbed light, and accumulates generated holes in the p region 18. The photodiode comprising the n region 21 and the p region 20 absorbs R light having transmitted through the color filter 29, generates holes in proportion to the amount of absorbed light, and accumulates generated holes in the p region 20.

A p+ region 23 is formed in the surface portion of the p-type silicon substrate 17 shielded by the light-shielding layer 34, and is surrounded by the n region 22.

The p+ region 23 is electrically connected to the first electrode 30 via a connecting portion 27 formed in the opening formed in the insulating layers 24 and 25 and accumulates holes collected by the first electrode layer 30 via the connecting portion 27. The connecting portion 27 is electrically insulated by the insulating layer 26 except for the first electrode layer 30 and the p+region 23.

Holes accumulated in the p region 18 are converted to a signal corresponding to the charge amount by a MOS circuit (not shown) comprising a p-channel MOS transistor formed within the n-type silicon substrate 17, holes accumulated in the p region 20 are converted to a signal corresponding to the charge amount by a MOS circuit (not shown) comprising a p-channel MOS transistor formed within the n-type silicon substrate 17, and holes accumulated in the p+ region 23 are converted to a signal corresponding to the charge amount by a MOS circuit (not shown) comprising a p-channel MOS transistor formed within the n region 22, and then outputted to the outside of the solid-state imaging device 2000. These MOS circuits constitute the signal read-out portion described in the claims. Each MOS circuit is connected to a signal read-out pad not shown through a wiring 35.

Additionally, the signal read-out portion may be constituted not by the MOS circuit but by CCD and an amplifier. That is, the signal read-out portion may be a signal read-out portion wherein holes accumulated in the p region 18, the p region 20, and the p+ region 23 are read out by CCD formed within the n-type silicon substrate 17, and the read-out signal is transferred by CCD to an amplifier which, in turn, outputs a signal corresponding to the amount of the holes.

As is described above, the signal read-out portion is illustrated by CCD and CMOS structure but, in view of electric power consumption, high speed read-out performance, pixel addition performance, partial read-out performance, etc., CMOS is preferred.

Additionally, in FIG. 14, color separation of the R light and the B light from each other is performed by means of the color filters 28 and 29. However, it is also possible to adjust the depth of the pn junction interface between the p region 20 and the n region 21 and the depth of the pn junction interface between the p region 18 and the n region 19 to thereby absorb the R light and the B light by the respective photodiodes, without providing the color filters 28 and 29. In this case, it is also possible to form, between the n-type silicon substrate 17 and the first electrode layer 30 (for example, between the insulating layer 24 and the n-type silicon substrate 17), an inorganic photoelectric conversion portion which comprises an inorganic material and can absorb light having transmitted through the intermediate layer 31, generate charges in proportion to the absorbed light amount, and accumulate them. In this case, it suffices to provide, within the n-type silicon substrate 17, a MOS circuit for reading out a signal corresponding to the amount of charges accumulated in the charge-accumulating region of the inorganic photoelectric conversion portion, with the MOS circuit being connected to the wire 35.

Also, a structure may be employed wherein one photodiode is provided within the n-type silicon substrate 17, and plural photoelectric conversion portions are stacked above the n-type silicon substrate 17. Further, a structure may be employed wherein plural photodiodes are provided within the n-type silicon substrate 17, and plural photoelectric conversion portions are stacked above the n-type silicon substrate 17. In addition, in the case where it is not necessary to form a color image, a structure may be employed wherein one photodiode is provided within the n-type silicon substrate 17, and only one photoelectric conversion portion is stacked.

(Fifth Embodiment)

The solid-state imaging device of this embodiment has a structure wherein no inorganic layers of the structure shown in FIG. 12 are provided but plural (three in this embodiment) photoelectric conversion layers are stacked above a silicon substrate.

Figure 15:
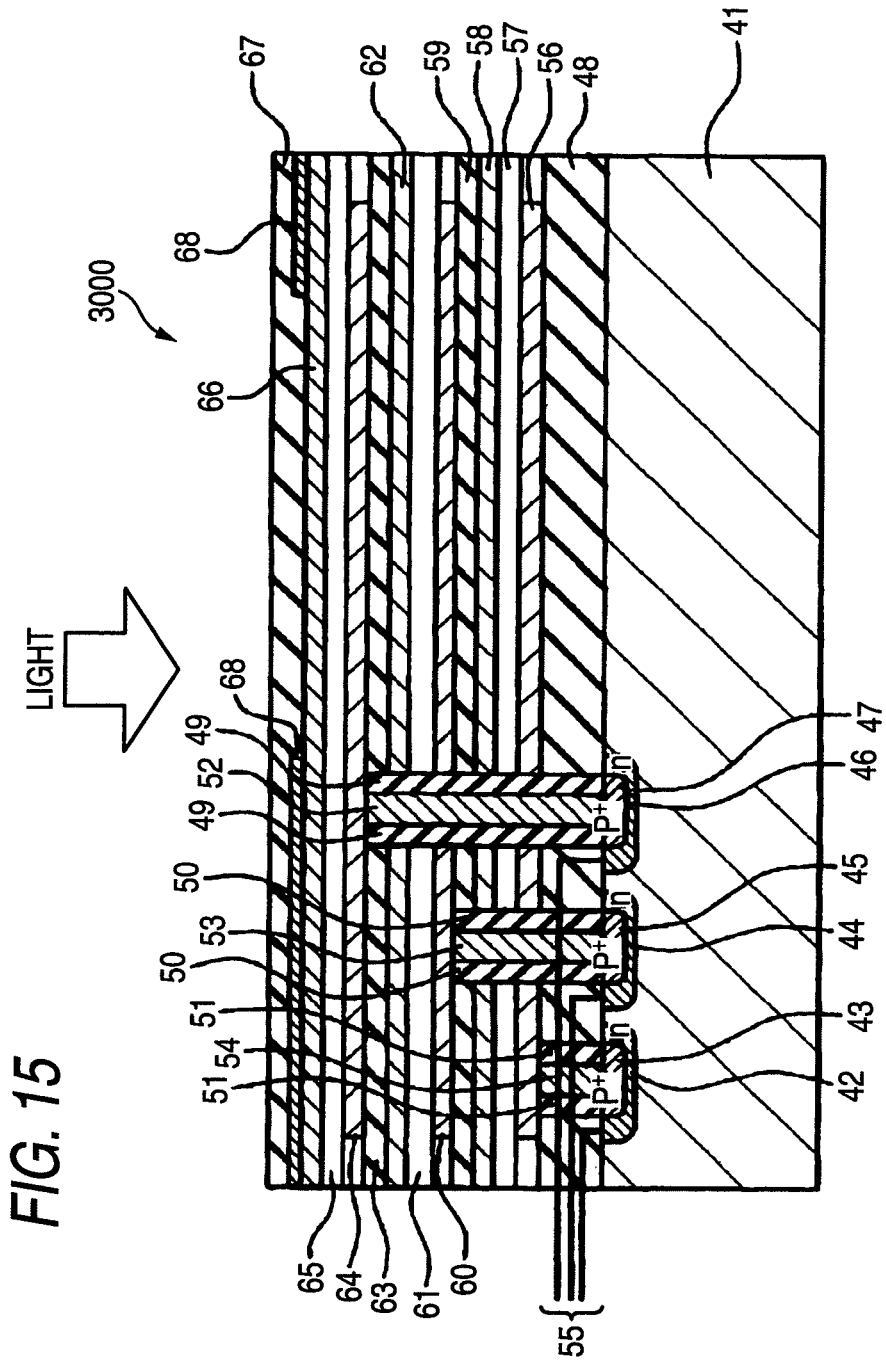
FIG. 15 is a schematic cross-sectional view showing one pixel of a solid-state imaging device for illustrating a fifth exemplary embodiment of the invention.

FIG. 15 is a cross-sectional schematic view showing one pixel of a solid-state imaging device for illustrating the fifth embodiment of the invention.

A solid-state imaging device 3000 shown in FIG. 15 has a structure wherein an R light photoelectric conversion element including a first electrode 56, an intermediate layer 57 stacked on the first electrode layer 56, and a second electrode layer 58 stacked on the intermediate layer 57; a B light photoelectric conversion element including a first electrode layer 60, an intermediate layer 61 stacked on the first electrode layer 60, and a second electrode layer 62 stacked on the intermediate layer 61; and a G light photoelectric conversion element including a first electrode layer 64, an intermediate layer 65 stacked on the first electrode layer 64, and a second electrode layer 66 stacked on the intermediate layer 65; in this order above the silicon substrate 41, with each of the first electrode layers contained in each element facing the silicon substrate 41 side.

A transparent insulating layer 48 is formed on the silicon substrate 41, the R light photoelectric conversion element is formed thereon, an insulating layer 59 is formed thereon, the B light photoelectric conversion element is formed thereon, an insulating layer 63 is formed thereon, the G light photoelectric conversion element is formed thereon, a light-shielding layer 68 having an opening is formed thereon, and a transparent insulating layer 67 is formed thereon.

The first electrode 64 contained in the G light photoelectric conversion element, the intermediate layer 65, and the second electrode layer 66 respectively have the same structures as the first electrode layer 11, the intermediate layer 12, and the second electrode layer 13 shown in FIG. 12.

The first electrode layer 60 contained in the B light photoelectric conversion element, the intermediate layer 61, and the second electrode layer 62 respectively have the same structures as the first electrode layer 11, the intermediate layer 12, and the second electrode layer 13 shown in FIG. 12, provided that the photoelectric conversion layer contained in the intermediate layer 61 contains a material capable of absorbing a blue light and generating electrons and holes in proportion to the amount of the absorbed light.

The first electrode layer 56 contained in the R light photoelectric conversion element, the intermediate layer 57, and the second electrode layer 58 respectively have the same structures as the first electrode layer 11, the intermediate layer 12, and the second electrode layer 13 shown in FIG. 12, provided that the photoelectric conversion layer contains a material capable of absorbing a red light and generating electrons and holes in proportion to the amount of the absorbed light.

It is preferred to select appropriate materials and appropriate structures for respective electron blocking layers and hole blocking layers contained in the intermediate layers 61 and 57 so that no energy barriers are generated upon transporting signal charges in consideration of the relation between the HOMO and LUMO energy levels of each photoelectric conversion layer and the HOMO and LUMO energy levels of each blocking layer adjacent to the photoelectric conversion layer.

In the surface portions of the silicon substrate 41 shielded by the light-shielding layer 68, p+ regions 43, 45, and 47 are formed, with each of them being surrounded by n regions 42, 44, and 46, respectively.

The p+ region 43 is electrically connected to the first electrode layer 56 via the connecting portion 54 formed in the opening formed in the insulating layer 48 and accumulate holes collected by the first electrode layer 56 via the connecting portion 54. The connecting portion 54 is electrically insulated by the insulating layer 51 except for the first electrode layer 56 and the p+ region 43.

The p+ region 45 is electrically connected to the first electrode layer 60 via the connecting portion 53 formed in the opening formed in the insulating layer 48, in the R light photoelectric conversion element, and in the insulating layer 59 and accumulates holes collected by the first electrode layer 60 via the connecting portion 53. The connecting portion 53 is electrically insulated by the insulating layer 50 except for the first electrode layer 60 and the p+ region 45.

The p+ region 47 is electrically connected to the first electrode layer 64 via the connecting portion 52 formed in the opening formed in the insulating layer 48, the R light photoelectric conversion portion, the insulating layer 59, the B light photoelectric conversion portion, and in the insulating layer 63 and accumulates holes collected by the first electrode layer 64 via the connecting portion 52. The connecting portion 52 is electrically insulated by the insulating layer 49 except for the first electrode layer 64 and the p+ region 47.

Holes accumulated in the p+ region 43 are converted to a signal corresponding to the charge amount by a MOS circuit (not shown) comprising a p-channel MOS transistor formed within the n region 42, holes accumulated in the p+ region 45 are converted to a signal corresponding to the charge amount by a MOS circuit (not shown) comprising a p-channel MOS transistor formed within the n region 44, and holes accumulated in the p+ region 47 are converted to a signal corresponding to the charge amount by a MOS circuit (not shown) comprising a p-channel MOS transistor formed within the n region 46, and then outputted to the outside of the solid-state imaging device 3000. These MOS circuits constitute the signal read-out portions described in the claims. Each MOS circuit is connected to a signal read-out pad not shown through a wiring 55. Additionally, the signal read-out portion may be constituted not by the MOS circuit but by CCD and an amplifier. That is, the signal read-out portion may be a signal read-out portion wherein holes accumulated in the p+ regions 43, 45, and 47 are read out by CCD formed within the silicon substrate 41, and the read-out signal is transferred to an amplifier which, in turn, outputs a signal corresponding to the amount of the holes.

Additionally, it is possible to provide, between the silicon substrate 41 and the first electrode layer 56 (for example, between the insulating layer 48 and the silicon substrate 41), an inorganic photoelectric conversion portion which comprises an inorganic material and which receives light having transmitted through the intermediate layers 57, 61, and 65, generates charges in an amount in proportion to the received light, and accumulates them. In this case, it suffices to provide, within the silicon substrate 41, a MOS circuit for reading out a signal generated in proportion to the amount of charges accumulated in the charge-accumulating region of this inorganic photoelectric conversion portion and connect the wiring 55 to this MOS circuit as well.

Thus, the constitution wherein plural photoelectric conversion layers are stacked on a silicon substrate as described in the third and the fourth embodiments can be realized by the constitution as shown in FIG. 15.

In the above descriptions, the photoelectric conversion layer capable of absorbing the B light means a layer which can absorb light of at least 400 to 500 nm in wavelength, with the absorbance at the peak wavelength in the wavelength region being preferably 50% or more. The photoelectric conversion layer capable of absorbing the G light means a layer which can absorb light of at least 500 to 600 nm in wavelength, with the absorbance at the peak wavelength in the wavelength region being preferably 50% or more. The photoelectric conversion layer capable of absorbing the R light means a layer which can absorb light of at least 600 to 700 nm in wavelength, with the absorbance at the peak wavelength in the wavelength region being preferably 50% or more.

In such constitution as the third embodiment or the fifth embodiment, the color-detecting order from the upper side may be in a pattern of BGR, BRG, GBR, GRB, RBG, or RGB, with the uppermost layer being preferably G. Also, in the case of the fourth embodiment, such combination of the pattern is possible that the upper layer is R layer and the lower layer is BG layer on the same plane, that the upper layer is B layer and the lower layer is GR layer on the same plane, or that the upper layer is G layer and the lower layer is BR layer on the same plane. A preferred constitution is that wherein the upper layer is G layer and the lower layer is BR layer on the same plane.

(Sixth Embodiment)

Figure 16:
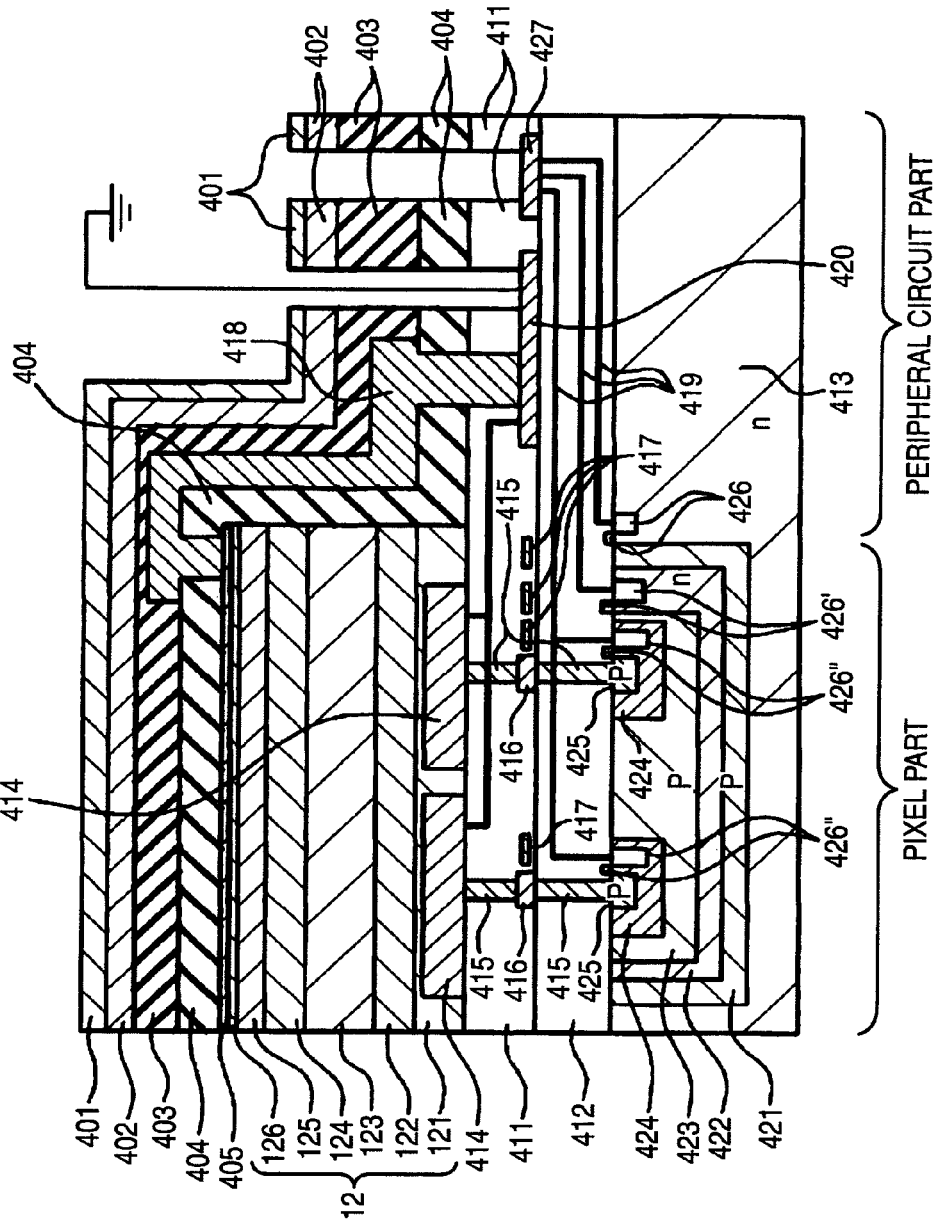
FIG. 16 is a schematic cross-sectional view of a solid-state imaging device for illustrating a sixth exemplary embodiment of the invention.

FIG. 16 is a cross-sectional schematic view showing a solid-state imaging device for illustrating the sixth embodiment of the invention.

In FIG. 16, a cross-section of 2 pixels n a pixel part which detect light and accumulate charges and a cross-section of a peripheral circuit part where wiring connected to electrodes in the pixel part and a bonding PAD connected to the wiring are formed are also shown.

In the n-type silicon substrate 413 in the pixel part, a p region 421 is formed in the surface thereof, an n region 422 is formed on the surface of the p region 421, a p region 423 is formed on the surface of the n region 422, and an n region 424 is formed on the surface of the p region 423.

The p region 421 accumulates holes of a red (R) component photo-electrically converted by the pn junction with the n-type silicon substrate 413. A potential change of the p region 421 caused due to accumulation of the holes of the R component is read out into a signal read-out PAD 427 through a MOS transistor 426 formed in the n-type silicon substrate 413 via metal wiring 419 connected thereto.

The p region 423 accumulates holes of a blue (B) component photo-electrically converted by the pn junction with the n region 422. A potential change of the p region 423 caused due to accumulation of the holes of the B component is read out into a signal read-out PAD 427 through a MOS transistor 426' formed in the n region 422 via metal wiring 419 connected thereto.

A hole accumulation region 425 which is made of a p region for accumulating holes of a green (G) component generated in the photoelectric conversion layer 123 stacked above the n-type silicon substrate 413 is formed within the n region 424. A potential change of the hole accumulation region 425 caused due to the accumulation of the holes of the G component is read out into the signal read-out PAD 427 from an MOS transistor 426" formed within the n region 424 via the metal wiring 419 connected thereto. Usually, the signal read-out pad 427 is separately provided in every transistor from which each of the color components is read out.

Here, the p region, the n region, the transistor, the metal wiring, and the like are schematically illustrated. However, the respective structures and the like are not limited thereto, and optimum structures are properly selected. Since the B light and the R light are distinguished from each other depending upon the depth of the silicon substrate, it is important to select the depth of the pn junction, etc. from the surface of the silicon substrate and the doping concentration of each of impurities. Techniques employed for common CMOS image sensors may be applied to the CMOS circuit constituting the signal read-out portion. A circuit structure capable of reducing the number of transistors in the pixel part including a low-noise read-out column amplifier and a CDS circuit may be applied.

A transparent insulating layer 412 containing, as a major component, silicon oxide, silicon nitride, or the like is formed on the n-type silicon substrate 413. A transparent insulating layer 411 containing, as a major component, silicon oxide, silicon nitride, or the like is formed on the insulating layer 412. The layer thickness of the insulating layer 412 is preferably not more than 5 μm, more preferably not more than 3 μm, still more preferably not more than 2 μm, and yet more preferably not more than 1 μm.

A plug 415 for electrically connecting a first electrode layer 414 to a p region 425 as the hole accumulation region, which contains, for example, tungsten as a major component, is formed within the insulating layers 411 and 412; and the plug 415 is relayed and connected between the insulating layer 411 and the insulating layer 412 by a pad 416. As the pad 416, a substance containing aluminum as a major component is preferably used. The foregoing metal wiring 419 and gate electrodes of the transistors 426, 426', and 426" are formed within the insulating layer 412. It is preferred that a barrier layer including the metal wiring is provided. The plug 415 is provided in every pixel.

In order to prevent a noise caused due to the generation of a charge by the pn junction between the n region 424 and the p region 425, a light-shielding layer 417 is provided within the insulating layer 411. As the light-shielding layer 417, a substance containing, as a major component, aluminum, tungsten, etc. is usually used. A bonding PAD 420 (PAD for supplying a power source from the outside) and the signal read-out PAD 427 are formed within the insulating layer 411, and a metal wiring (not shown) for electrically connecting the bonding PAD 420 to a first electrode layer 414 to be described hereinafter is also formed.

The transparent first electrode layer 414 is formed on the plug 415 of each pixel within the insulating layer 411. The first electrode layer 414 is divided for every pixel, and a light receiving area is determined by the size thereof. A bias is applied to the first electrode layer 414 through a wiring from the bonding PAD 420. A structure is preferred wherein holes can be accumulated in the hole accumulation region 425 by applying a negative bias to the first electrode layer 414 with respect to a second electrode layer 405 to be described hereinafter.

An intermediate layer 12 of the same structure as in FIG. 12 is formed on the first electrode layer 414, and the second electrode layer 405 is formed thereon.

A protective layer 404 containing, as a major component, silicon nitride or the like and protecting the intermediate layer 12 is formed on the second electrode layer 405, with an opening being formed at a position not overlapping the first electrode layer 414 of the pixel part; and in the insulating layer 411 and the protective layer 404, an opening is formed in a part on the bonding PAD 420. Then, a wiring 418 made of aluminum or the like for electrically connecting the second electrode layer 405 and the bonding PAD 420 exposed by these two openings to each other and giving a potential to the second electrode layer 405 is formed in the openings and on the protective layer 404. As a material of the wiring 418, an alloy containing aluminum such as Al—Si or Al—Cu alloy can also be used.

A protective layer 403 containing, as a major component, silicon nitride or the like for protecting the wiring 418 is formed on the wiring 418; an infrared light-shielding dielectric multilayered layer 402 is formed on the protective layer 403; and an antireflection layer 401 is formed on the infrared light-shielding dielectric multilayered layer 402.

The first electrode layer 414 performs the same function as the first electrode layer 11 shown in FIG. 12. The second electrode layer 405 performs the same function as the second electrode layer 13 shown in FIG. 12.

The constitution as described hereinbefore enables one to conduct color photographing by detecting a light of three colors of BGR per pixel. According to the constitution of FIG. 16, common values of R and B are used in two pixels, and only a value of G is separately used. However, since the sensitivity to G is important in forming an image, it is possible to produce a good color image even with such a constitution.

The solid-state imaging device having been described hereinbefore can be applied to imaging devices including a digital camera, a video camera, a facsimile, a scanner, and a copying machine. It can also be utilized as optical sensors such as a biosensor and a chemical sensor.

Materials to be illustrated as the insulating layer described in the above embodiments are metal oxides such as $SiO_x$, $SiN_x$, BSG, PSG, BPSG, $Al_2O_3$, MgO, GeO, NiO, CaO, BaO, $Fe_2O_3$, $Y_2O_3$, and $TiO_2$, and metal fluorides such as $MgF_2$, LiF, $AlF_3$, and $CaF_2$, with $SiO_x$, $SiN_x$, BSG, PSG, and BPSG being most preferred materials.

Additionally, in the third embodiment to the sixth embodiment, either of hole and electron may be employed for reading out a signal from other portions than the photoelectric conversion layers. That is, as has been described hereinbefore, a structure may be employed wherein holes are to be accumulated in the inorganic photoelectric conversion portion provided between the semiconductor substrate and the photoelectric conversion portion stacked thereon or in the photodiode formed within the semiconductor substrate, with the signal in proportion to the amount of the holes being read out by the signal read-out portion; or a structure may be employed wherein electrons are to be accumulated in the inorganic photoelectric conversion portion or in the photodiode formed within the semiconductor substrate, with the signal in proportion to the amount of the electrons being read out by the signal read-out portion.

In the third to sixth embodiments, a photoelectric conversion portion of the constitution shown in FIG. 13 is used as the photoelectric conversion portion provided above the silicon substrate, but photoelectric conversion portions shown in FIG. 1 and FIGS. 6 to 9 may also be used. The constitution as shown in FIG. 13 can provide high effect of suppressing dark current because electrons and holes can be blocked. Also, in the case where the electrode on the opposite side to the light incident side is used as an electrode for extracting electrons, it suffices that, in FIG. 12, the connecting portion 9 is connected to the second electrode 13 and, in FIG. 14, the connecting portion 27 is connected to the second electrode 13 and, in FIG. 15, the connecting portion 54 is connected to the second electrode 58, the connecting portion 53 is connected to the second electrode 62, and the connecting portion 52 is connected to the second electrode 66.

The solid-state imaging device described in this embodiment has a constitution wherein many pixels each of which is shown in FIGS. 12 to 16 are disposed in an array pattern on the same plane. Since an RGB color signal can be obtained by one pixel, this one pixel can be considered as a photoelectric conversion element capable of converting RGB lights to electric signals. Therefore, the solid-state imaging device described in this embodiment can be said to have a constitution wherein many photoelectric conversion elements each of which is shown in FIGS. 12 to 16 are disposed in an array pattern on the same plane.

(Seventh Embodiment)

A seventh exemplary embodiment will be described below wherein a solid-state imaging device is realized by using the photoelectric conversion element shown in FIGS. 17 and 18.

Figure 17:
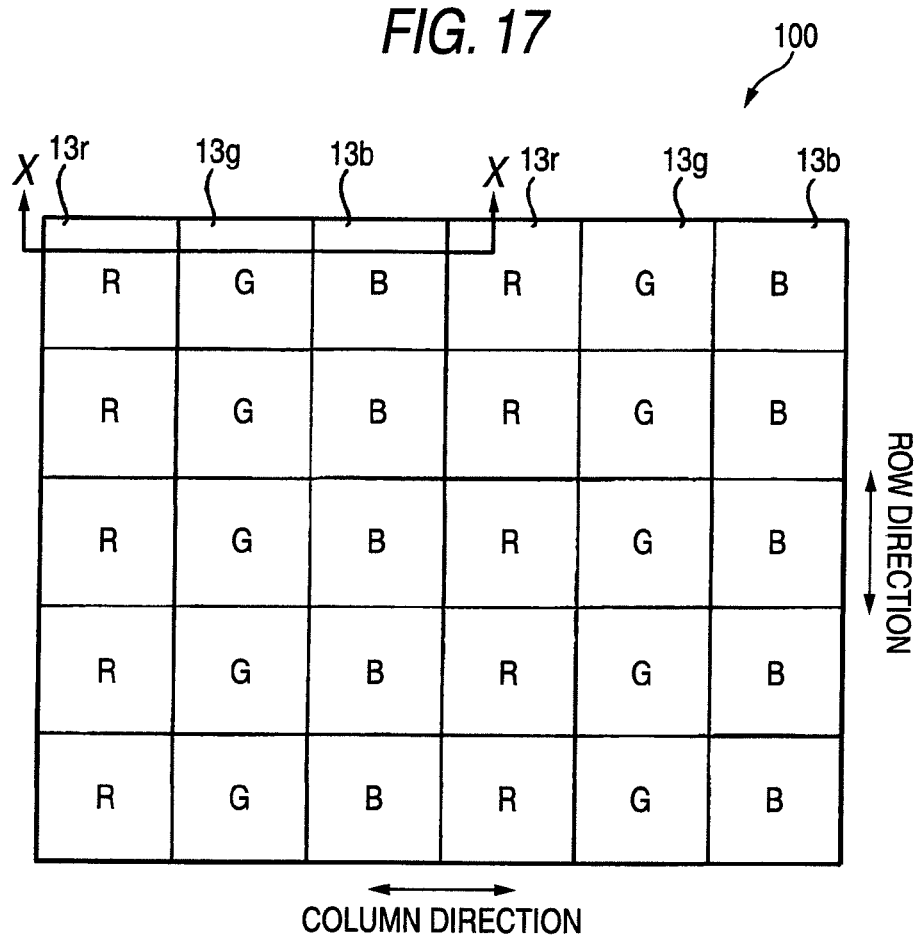
FIG. 17 is a schematic view showing part of the surface of an imaging device for illustrating an exemplary embodiment of the invention.

FIG. 17 is a schematic partial surface view of a imaging device for illustrating the embodiment of the invention. FIG. 18 is a schematic cross-sectional view cut along an X-X line of the imaging device shown in FIG. 17.

A p-well layer 2 is formed on an n-type silicon substrate 1. In the following descriptions, the n-type silicon substrate 1 and the p-well layer 2 are inclusively referred to as "semiconductor substrate". In a row direction on the same plane above the semiconductor substrate and a column direction which is orthogonal thereto, there are arranged large numbers of color filters of three types, that is, color filters 13r for mainly transmitting R light, color filters 13g for mainly transmitting G light, and color filters 13b for mainly transmitting B light, respectively.

A known material can be used for the color filter 13r. The material transmits R light. A known material can be used for the color filter 13g. The material transmits G light. A known material can be used for the color filter 13b. The material transmits B light.

For an arrangement of the color filters 13r, 13g and 13b, it is possible to employ a color filter array (a Bayer array, a row stripe, or a column stripe) used in a known single plate type solid-state imaging device.

A transparent electrode 11r is formed above the n region 4r, a transparent electrode 11g is formed above the n region 4g, and a transparent electrode 11b is formed above the n region 4b. The transparent electrodes 11r, 11g, and 11b are divided corresponding to the color filters 13r, 13g, and 13b, respectively. Each of the transparent electrodes 11r, 11g, and 11b has the same function as the lower electrode 11 in FIG. 1.

A photoelectric conversion layer 12 having a one-sheet structure which is common to the color filters 13r, 13g, and 13b is formed on each of the transparent electrodes 11r, 11g, and 11b.

An upper electrode 13 having a one-sheet structure which is common to the respective color filters 13r, 13g, and 13b is formed on the photoelectric conversion layer 12.

A photoelectric conversion element corresponding to the color filter 13r is formed by the transparent electrode 11r, the upper electrode 13 opposed thereto, and a part of the photoelectric conversion layer 12 interposed therebetween. The photoelectric conversion element will be hereinafter referred to as an R light photoelectric conversion element because it is formed on the semiconductor substrate.

A photoelectric conversion element corresponding to the color filter 13g is formed by the transparent electrode 11g, the upper electrode 13 opposed thereto, and a part of the photoelectric conversion layer 12 interposed therebetween. The photoelectric conversion element will be hereinafter referred to as a G light photoelectric conversion element.

A photoelectric converting device corresponding to the color filter 13b is formed by the transparent electrode 11b, the upper electrode 13 opposed thereto, and a part of the photoelectric conversion layer 12 interposed therebetween. The photoelectric conversion element will be hereinafter referred to as a B light photoelectric conversion element.

An n-type impurity region (hereinafter referred to as an n+ region) 4r having a high concentration for accumulating an electric charge generated in the photoelectric conversion layer 12 of the R on-substrate photoelectric conversion element is formed in the n region in the p-well layer 2. In order to prevent a light from entering into the n+ region 4r, it is preferred to provide a shielding layer on the n+ region 4r.

An n+ region 4g for accumulating an electric charge generated in the photoelectric conversion layer 12 of the G on-substrate photoelectric conversion element is formed in the n region in the p-well layer 2. Additionally, in order to prevent a light from entering into the n+ region 4g, it is preferred to provide a shielding layer on the n+ region 4g.

An n+ region 4b for accumulating an electric charge generated in the photoelectric conversion layer 12 of the B on-substrate photoelectric conversion element is formed in the n region in the p-well layer 2. Additionally, in order to prevent a light from entering into the n+ region 4b, it is preferred to provide a shielding layer on the n+ region 4b.

A contact portion 6r formed of a metal such as aluminum is provided on the n+ region 4r, the transparent electrode 11r is formed on the contact portion 6r, and the n+ region 4r and the transparent electrode 11r are electrically connected to each other through the contact portion 6r. The contact portion 6r is buried in an insulating layer 5 transparent to a visible light and an infrared light.

A contact portion 6g formed of a metal such as aluminum is provided on the n+ region 4g, the transparent electrode 11g is formed on the contact portion 6g, and the n+ region 4g and the transparent electrode 11g are electrically connected to each other through the contact portion 6g. The contact portion 6g is buried in the insulating layer 5.

A contact portion 6b formed of a metal such as aluminum is provided on the n+ region 4b, the transparent electrode 11b is formed on the contact portion 6b, and the n+ region 4b and the transparent electrode 11b are electrically connected to each other through the contact portion 6b. The contact portion 6b is buried in the insulating layer 5.

A signal read-out portion 5r for reading out signals corresponding to electric charges generated in the R photoelectric conversion element and accumulated in the n+ region 4r, a signal read-out portion 5g for reading out signals corresponding to electric charges generated in the G photoelectric conversion element and accumulated in the n+ region 4g, and a signal read-out portion 5b for reading out signals corresponding to electric charges generated in the B photoelectric conversion element and accumulated in the n+ region 4b are formed in regions other than the n+ regions 4r, 4g, and 4b in the p-well layer 2. The signal read-out portions 5r, 5g, and 5b can employ a known structure using a CCD or an MOS circuit, respectively. Additionally, in order to prevent a light from entering into the signal read-out portions 5r, 5g and 5b, it is preferred to provide a shielding layer on the signal read-out portions 5r, 5g and 5b.

Figure 18:
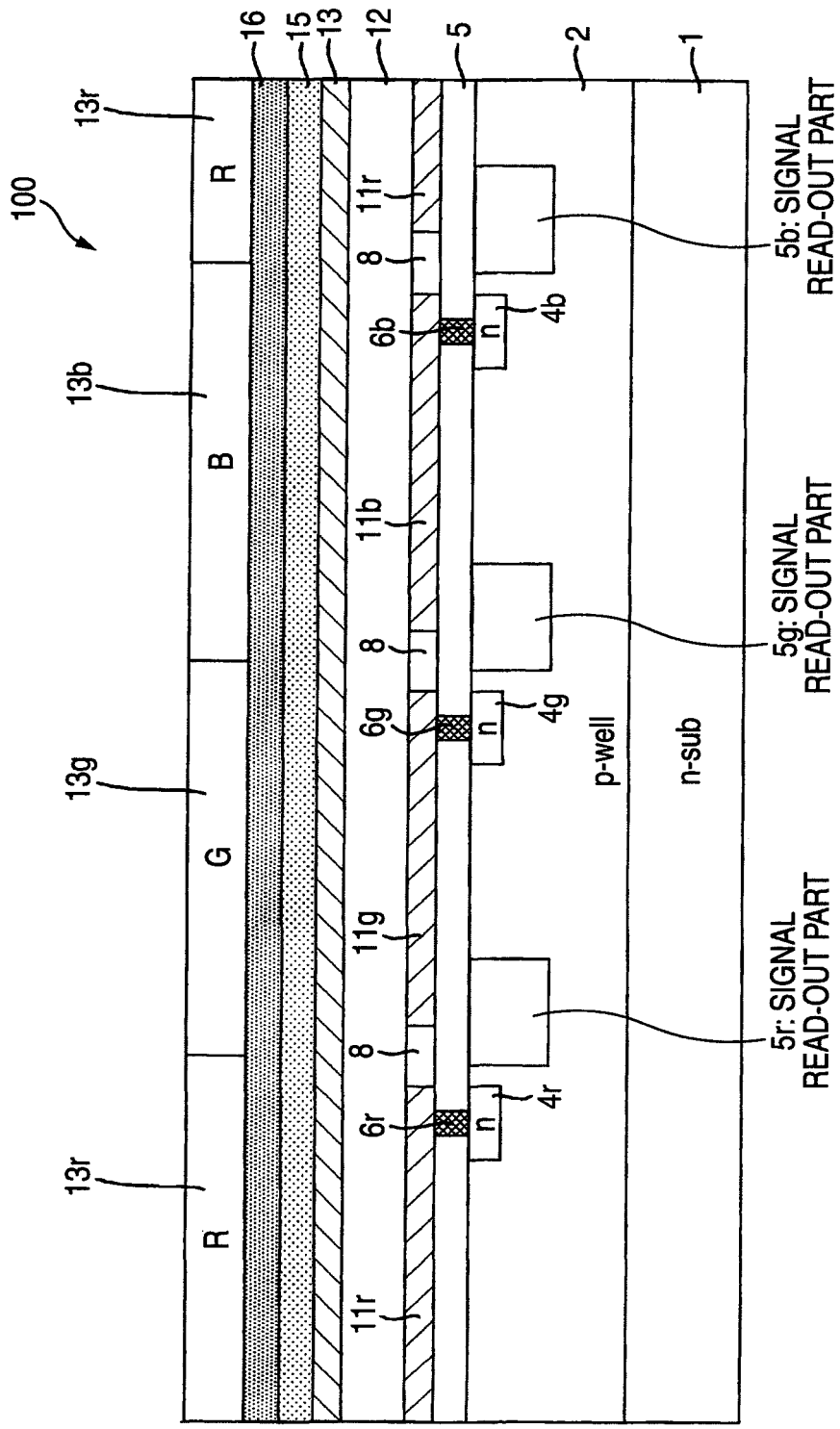
FIG. 18 is a schematic cross-sectional view cut along an X-X line of the imaging device shown in FIG. 17.
Figure 19:
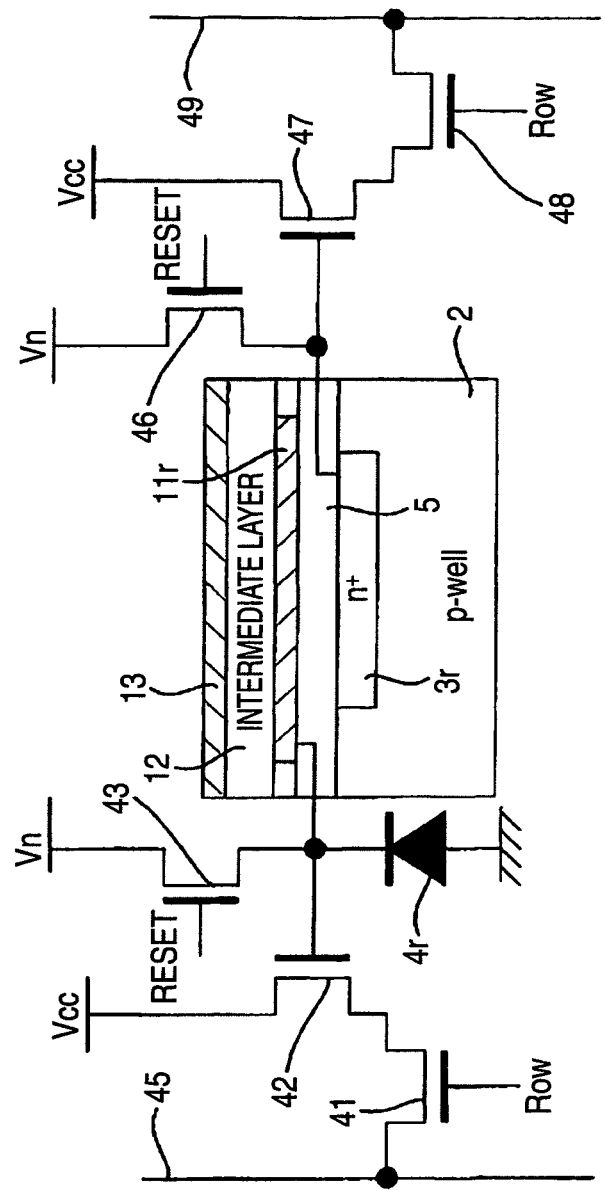
FIG. 19 is a view showing a specific example of the constitution of the signal read-out portion shown in FIG. 18.

FIG. 19 is a diagram showing a specific example of a structure of the signal read-out portion 5r shown in FIG. 18. In FIG. 19, the same constitutions as those in FIGS. 17 and 18 have the same reference numerals and signs. Since the constitutions of the signal read-out portions 5r, 5g, and 5b are identical to each other, the description of the signal read-out portions 5g and 5b will be omitted.

The signal read-out portion 5r comprises a reset transistor 43 having a drain connected to the n+ region 4r and a source connected to a power supply Vn, an output transistor 42 having a gate connected to the drain of the reset transistor 43 and a source connected to a power supply Vcc, a row selecting transistor 41 having a source connected to a drain of the output transistor 42 and a drain connected to a signal output line 45, a reset transistor 46 having a drain connected to an n region 3r and a source connected to the power supply Vn, an output transistor 47 having a gate connected to the drain of the reset transistor 46 and a source connected to the power supply Vcc, and a row selecting transistor 48 having a source connected to a drain of the output transistor 47 and a drain connected to a signal output line 49.

When a bias voltage is applied across the transparent electrode 11r and the upper electrode 13, an electric charge is generated corresponding to a light entering into the photoelectric conversion layer 12 and migrates to the n+ region 4r through the transparent electrode 11r. The electric charge accumulated in the n+ region 4r is converted to a signal corresponding to an amount of the electric charge through the output transistor 42. When the row selecting transistor 41 is turned ON, a signal is outputted to the signal output line 45. After the signal is outputted, the electric charge in the n+ region 4r is reset by the reset transistor 43.

Thus, the signal read-out portion 5r can be constituted by a known MOS circuit comprising three transistors.

Now returning to FIG. 18, protective layers 15 and 16 having a two-layer structure for protecting the on-substrate photoelectric conversion element are formed on the photoelectric conversion layer 12, and the color filters 13r, 13g and 13b are formed on the protective layer 16.

This imaging device 100 is manufactured by forming the photoelectric conversion layer 12 and then forming the color filters 13r, 13g, and 13b. However, the color filters 13r, 13g, and 13b include a photolithographic step and a baking step. In the case in which an organic material is used as the photoelectric conversion layer 12, therefore, the characteristic properties of the photoelectric conversion layer 12 are deteriorated when the photolithographic step and the baking step are carried out in a state in which the photoelectric conversion layer 12 is laid bare. In the imaging device 100, the protective layers 15 and 16 are provided in order to prevent the characteristic properties of the photoelectric conversion layer 12 from being deteriorated due to the manufacturing process.

The protective layer 15 is preferably an inorganic layer comprising an inorganic material through an ALCVD method. The ALCVD method is an atomic layer CVD method and can form a dense inorganic layer which can be an effective protective layer for the photoelectric conversion layer 9. The ALCVD method is also known as an ALE method or an ALD method. The inorganic layer formed by the ALCVD method is preferably formed of $Al_2O_3$, $SiO_2$, $TiO_2$, $ZrO_2$, MgO, $HfO_2$ or $Ta_2O_5$, more preferably formed of $Al_2O_3$ or $SiO_2$, most preferably formed of $Al_2O_3$.

The protective layer 16 is formed on the protective layer 15 in order to enhance a performance of protecting the photoelectric conversion layer 12 more greatly, and is preferably an organic layer formed of an organic polymer. As the organic polymer, parylene is preferred, with parylene C being more preferred. Additionally, the protective layer 16 may be omitted and, furthermore, the arrangement of the protective layers 15 and 16 may be inverted. The structure shown in FIG. 18 provides a particularly high effect of protecting the photoelectric conversion layer 12.

When a predetermined bias voltage is applied to the transparent electrode 11r and the upper electrode 13, the electric charge generated in the photoelectric conversion layer 12 constituting the R on-substrate photoelectric conversion element migrates to the n+ region 4r through the transparent electrode 11r and the contact portion 6r and is accumulated therein. A signal corresponding to the electric charge accumulated in the n+ region 4r is read out by the signal read-out portion 5r and is outputted to an outside of the imaging device 100.

Likewise, when a predetermined bias voltage is applied to the transparent electrode 11g and the upper electrode 13, the electric charge generated in the photoelectric conversion layer 12 constituting the G on-substrate photoelectric conversion element migrates to the n+ region 4g through the transparent electrode 11g and the contact portion 6g and is accumulated therein. A signal corresponding to the electric charge accumulated in the n+ region 4g is read out by the signal read-out portion 5g and is outputted to the outside of the imaging device 100.

Likewise, when a predetermined bias voltage is applied to the transparent electrode 11b and the upper electrode 13, the electric charge generated in the photoelectric conversion layer 12 constituting the B on-substrate photoelectric conversion element migrates to the n+ region 4b through the transparent electrode 11b and the contact portion 6b and is accumulated therein. A signal corresponding to the electric charge accumulated in the n+ region 4b is read out by the signal read-out portion 5b and is outputted to the outside of the imaging device 100.

Thus, the imaging device 100 can output, to the outside, a signal having the R component corresponding to the electric charge generated in the R photoelectric conversion element, a signal having the G component corresponding to the electric charge generated in the G photoelectric conversion element, and a signal having the B component corresponding to the electric charge generated in the B photoelectric conversion element. Thus, there can be obtained a color image. Also, since this constitution permits to reduce the thickness of the photoelectric conversion portion, there can be obtained an improved resolution and a reduced false color. In addition, since the fill factor can be increased because of absence of lower circuit, the sensitivity can be enhanced, and microlenses can be omitted, thus the constitution being effective for reducing the number of parts.

In this embodiment, the organic photoelectric conversion layer is required to have the maximum absorption wavelength in the higher region of green light and have an absorption region over the entire visible light. The materials of the invention having heretofore been specified enable one to satisfy the requirements.

Synthesis examples of the compounds to be used in the invention will be described below.

Compound D-99 is synthesized by using 2,6-dimethyl-γ-pyrone in place of the starting material C described in JP-A-2000-351774 for synthesizing illustrative compound 1.

Compound D-1 is synthesized by using 2,6-dimethyl-γ-pyrone in place of the starting material C and using 1,3-indanedione in place of the starting material e described in JP-A-2000-351774 for synthesizing illustrative compound 1.

Detailed descriptions will be given below by reference to Examples. Needless to say, however, the invention is not limited only to the Examples.

EXAMPLE 1

In the embodiment of FIG. 12, amorphous ITO layer is formed on a CMOS substrate in a thickness of 30 nm according to the sputtering method, and patterning is conducted according to photo lithography so that one pixel exists on each photodiode (PD) on the CMOS substrate to thereby form a pixel electrode 11. Then, 100-nm thick EB-3 layer and 100-nm thick D-99 layer are formed thereon and, further, 40-nm SiO layer is formed thereon according to the vacuum heat vapor deposition method to thereby form a photoelectric conversion layer 12. Further, as an upper electrode, amorphous ITO layer is formed in a thickness of 5 nm according to the sputtering method to form a transparent electrode 13. Thus, a solid-state imaging device is prepared. All of the vacuum vapor deposition procedures of the photoelectric conversion layer 9 are conducted at a vacuum degree of 4×10−4 Pa or lower than that.

EXAMPLE 2

A solid-state imaging device is prepared in the same manner as in Example 1 except for changing D-99 in the photoelectric conversion layer 12 to D-1.

EXAMPLE 3

A solid-state imaging device is prepared in the same manner as in Example 2 except for changing "100-nm thick EB-3" to "200-nm thick mMTDATA".

EXAMPLE 4

A solid-state imaging device is prepared in the same manner as in Example 2 except for changing "40-nm thick SiO" to "50-nm thick Alq3".

EXAMPLE 5

A solid-state imaging device is prepared in the same manner as in Example 4 except for changing "50-nm thick Alq3" to "20-nm thick Alq3" and further stacking 20-nm thick SiO.

EXAMPLE 6

A solid-state imaging device is prepared in the same manner as in Example 5 except for changing "Alq3" to "HB-1".

COMPARATIVE EXAMPLE 1

A solid-state imaging device is prepared in the same manner as in Example 1 except for changing D-99 in the photoelectric conversion layer 12 to quinacridone.

The external quantum efficiency and relative response speed of each of the photoelectric conversion elements obtained in Examples 1 and 2 and Comparative Example 1 at the maximum sensitivity wavelength upon dark current being 3 nA/cm$^2$ are shown in Table A.

Additionally, an appropriate voltage is applied upon measuring the performance of photoelectric conversion of each element.

TABLE A

| | Compound used for light absorption to photoelectric conversion | External quantum efficiency (relative value) at maximum sensitivity wavelength upon dark current of 3 nA/cm$^2$ | Rise time of 0 to 98% in signal strength (relative value) |
|---|---|---|---|
| Example 1 | D-99 | 243 | 0.03 |
| Example 2 | D-1 | 162 | 0.03 |
| Example 3 | D-1 | 165 | 0.03 |
| Example 4 | D-1 | 125 | 0.03 |
| Example 5 | D-1 | 185 | 0.04 |
| Example 6 | D-1 | 155 | 0.03 |
| Comparative Example 1 | quinacridone | 188 | 1 |

It can be seen from Table A that imaging can be conducted with high response speed and high S/N ratio by using the photoelectric conversion element of the invention.

What is claimed is:
1. An imaging device comprising:
a photoelectric conversion element which includes:
a conductive thin layer;
an organic photoelectric conversion layer including a compound represented by formula (I); and
a transparent conductive thin layer, in this order, and further comprising:
a region for accumulating an electric charge generated in the organic photoelectric conversion layer; and
a signal read-out portion for reading out signals corresponding to electric charges accumulated in the region for accumulating an electric charge:

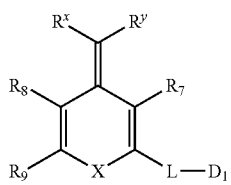

Formula (I)

wherein

X represents O, S or N—$R_{10}$, $R^x$ and $R^y$ each independently represents a hydrogen atom or a substituent W, wherein at least one of $R^x$ and $R^y$ is an electron-withdrawing group, and $R^x$ and $R^y$ may be connected to each other to form a ring, provided that $R^x$ and $R^y$ do not represent a cyano group at the same time, $R_7$ to $R_{10}$ each independently represents a hydrogen atom or a substituent W, wherein $R_8$ and $R_9$ may be connected to each other to form a ring, L represents a linking group comprising a conjugated bond, and $D_1$ is a group represented by formula (VIII):

Formula (VIII); and

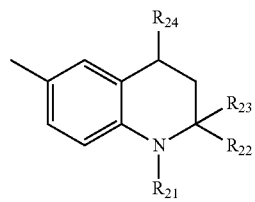

wherein $R_{21}$ to $R_{24}$ each independently represents an alkyl group, and $R_{22}$ and $R_{23}$, or $R_{21}$ and $R_{22}$, may be connected to each other to form a ring, and wherein the substituent W represents a halogen atom, an alkyl group, an alkenyl group, an alkynyl group, an aryl group, a heterocyclic group, a cyano group, a hydroxyl group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group, an ammonio group, an acylamino group, an aminocarbonylamino group, an alkoxycarbonylamino group, an aryloxycarbonylamino group, a sulfamoylamino group, an alkylsulfonylamino or arylsulfonylamino group, a mercapto group, an alkylthio group, an arylthio group, a heterocyclic thio group, a sulfamoyl group, a sulfo group, an alkylsulfinyl or arylsulfinyl group, an alkylsulfonyl or arylsulfonyl group, an acyl group, an aryloxycarbonyl group, an alkoxycarbonyl group, a carbamoyl group, an arylazo or heterocyclic azo group, an imido group, a phosphino group, a phosphinyl group, a phosphinyloxy group, a phosphinylamino group, a phosphono group, a silyl group, a hydrazino group or an ureido group.

2. An imaging device wherein a photoelectric conversion element which includes:

a conductive thin layer;

an organic photoelectric conversion layer including a compound represented by formula (I); and a transparent conductive thin layer, in this order, and further comprising:

a region for accumulating an electric charge generated in the organic photoelectric conversion layer; and a signal read-out portion for reading out signals corresponding to electric charges accumulated in the region for accumulating an electric charge:

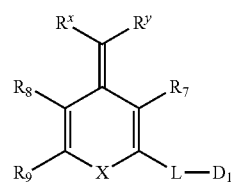

Formula (I)

wherein

X represents O, S or N—$R_{10}$, $R^x$ and $R^y$ each independently represents a hydrogen atom or a substituent W, wherein at least one of $R^x$ and $R^y$ is an electron-withdrawing group, and $R^x$ and $R^y$ may be connected to each other to form a ring, provided that $R^x$ and $R^y$ do not represent a cyano group at the same time, $R_7$ to $R_{10}$ each independently represents a hydrogen atom or a substituent W, wherein $R_8$ and $R_9$ may be connected to each other to form a ring, L represents a linking group comprising a conjugated bond, and $D_1$ is a group represented by formula (IX):

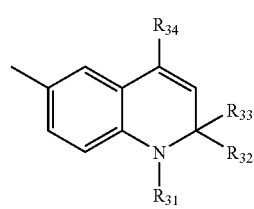

Formula (IX)

wherein $R_{31}$ to $R_{34}$ each independently represents an alkyl group, and $R_{32}$ and $R_{33}$, or $R_{31}$ and $R_{32}$, may be connected to each other to form a ring, and wherein the substituent W represents a halogen atom, an alkyl group, an alkenyl group, an alkynyl group, an aryl group, a heterocyclic group, a cyano group, a hydroxyl group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group, an ammonio group, an acylamino group, an aminocarbonylamino group, an alkoxycarbonylamino group, an aryloxycarbonylamino group, a sulfamoylamino group, an alkylsulfonylamino or arylsulfonylamino group, a mercapto group, an alkylthio group, an arylthio group, a heterocyclic thio group, a sulfamoyl group, a sulfo group, an alkylsulfinyl or arylsulfinyl group, an alkylsulfonyl or arylsulfonyl group, an acyl group, an aryloxycarbonyl group, an alkoxycarbonyl group, a carbamoyl group, an arylazo or heterocyclic azo group, an imido group, a phosphino group, a phosphinyl group, a phosphinyloxy group, a phosphinylamino group, a phosphono group, a silyl group, a hydrazino group or an ureido group.

3. An imaging device wherein
a photoelectric conversion element which includes:
a conductive thin layer;
an organic photoelectric conversion layer including a compound represented by formula (I); and
a transparent conductive thin layer, in this order, and further comprising:
a region for accumulating an electric charge generated in the organic photoelectric conversion layer; and
a signal read-out portion for reading out signals corresponding to electric charges accumulated in the region for accumulating an electric charge:

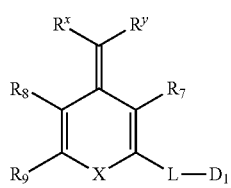

Formula (I)

wherein
X represents O, S or N—$R_{10}$, $R^x$ and $R^y$ each independently represents a hydrogen atom or a substituent W, wherein at least one of $R^x$ and $R^y$ is an electron-withdrawing group, and $R^x$ and $R^y$ may be connected to each other to form a ring, provided that $R^x$ and $R^y$ do not represent a cyano group at the same time,
$R_7$ to $R_{10}$ each independently represents a hydrogen atom or a substituent W, wherein $R_8$ and $R_9$ may be connected to each other to form a ring,
L represents a linking group comprising a conjugated bond, and
$D_1$ is a group represented by formula (X):

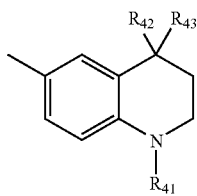

wherein $R_{41}$ represents a hydrogen atom, $R_{42}$ to $R_{43}$ each independently represents a hydrogen atom or an alkyl group, and $R_{42}$ and $R_{43}$ may be connected to each other to form a ring, and
the substituent W represents a halogen atom, an alkyl group, an alkenyl group, an alkynyl group, an aryl group, a heterocyclic group, a cyano group, a hydroxyl group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group, an ammonio group, an acylamino group, an aminocarbonylamino group, an alkoxycarbonylamino group, an aryloxycarbonylamino group, a sulfamoylamino group, an alkylsulfonylamino or arylsulfonylamino group, a mercapto group, an alkylthio group, an arylthio group, a heterocyclic thio group, a sulfamoyl group, a sulfo group, an alkylsulfinyl or arylsulfinyl group, an alkylsulfonyl or arylsulfonyl group, an acyl group, an aryloxycarbonyl group, an alkoxycarbonyl group, a carbamoyl group, an arylazo or heterocyclic azo group, an imido group, a phosphino group, a phosphinyl group, a phosphinyloxy group, a phosphinylamino group, a phosphono group, a silyl group, a hydrazino group or an ureido group.

4. The imaging device according to claim 1, wherein $R_{21}$ represents an ethyl group, and each of $R_{22}$, $R_{23}$, and $R_{24}$ represents a methyl group.

5. The imaging device according to claim 2, wherein $R_{31}$ represents an ethyl group, and each of $R_{32}$, $R_{33}$, and $R_{34}$ represents a methyl group.

6. The imaging device according to claim 3, wherein each of $R_{42}$ and $R_{43}$ represents a methyl group.

7. The imaging device according to claim 1, wherein the compound represented by formula (I) is a compound represented formula (II):

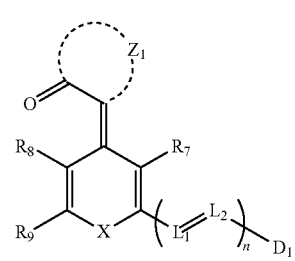

Formula (II)

wherein
X, $R_7$ to $R_{10}$, and $D_1$ are the same as X, $R_7$ to $R_{10}$, and $D_1$ in formula (I), respectively,
$L_1$ and $L_2$ each independently represents a methine group or a substituted methine group,
$Z_1$ represents the atoms necessary to complete a 5- or 6-membered ring, and
n represents an integer of 1 or more.

8. The imaging device according to claim 2, wherein the compound represented by formula (I) is a compound represented formula (II):

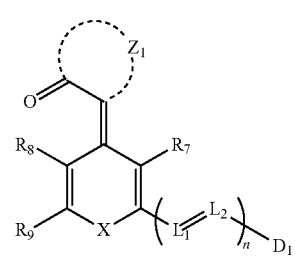

Formula (II)

wherein
X, $R_7$ to $R_{10}$, and $D_1$ are the same as X, $R_7$ to $R_{10}$, and $D_1$ in formula (I), respectively,
$L_1$ and $L_2$ each independently represents a methine group or a substituted methine group,
$Z_1$ represents the atoms necessary to complete a 5- or 6-membered ring, and n represents an integer of 1 or more.

9. The imaging device according to claim 3, wherein the compound represented by formula (I) is a compound represented formula (II):

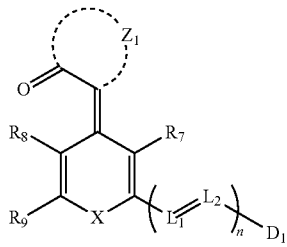

Formula (II)

wherein
X, $R_7$ to $R_{10}$, and $D_1$ are the same as X, $R_7$ to $R_{10}$, and $D_1$ in formula (I), respectively,
$L_1$ and $L_2$ each independently represents a methine group or a substituted methine group,
$Z_1$ represents the atoms necessary to complete a 5- or 6-membered ring, and
n represents an integer of 1 or more.

10. The imaging device according to claim 7, wherein the compound represented by formula (II) is a compound represented by formula (IV):

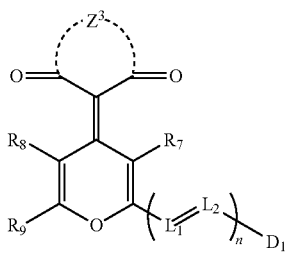

Formula (IV)

wherein
$R_7$ to $R_9$, $L_1$, $L_2$, $D_1$, and n are the same as $R_7$ to $R_9$, $L_1$, $L_2$, $D_1$, and n in formula (II), respectively, and
$Z_3$ represents the atoms necessary to complete a 5- to 6-membered ring.

11. The imaging device according to claim 8, wherein the compound represented by formula (II) is a compound represented by formula (IV):

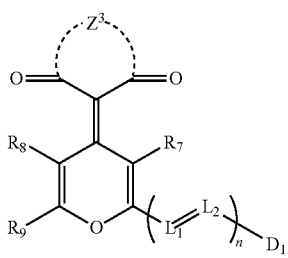

Formula (IV)

wherein
$R_7$ to $R_9$, $L_1$, $L_2$, $D_1$, and n are the same as $R_7$ to $R_9$, $L_1$, $L_2$, $D_1$, and n in formula (II), respectively, and
$Z_3$ represents the atoms necessary to complete a 5- to 6-membered ring.

12. The imaging device according to claim 9, wherein the compound represented by formula (II) is a compound represented by formula (IV):

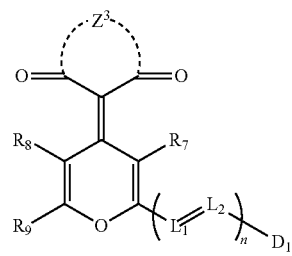

Formula (IV)

wherein
$R_7$ to $R_9$, $L_1$, $L_2$, $D_1$, and n are the same as $R_7$ to $R_9$, $L_1$, $L_2$, $D_1$, and n in formula (II), respectively, and
$Z_3$ represents the atoms necessary to complete a 5- to 6-membered ring.

13. The imaging device according to claim 7, wherein the compound represented by formula (II) is a compound represented by formula (V):

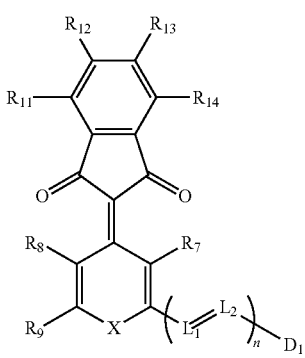

Formula (V)

wherein
X, $R_7$ to $R_{10}$, $L_1$, $L_2$, n, and $D_1$ are the same as X, $R_7$ to $R_{10}$, $L_1$, $L_2$, n, and $D_1$ in formula (II), respectively, and
$R_{11}$ to $R_{14}$ each independently represents a hydrogen atom or the substituent W.

14. The imaging device according to claim 8, wherein the compound represented by formula (II) is a compound represented by formula (V):

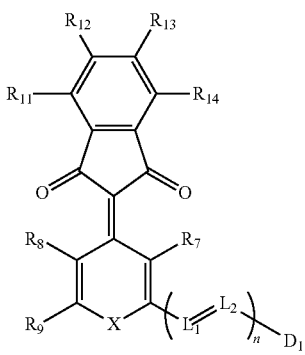

Formula (V)

wherein
X, $R_7$ to $R_{10}$, $L_1$, $L_2$, n, and $D_1$ are the same as X, $R_7$ to $R_{10}$, $L_1$, $L_2$, n, and $D_1$ in formula (II), respectively, and $R_{11}$ to $R_{14}$ each independently represents a hydrogen atom or the substituent W.

15. The imaging device according to claim 9, wherein the compound represented by formula (II) is a compound represented by formula (V):

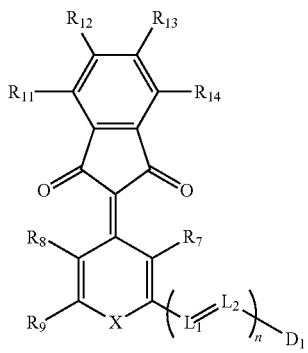

Formula (V)

wherein

X, $R_7$ to $R_{10}$, $L_1$, $L_2$, n, and $D_1$ are the same as X, $R_7$ to $R_{10}$, $L_1$, $L_2$, n, and $D_1$ in formula (II), respectively, and $R_{11}$ to $R_{14}$ each independently represents a hydrogen atom or the substituent W.

16. The imaging device according to claim 13, wherein the compound represented by formula (V) is a compound represented by formula (VI):

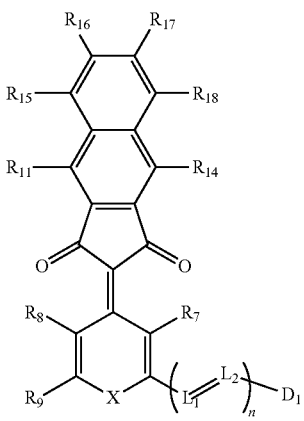

Formula (VI)

wherein

X, $R_7$ to $R_{11}$, $R_{14}$, $L_1$, $L_2$, n, and $D_1$ are the same as X, $R_7$ to $R_{11}$, $R_{14}$, $L_1$, $L_2$, n, and $D_1$ in formula (V), respectively, and $R_{15}$ to $R_{18}$ each independently represents a hydrogen atom or the substituent W.

17. The imaging device according to claim 14, wherein the compound represented by formula (V) is a compound represented by formula (VI):

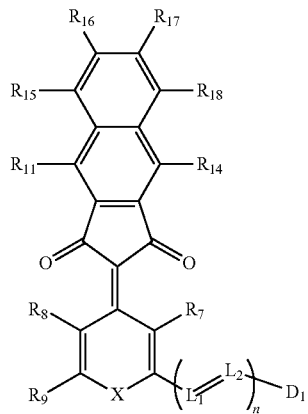

Formula (VI)

wherein

X, $R_7$ to $R_{11}$, $R_{14}$, $L_1$, $L_2$, n, and $D_1$ are the same as X, $R_7$ to $R_{11}$, $R_{14}$, $L_1$, $L_2$, n, and $D_1$ in formula (V), respectively, and $R_{15}$ to $R_{18}$ each independently represents a hydrogen atom or the substituent W.

18. The imaging device according to claim 15, wherein the compound represented by formula (V) is a compound represented by formula (VI):

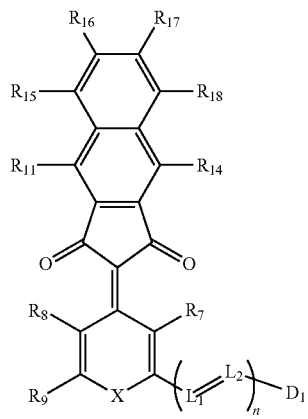

Formula (VI)

wherein

X, $R_7$ to $R_{11}$, $R_{14}$, $L_1$, $L_2$, n, and $D_1$ are the same as X, $R_7$ to $R_{11}$, $R_{14}$, $L_1$, $L_2$, n, and $D_1$ in formula (V), respectively, and $R_{15}$ to $R_{18}$ each independently represents a hydrogen atom or the substituent W.

\* \* \* \* \*